US012690443B2

(12) United States Patent
Xie et al.

(10) Patent No.: US 12,690,443 B2
(45) Date of Patent: Jul. 21, 2026

(54) SELF-ALIGNED BACKSIDE CONTACT WITH INCREASED CONTACT AREA

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Junli Wang, Slingerlands, NY (US); Somnath Ghosh, Clifton Park, NY (US); Julien Frougier, Albany, NY (US); Min Gyu Sung, Latham, NY (US); Theodorus E. Standaert, Clifton Park, NY (US); Nicolas Jean Loubet, Guilderland, NY (US); Huiming Bu, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 799 days.

(21) Appl. No.: 17/664,663

(22) Filed: May 24, 2022

(65) Prior Publication Data

US 2023/0411289 A1     Dec. 21, 2023

(51) Int. Cl.
  *H10W 20/41*       (2026.01)
  *H10D 62/10*       (2025.01)
  *H10W 20/20*       (2026.01)

(52) U.S. Cl.
  CPC ........ *H10W 20/427* (2026.01); *H10D 62/118* (2025.01); *H10W 20/20* (2026.01)

(58) Field of Classification Search
  CPC . H10W 20/427; H10W 20/20; H10W 20/069; H10W 20/0696; H10W 20/481;
  (Continued)

(56) References Cited

U.S. PATENT DOCUMENTS 9,570,395 B1    2/2017  Sengupta
10,586,765 B2   3/2020  Smith
        (Continued)

FOREIGN PATENT DOCUMENTS

CN      119234319 A    12/2024
CN      119318217 A     1/2025
        (Continued)

OTHER PUBLICATIONS

Mathur et al., "Buried Bitline for sub-5nm SRAM Design", Published in: 2020 IEEE International Electron Devices Meeting (IEDM), 7 pages.

(Continued)

*Primary Examiner* — Su C Kim
(74) *Attorney, Agent, or Firm* — L. Jeffrey Kelly

(57)           ABSTRACT

A first and a second source drain region, an upper source drain contact connected to the first source drain region, a bottom source drain contact connected to the second source drain region, a dielectric spacer surrounds opposite vertical side surfaces of the bottom source drain contact and overlaps a vertical side surface and a lower horizontal surface of a bottom isolation region. A width of the bottom source drain contact wider than a width of the second source drain. Forming an undoped silicon buffer epitaxy in an opening between and below a first and a second nanosheet stack, forming a contact to a first source drain adjacent to that, removing the undoped silicon buffer epitaxy below a second source drain between the first and the second nanosheet stack, forming a bottom contact to that, a width of the bottom contact is wider than a width of the second source drain.

20 Claims, 49 Drawing Sheets

Section Y-Y

(58) Field of Classification Search

CPC .. H10D 62/118; H10D 30/6757; H10D 30/43; H10D 64/017; H10D 30/014; H10D 30/6735; H10D 62/121; H10D 64/254; H10D 84/0149; H10D 84/853; B82Y 10/00

See application file for complete search history.

(56) References Cited

U.S. PATENT DOCUMENTS

| | | | |
|---|---|---|---|
| 10,636,739 B2 | 4/2020 | Beyne | |
| 10,700,207 B2 | 6/2020 | Chen | |
| 10,797,139 B2 | 10/2020 | Morrow | |
| 11,195,930 B1 * | 12/2021 | Chen | H10D 64/62 |
| 2019/0214502 A1 * | 7/2019 | Xu | H01L 29/775 |
| 2020/0105671 A1 | 4/2020 | Lai | |
| 2021/0134721 A1 | 5/2021 | Chiang | |
| 2021/0202385 A1 | 7/2021 | Huang | |
| 2021/0305252 A1 | 9/2021 | Chiang | |
| 2021/0305381 A1 | 9/2021 | Chiang | |
| 2021/0305408 A1 * | 9/2021 | Yu | H10D 84/85 |
| 2021/0351303 A1 | 11/2021 | Ju | |
| 2021/0376071 A1 | 12/2021 | Liu | |
| 2021/0376093 A1 | 12/2021 | Chu | |
| 2021/0399099 A1 | 12/2021 | Chu et al. | |
| 2022/0028786 A1 | 1/2022 | Huang | |
| 2022/0069117 A1 | 3/2022 | Yu et al. | |
| 2022/0157956 A1 | 5/2022 | Chen | |
| 2022/0310804 A1 | 9/2022 | Su et al. | |
| 2023/0197815 A1 | 6/2023 | Huang et al. | |
| 2023/0290825 A1 | 9/2023 | Guler et al. | |
| 2023/0378190 A1 | 11/2023 | Liaw | |
| 2023/0411466 A1 | 12/2023 | Xie et al. | |

FOREIGN PATENT DOCUMENTS

| | | | |
|---|---|---|---|
| EP | 4533546 A | 4/2025 | |
| EP | 4533547 A1 | 4/2025 | |
| KR | 10-2024-0154064 A | 10/2024 | |
| KR | 10-2024-0157041 A | 10/2024 | |
| TW | 202129971 A | 8/2021 | |
| TW | 202201554 A | 1/2022 | |
| TW | 202205460 A | 2/2022 | |
| TW | 202209568 A | 3/2022 | |
| TW | I821132 B | 12/2023 | |
| TW | I849780 B | 12/2023 | |
| WO | 2023/227271 A1 | 11/2023 | |
| WO | 2023/227321 A1 | 11/2023 | |

OTHER PUBLICATIONS

Prasad et al., "Buried Power Rails and Back-side Power Grids: Arm® CPU Power Delivery Network Design Beyond 5nm", IEDM19 446, © 2019 IEEE, pp. 19.1.1-19.1.4.

Notification of Transmittal of the International Search Report and the Written Opinion of the International Searching Authority, or the Declaration, Date of mailing, Jun. 9, 2023, International application No. PCT/EP2023/056450, 9 pages.

IBM: List of IBM Patents or Patent Applications Treated as Related (Appendix P), Jun. 2, 2022, 2 pages.

Pending U.S. Appl. No. 17/664,662, entitled: "Self-Aligned Backside Contact With Increased Contact Area", filed May 24, 2022, 76 pages.

Intellectual Property Office, "Request for the Submission of an Opinion," Apr. 14, 2025, 10 Pages, KR Application No. 10-2024-7031097.

Intellectual Property Office, "Request for the Submission of an Opinion," Jun. 12, 2025, 13 Pages, KR Application No. 10-2024-7032354.

European Patent Office, "EP Examination Report", Apr. 22, 2026, 08 pages, EP Application No. 23723178.2.

European Patent Office, "EP Examination Report", Apr. 22, 2026, 10 pages, EP Application No 23712181.9.

* cited by examiner

Y

X        <u>206</u>        X

Y

Section X-X

Section Y-Y

Section X-X

Section Y-Y

Section X-X

Section Y-Y

Section X-X

Section Y-Y

Section X-X

Section Y-Y

Section X-X

Section Y-Y

Section Y-Y

Section X-X

Section Y-Y

Section X-X

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

SELF-ALIGNED BACKSIDE CONTACT WITH INCREASED CONTACT AREA

BACKGROUND

The present invention relates, generally, to the field of semiconductor manufacturing, and more particularly to a backside contact.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

SUMMARY

According to an embodiment, a semiconductor device is provided. The semiconductor device including a first source drain region, a second source drain region, an upper source drain contact vertically aligned above and electrically connected to the first source drain region, and a bottom source drain contact vertically aligned below and electrically connected to the second source drain region, where the bottom source drain contact and the upper source drain contact are on opposite sides of the semiconductor device, where a dielectric spacer surrounds opposite vertical side surfaces of the bottom source drain contact, where the dielectric spacer overlaps a vertical side surface and a lower horizontal surface of a bottom isolation region.

According to an embodiment, a semiconductor device is provided. The semiconductor device including a first source drain region, a second source drain region, an upper source drain contact vertically aligned above and electrically connected to the first source drain region, and a bottom source drain contact vertically aligned below and electrically connected to the second source drain region, where the bottom source drain contact and the upper source drain contact are on opposite sides of the semiconductor device, where a dielectric spacer surrounds opposite vertical side surfaces of the bottom source drain contact, where the dielectric spacer overlaps a vertical side surface and a lower horizontal surface of a bottom isolation region, where a width of the bottom source drain contact is wider than a width of the second source drain.

According to an embodiment, a method is provided. The method including forming a double nanosheet stack on a substrate, forming a shallow trench isolation between adjacent double nanosheet stacks, dividing the double nanosheet stack into a first nanosheet stack and a second nanosheet stack, forming a shallow trench isolation in the divided double nanosheet stack, forming an undoped silicon buffer epitaxy in an opening between and below the first nanosheet stack and the second nanosheet stack, forming a top source drain contact to an upper horizontal surface of a first source drain region adjacent to the first nanosheet stack, bonding a carrier wafer to an upper surface of the substrate above the first nanosheet stack and the second nanosheet stack, removing the undoped silicon buffer epitaxy below a second source drain region between the first nanosheet stack and the second nanosheet stack, and forming a bottom source drain contact to a lower horizontal surface of the second source drain region, the bottom source drain contact and the second source drain region are vertically aligned, where a width of the bottom source drain contact is wider than a width of the second source drain region.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
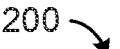
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed. Layers of the stacked nanosheet are formed on a substrate, trenches are formed parallel to each other in the layers of the stacked nanosheet to form double wide fins and shallow trench isolation regions formed between the double wide fins. Trenches are formed within each double wide fin to divide them into two fins and shallow trench isolation regions are formed between the two fins. Sacrificial gates are then formed perpendicular to the trenches. Additional trenches are formed between sacrificial gates, perpendicular to the original trenches. Dielectric spacers may be formed surrounding the nanosheet stacks and a bottom isolation region formed below the nanosheet stacks. Outer portions of sacrificial layers of the stacked nanosheets may be removed and inner spacers formed where the outer portions of the sacrificial layers of the stacked nanosheets where removed. In an embodiment of the present invention, a trench may be extended into the substrate and a sacrificial layer formed in a portion of the trench in the substrate. This trench may be formed where a backside contact to a source drain may be subsequently formed. An undoped silicon buffer epitaxy may be formed between adjacent nanosheet stacks. Source drain regions of either positive FET (p-FET) or negative FET (n-FET) are formed extending out from exposed channel layers of the nanosheet stacks. The sacrificial gates are removed, and remaining portions of the sacrificial layers are removed. A metal gate may be formed where the sacrificial gates and the remaining portions of the sacrificial layers were removed, surrounding the channel layers. Contacts may be formed to the metal gate and to each source drain, specifically to the source drain areas which do not have a sacrificial layer under the source drain. Further formation of back end of line (BEOL) layers of wiring and vias may be done.

An embodiment of forming a backside contact may include bonding a carrier substrate to an upper surface of the formed nanosheet FET with BEOL layers, above the BEOL layers, turning the structure upside down and then forming a backside opening above the sacrificial layer and removing the sacrificial layer. A self-aligned sacrificial backside contact in the opening may be formed to the source drain through the backside opening. Additional layers of lines and vias may be formed above the backside contact and may connect to the backside contact.

There are several advantages to formation of self-aligned sacrificial backside contact, including flexibility to form source drain contacts from either above the structure or below the structure, and forming contacts with greater spacing as less contacts may be needed overall above the nanosheet device. Having a self-aligned contact is an additional advantage due to relative backside lithography alignment accuracy compared to frontside lithography, which is due to wafer distortion or non-uniformity in thickness. The self-aligned contact is formed by forming the sacrificial backside contact placeholder under the source drain epitaxy such that the location of the backside contact is pre-defined, and formation no longer relies on the overlay performance of backside lithography process.

The present invention relates, generally, to the field of semiconductor manufacturing, and more particularly a backside contact.

Figure 2:
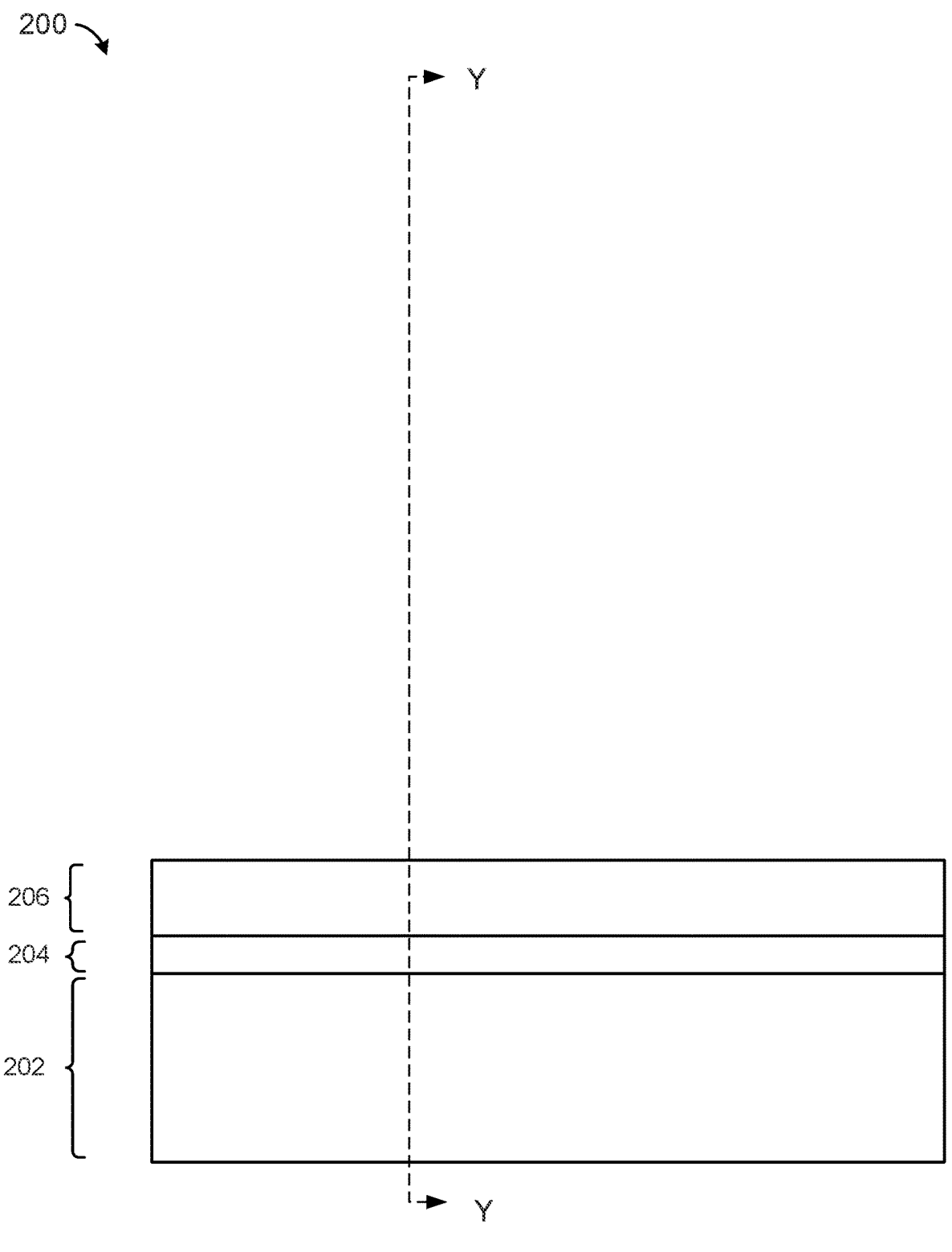
FIGS. 2 and 3 each illustrate a cross-sectional view of the semiconductor structure of FIG. 1 along section line X-X and Y-Y, respectively, according to an exemplary embodiment.
Figure 3:
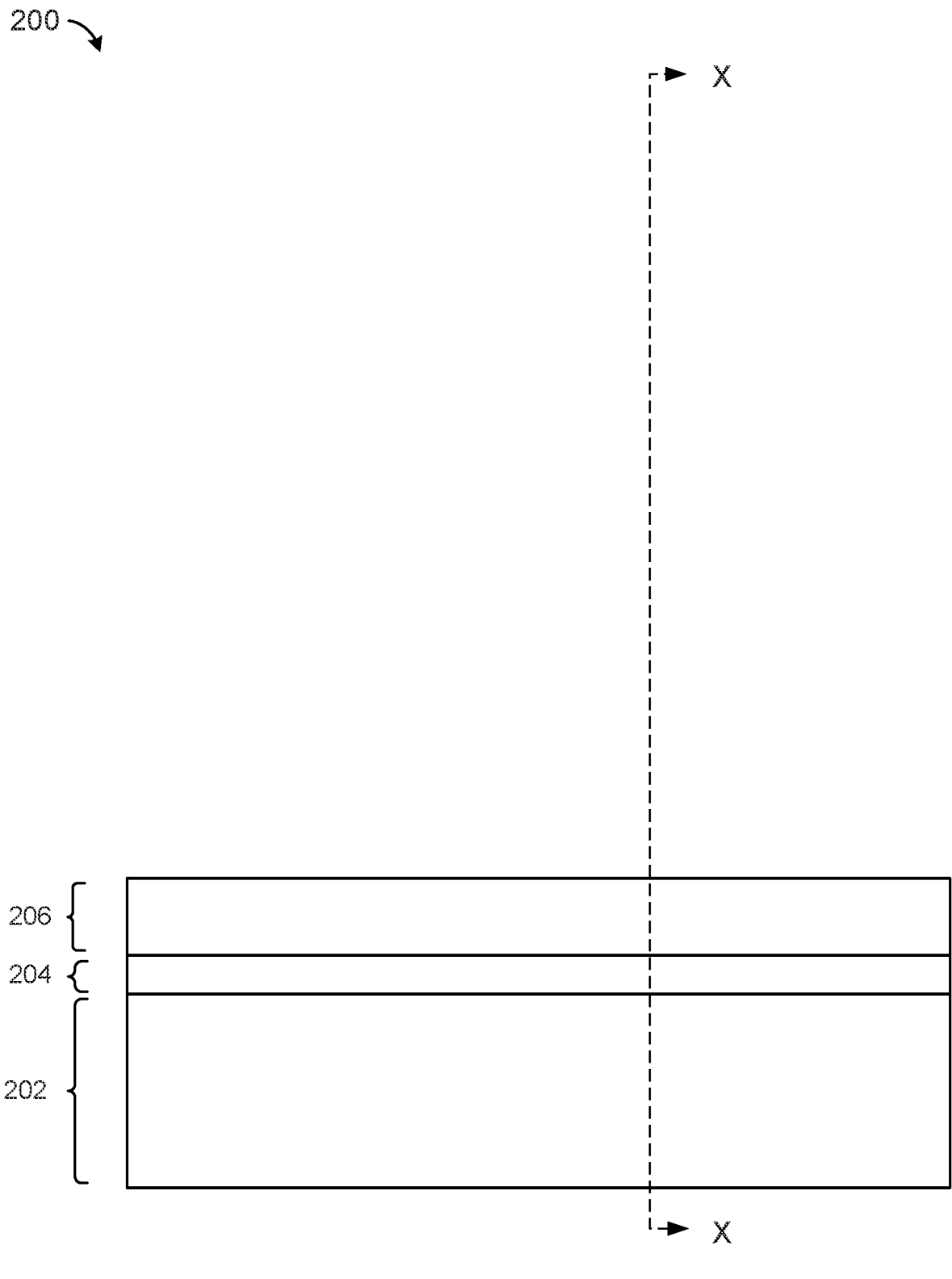

Referring now to FIGS. 1, 2 and 3, a semiconductor structure 200 (hereinafter "structure") at an intermediate stage of fabrication is shown according to an exemplary embodiment. FIG. 1 is a top view of the structure 200. FIG. 2 is a cross-sectional view of the structure 200 along section line X-X. FIG. 3 is a cross-sectional view of the structure 200 along section line Y-Y and is perpendicular to section line X-X. The structure 200 of FIG. 1 may be formed or provided.

The structure 200 may include a substrate 202, a silicon germanium layer 204 on the substrate 202, and a thin silicon layer 206 on the silicon germanium layer 204.

The substrate 202 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 202 may be approximately, but is not limited to, several hundred microns thick.

The silicon germanium layer 204 may be epitaxially grown and conformally cover an upper surface of the substrate 202 on the structure 200. The silicon germanium layer 204, may, for example, be silicon germanium with a germanium concentration about 30 atomic percent, although percentages greater than 30 percent and less than 30 percent may be used.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking.

The thin silicon layer 206 may be epitaxially grown and conformally cover an upper surface of the silicon germanium layer 206.

Figure 4:
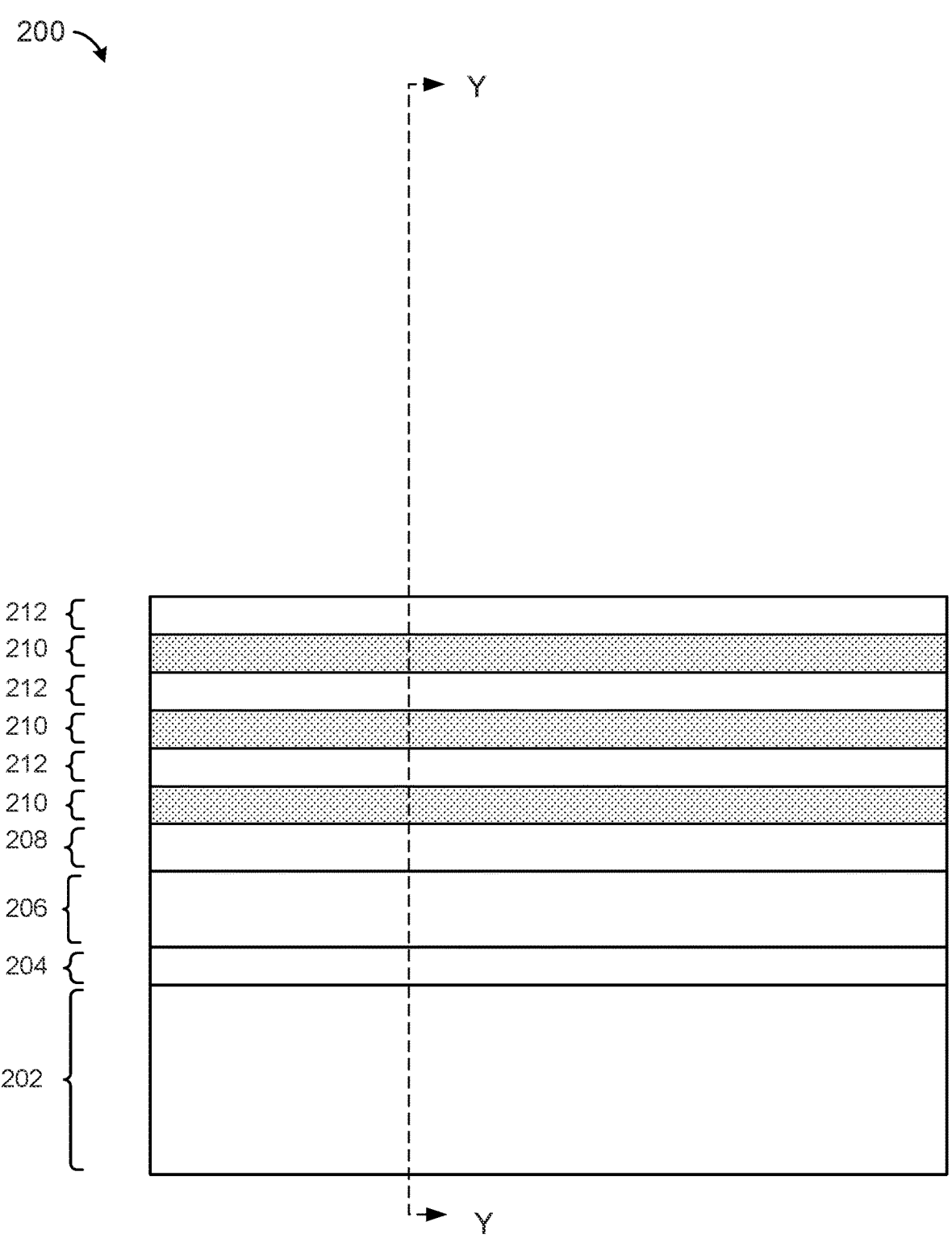
FIGS. 4 and 5 each illustrate a cross-sectional view of the semiconductor structure along section line X-X and Y-Y, respectively, and illustrates formation of sacrificial layers and semiconductor layers, according to an exemplary embodiment.
Figure 5:
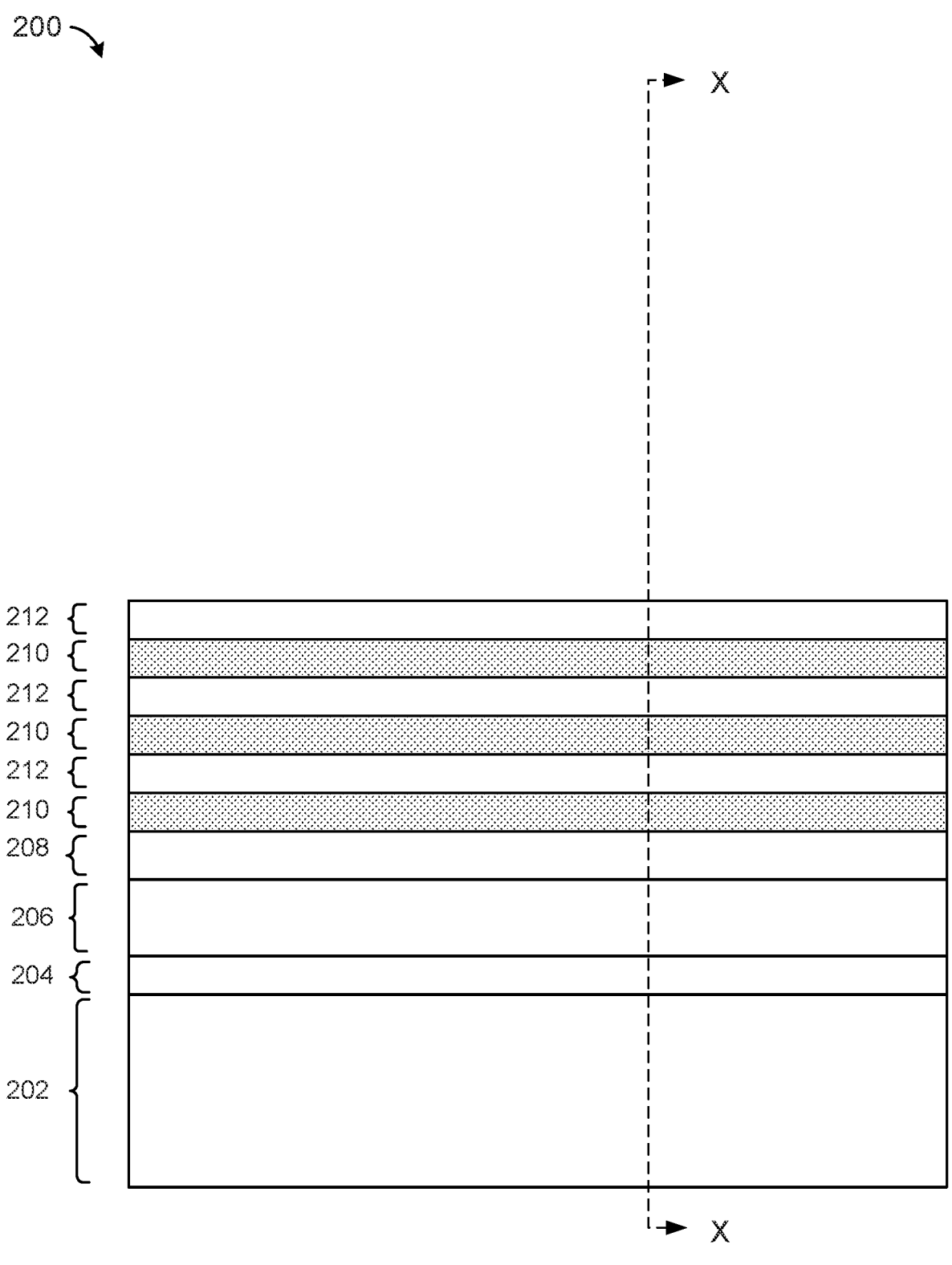

Referring now to FIGS. 4 and 5, the structure 200 is shown according to an exemplary embodiment. FIGS. 4 and 5 are each a cross-sectional view of the structure 200 along section lines X-X and Y-Y, respectively. FIGS. 4 and 5 are perpendicular to each other. A stack sacrificial layer 208 may be formed and a stacked nanosheet may be formed.

The stack sacrificial layer 208, may, for example, be silicon germanium with a germanium concentration about 55 atomic percent, although percentages greater than 55 percent and less than 55 percent may be used. The stack sacrificial layer 208 may be epitaxially grown on the structure 200.

Alternating layers of sacrificial semiconductor material and semiconductor channel material may collectively may be referred to as a stacked nanosheet. The alternating layers of sacrificial semiconductor material and semiconductor channel material may include a sacrificial semiconductor material layer 210 (hereinafter "sacrificial layer"), covered by a semiconductor channel material layer 212 (hereinafter "channel layer"), covered by a sacrificial layer 210, covered by a channel layer 212, covered by a sacrificial layer 210, covered by a channel layer 212.

The alternating layers of sacrificial layer 210 and channel layer 212 can be formed by sequential epitaxial growth of alternating layers of a first semiconductor material, and a second semiconductor material stacked one on top of another on a substrate. It should be noted that, while a limited number of alternating layers are depicted, any number of alternating layers may be formed. The epitaxial growth of the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 210 is composed of a first semiconductor material which differs in composition from at least an upper portion of the thin silicon layer 206, the channel layer 212 and the stack sacrificial layer 208. In an embodiment, each sacrificial layer 210 may be a silicon-germanium semiconductor alloy and have a germanium concentration less than 50 atomic percent. In another example, each sacrificial layer 210 may have a germanium concentration ranging from about 20 atomic percent to about 40 atomic percent. Each sacrificial layer 210 can be formed using known deposition techniques or an epitaxial growth technique as described above.

Each channel layer 212 is composed of a second semiconductor material which differs in composition from at least the upper portion of the thin silicon layer 206, the sacrificial layer 210 and the stack sacrificial layer 208. Each channel layer 212 has a different etch rate than the first semiconductor material of sacrificial layer 210 and has a different etch rate than the stack sacrificial layer 208. The second semiconductor material can be, for example, silicon. The second semiconductor material, for each channel layer 212 can be formed using known deposition techniques or an epitaxial growth technique as described above.

The sacrificial layers 210 may have a thickness ranging from about 5 nm to about 15 nm, and the channel layers 212 may have a thickness ranging from about 4 nm to about 12 nm. Each sacrificial layer 210 may have a thickness that is the same as, or different from, a thickness of each channel layer 212. In an embodiment, each sacrificial layer 210 has an identical thickness. In an embodiment, each channel layer 212 has an identical thickness. The stack sacrificial layer 208 may each have a thickness ranging from about 5 nm to about 12 nm.

Each channel layer 212 is composed of a second semiconductor material which differs in composition from at least the upper portion of the thin silicon layer 206, the silicon germanium layer 204, the sacrificial layer 210 and the stack sacrificial layer 208. Each channel layer 212 has a different etch rate than the first semiconductor material of sacrificial layer 210 and has a different etch rate than the stack sacrificial layer 208.

Figure 6:
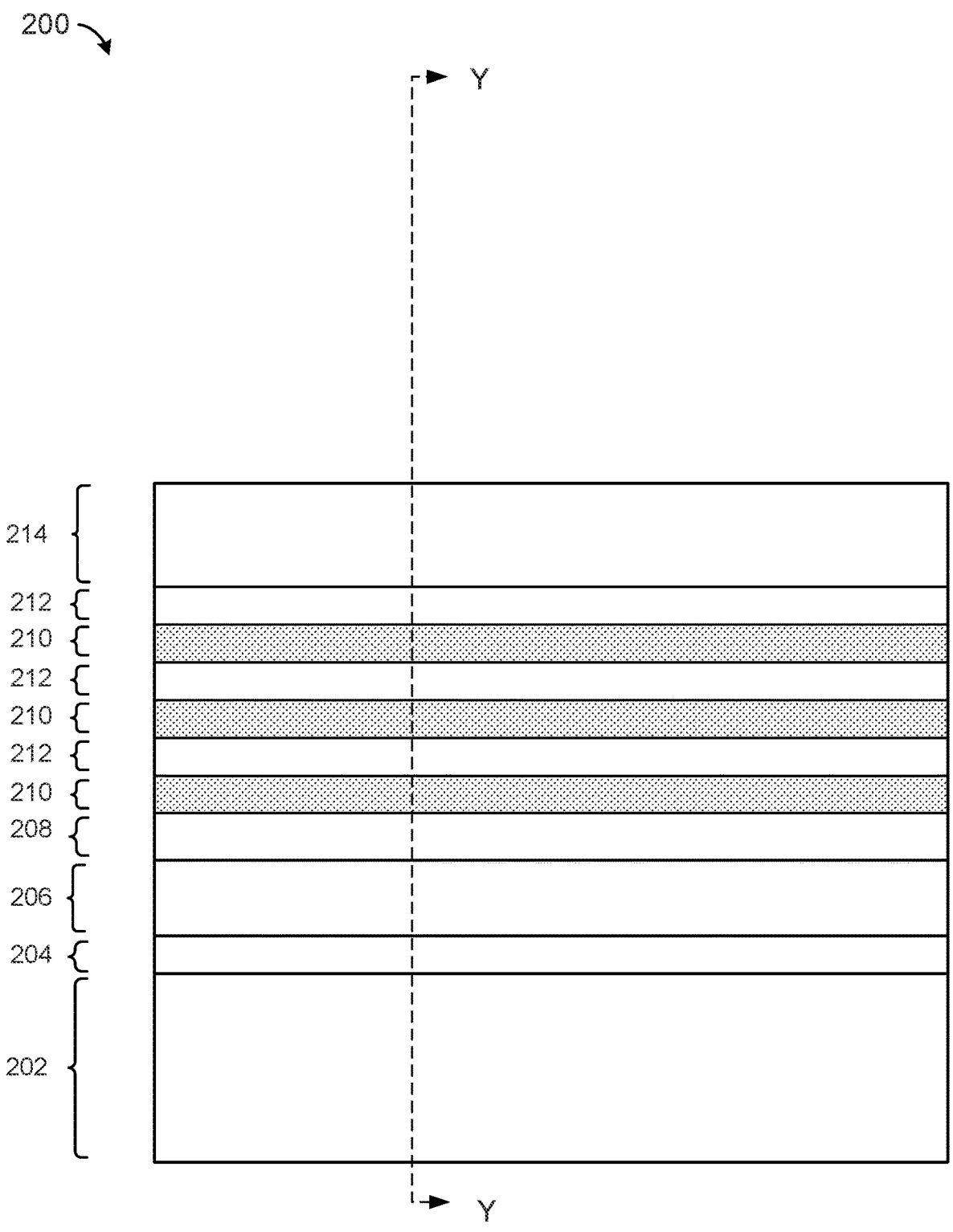
FIGS. 6 and 7 each illustrate a cross-sectional view of the semiconductor structure along section line X-X and Y-Y, respectively, and illustrate formation of a trench, according to an exemplary embodiment.
Figure 7:
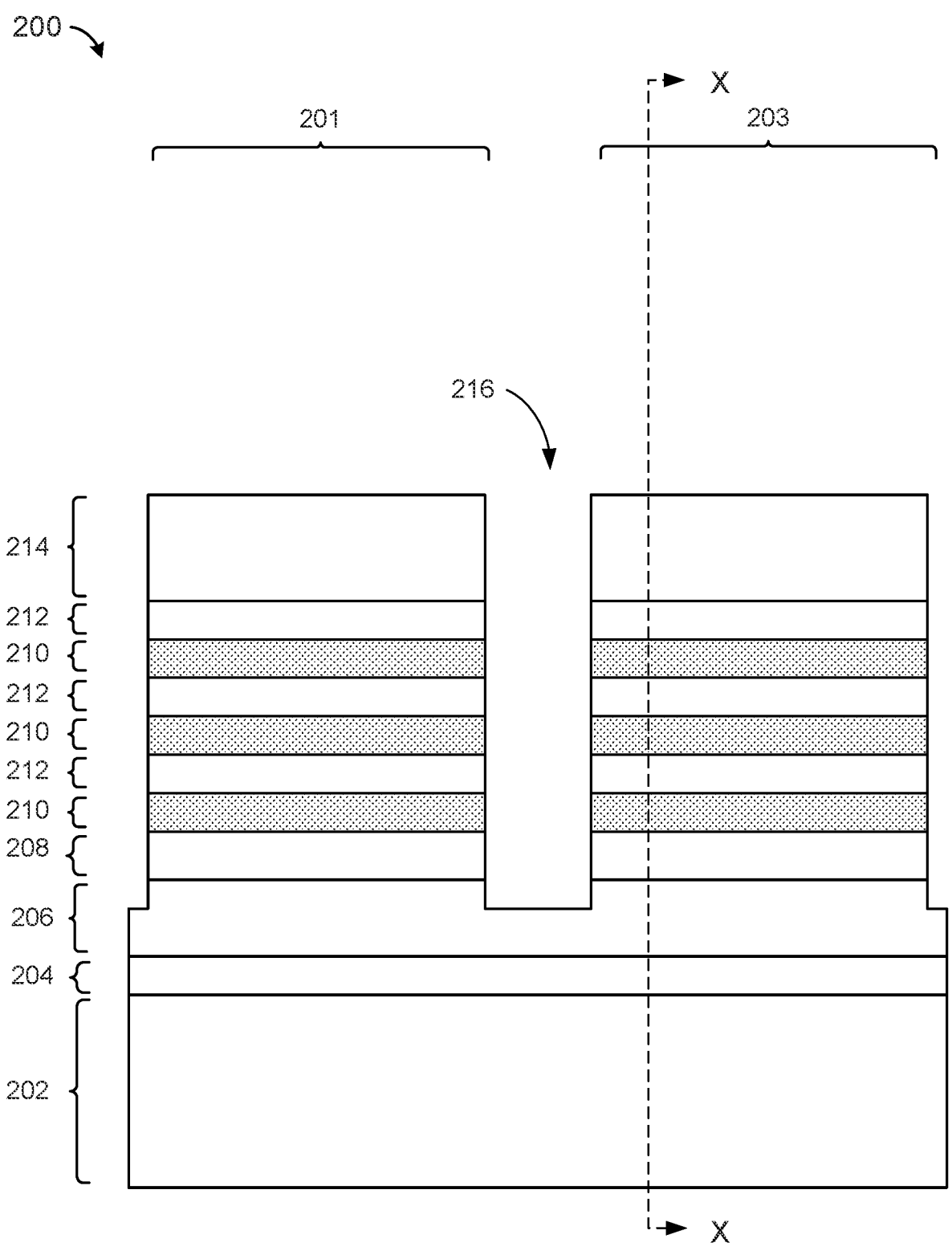

Referring now to FIGS. 6 and 7, the structure 200 is shown according to an exemplary embodiment. FIGS. 6 and 7 are each a cross-sectional view of the structure 200 along section lines X-X and Y-Y, respectively. FIGS. 6 and 7 are perpendicular to each other. A hard mask 214 may be formed. A trench 216 may be formed separating the structure 200 into a region 201 and a region 203.

The hard mask 214 may be conformally formed on the structure 200 by methods known in the arts. The stack sacrificial layer 208 and the alternating layers of sacrificial layers 210 and channel layers 212 may be formed into a double wide fins, by methods known in the art. The double wide fin may be further divided into two separate fins in a later processing step. The double wide fin may have a length perpendicular to section line Y-Y and parallel to section line X-X. The fins may be formed by methods known in the arts, and include steps such as forming a hard mask, on the alternating layers, patterning the hard mask, and subsequent formation of one or more trenches 216, by removal of portions of each layer of the stacked nanosheet. The trench 216 may form the nanosheet stack into double wide fins by an anisotropic etching technique, such as, for example, reactive ion etching (RIE), and stopping on etching a portion of the thin silicon layer 206 between each nanosheet stack.

Each double wide fin of nanosheet stack may include a stack sacrificial layer 208, covered by a sacrificial layer 210, covered by a channel layer 212, covered by a sacrificial layer 210, covered by a channel layer 212, covered by a sacrificial layer 210, covered by a channel layer 212, covered by the hard mask 214. By way of illustration, two double wide fins are depicted in the drawings of the present application, although any number of fins may be formed.

The material stacks that can be employed in embodiments of the present invention are not limited to the specific embodiment illustrated in FIGS. 6 and 7. In FIGS. 6 and 7, and only by way of an example, the nanosheet stack includes three layers of sacrificial layers 210 alternating with three channel layers 212. The nanosheet stack can include any number of sacrificial layers 210 and channel layers 212. The nanosheet stack is used to produce a gate all around device that includes vertically stacked semiconductor channel material nanosheets for a p-FET or an n-FET.

In an embodiment, the double wide fin of the region 201 may be formed into p-FET nanosheets while the double wide fin of the region 203 may be formed into n-FET nanosheets. The trench 216 may separate p-FET nanosheets from n-FET nanosheets. Alternatively, the trench 216 may separate adjacent p-FET nanosheets or may separate adjacent n-FET nanosheets.

Figure 8:
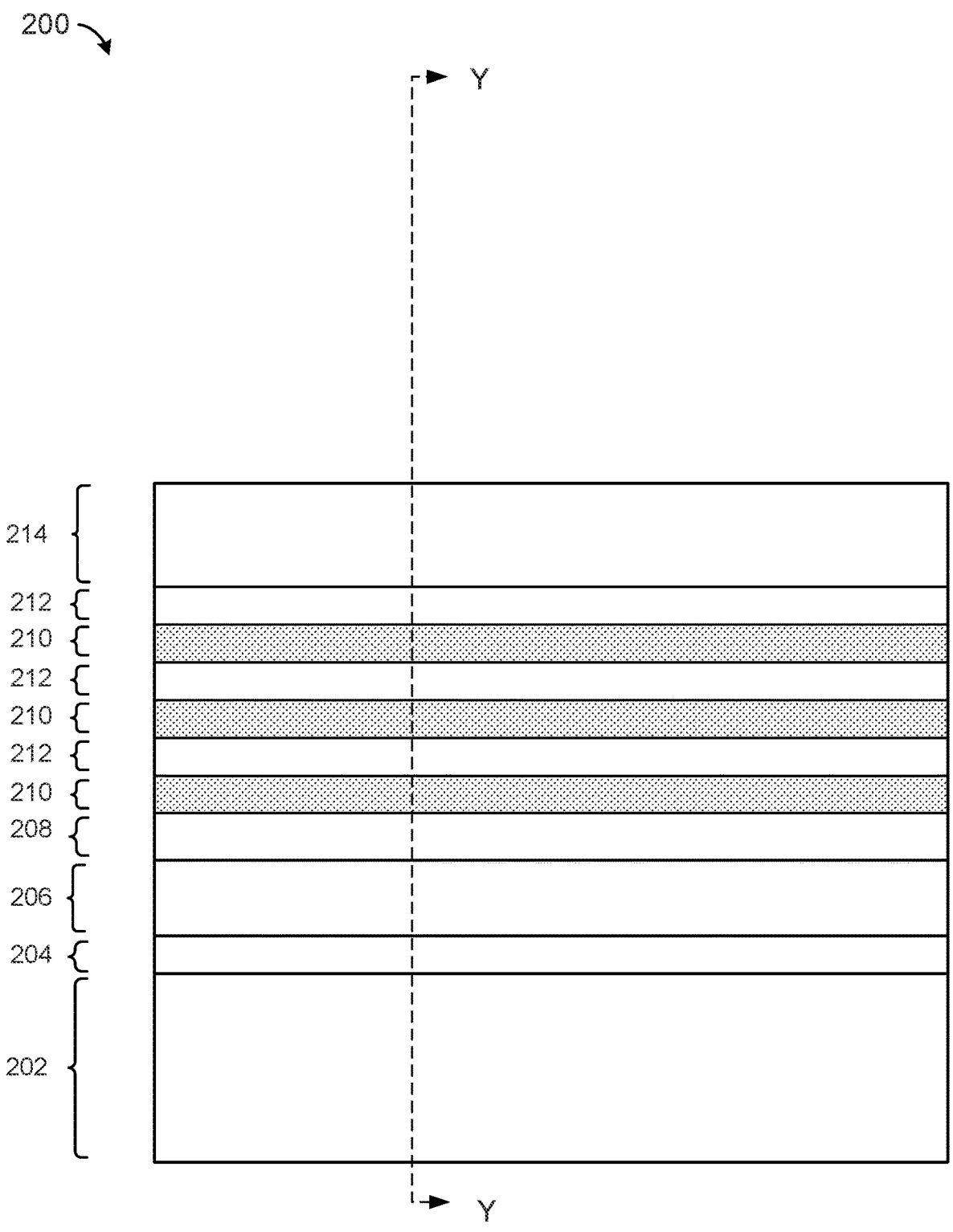
FIGS. 8 and 9 each illustrate a cross-sectional view of the semiconductor structure along section line X-X and Y-Y, respectively, and illustrate formation of a liner, according to an exemplary embodiment.
Figure 9:
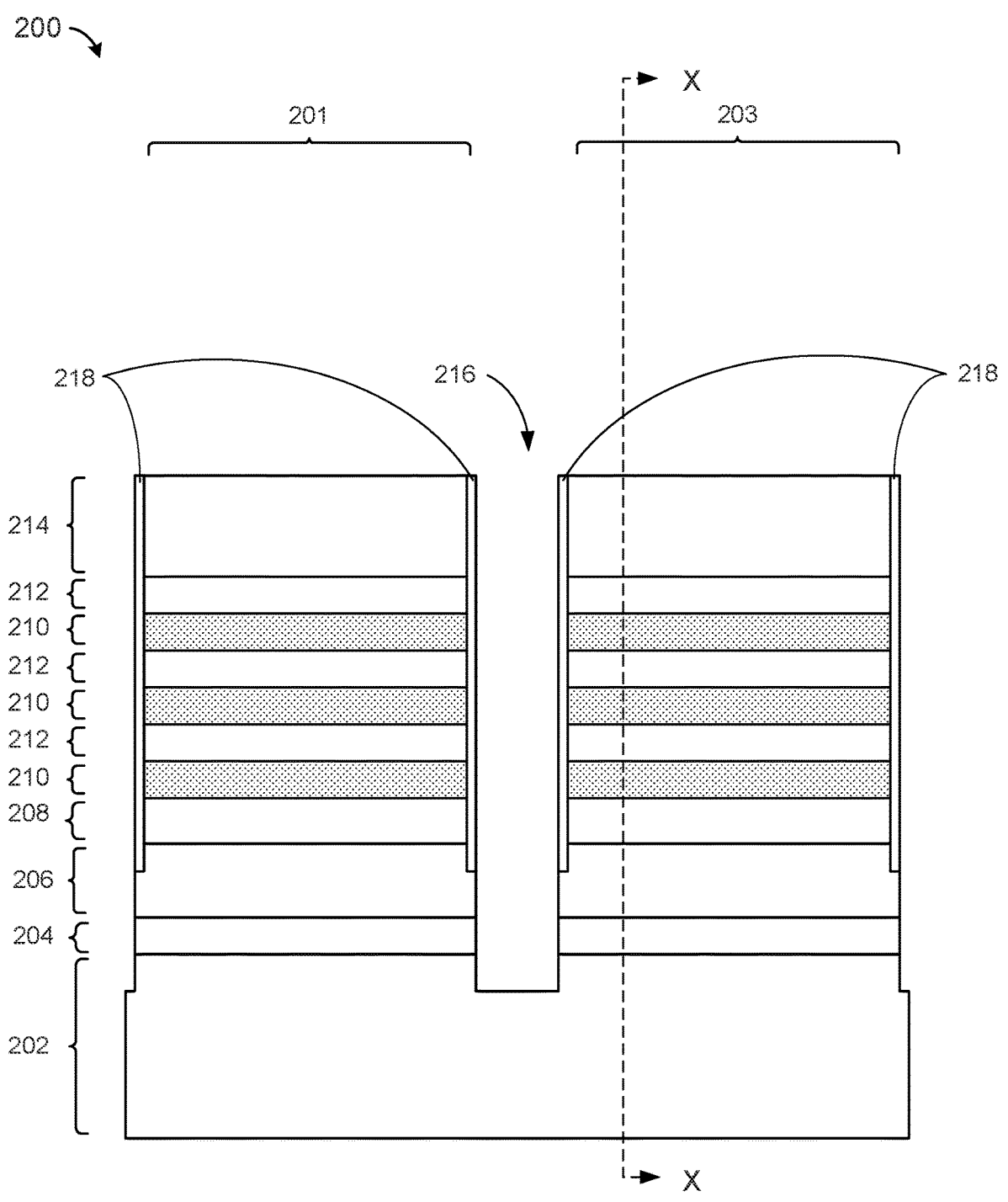

Referring now to FIGS. 8 and 9, the structure 200 is shown according to an exemplary embodiment. FIGS. 8 and 9 are each a cross-sectional view of the structure 200 along section lines X-X and Y-Y, respectively. FIGS. 8 and 9 are perpendicular to each other. A liner 218 may be formed and the trench 216 may be increased.

The liner 218 may be formed conformally on the structure 200 followed by an anisotropic etching technique to remove the horizontal portions of the liner 218 and deepen the trench 216 until it etches into substrate 202. The liner 218 may cover a vertical surface of the hard mask 214 and vertical side surfaces of the channel layers 212, the sacrificial layers 210, and a portion of a vertical side surface of the stack sacrificial layer 206. The liner 218 may be deposited using typical deposition techniques, for example, atomic layer deposition (ALD), molecular layer deposition (MLD), chemical vapor deposition (CVD), physical vapor deposition (PVD), and spin on techniques. In an embodiment, the liner 218, may include $SiO_2$, SiN, SiC, AlOx, TiN, TiOx, etc. In an embodiment, the liner 218, may have a thickness, about 2 nm to 20 nm, and ranges there between, although a thickness less than 2 nm and greater than 20 nm may be acceptable.

The liner 218 may protect the sacrificial layers 210, the channel layers 212 of the nanosheet stack from being damaged later. The trench 216 may be increased by removal of vertically aligned portions of the thin silicon layer 206, the silicon germanium layer 204 and portions of the substrate 202. The trench 216 may be increased by methods known in the arts. In an embodiment, the trench 216 may be increased by an anisotropic etching technique, such as, for example, reactive ion etching (RIE).

Figure 10:
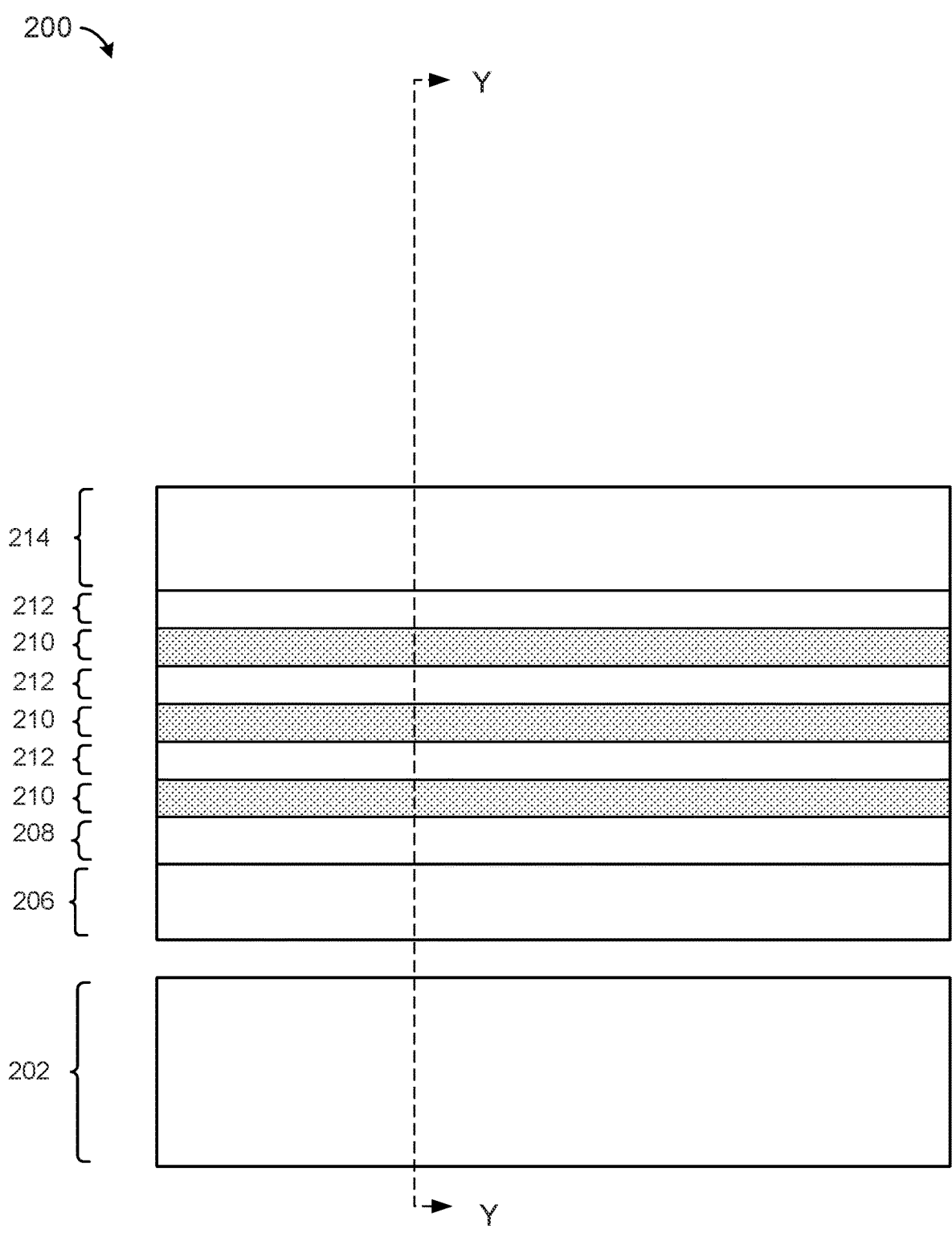
FIGS. 10 and 11 each illustrate a cross-sectional view of the semiconductor structure along section line X-X and Y-Y, respectively, and illustrate removal of a portion of a silicon germanium layer, according to an exemplary embodiment.
Figure 11:
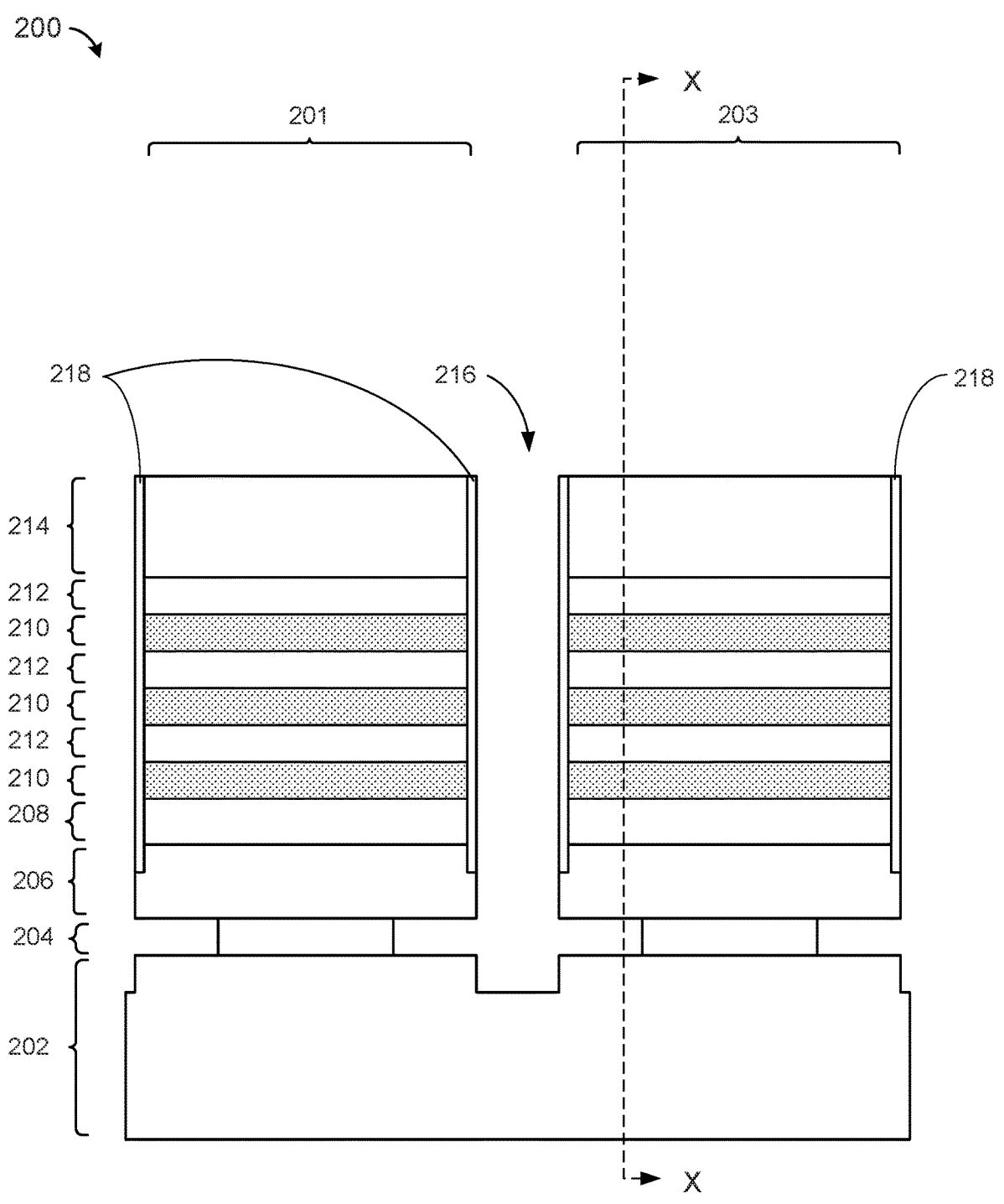

Referring now to FIGS. 10 and 11, the structure 200 is shown according to an exemplary embodiment. FIGS. 10 and 11 are each a cross-sectional view of the structure 200 along section lines X-X and Y-Y, respectively. FIGS. 10 and 11 are perpendicular to each other. The silicon germanium layer 204 may be recessed.

The silicon germanium layer 204 may be recessed by methods known in the arts. For example, a dry etching technique can be used to selectively remove portions of the silicon germanium layer 204, such as, for example, using vapor phased HCl dry etch. The silicon germanium layer 204 may be recessed selective to the substrate 202, the thin silicon layer 206, the channel layers 212, the sacrificial layers 210, the stack sacrificial layer 206 and the liner 218.

Figure 12:
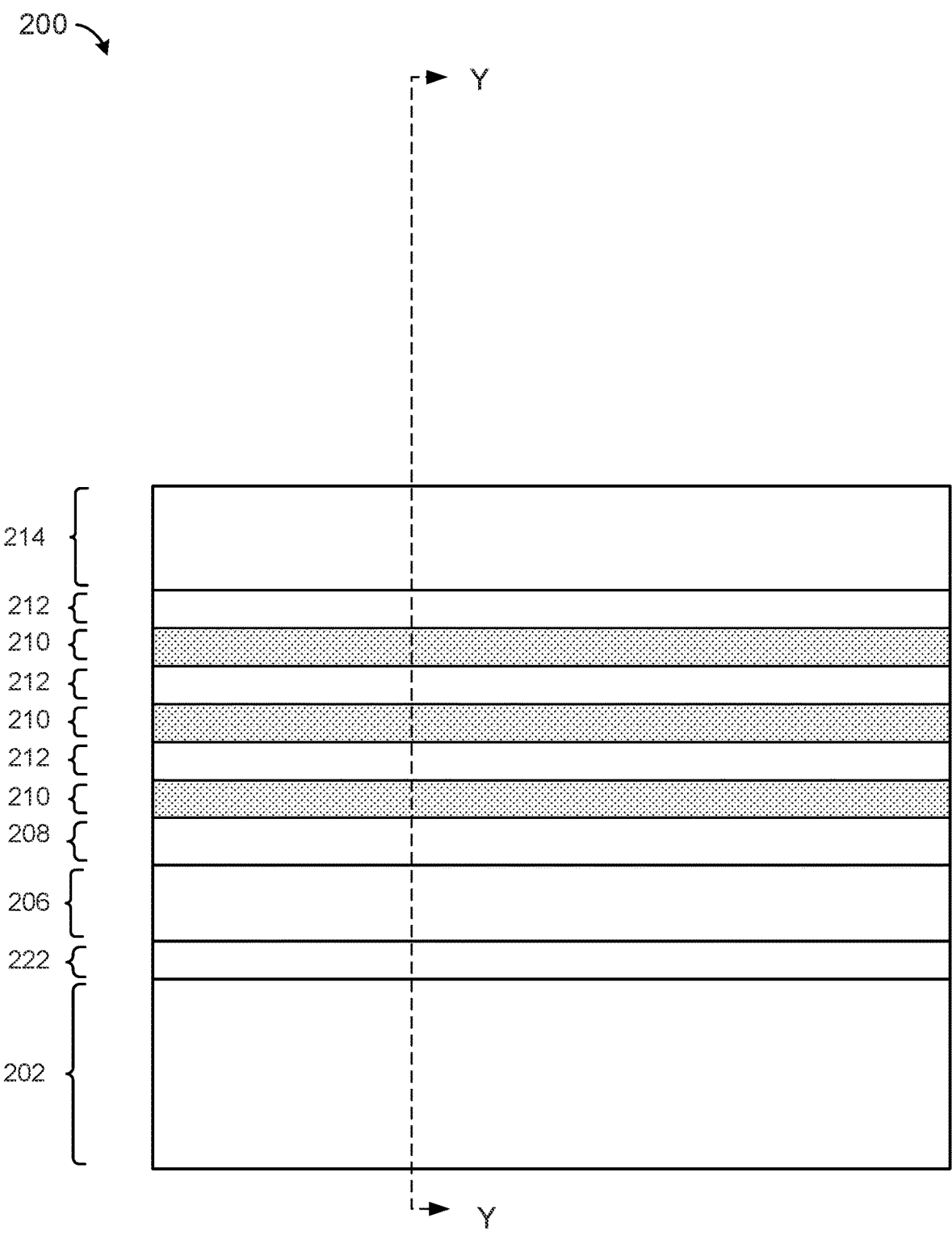
FIGS. 12 and 13 each illustrate a cross-sectional view of the semiconductor structure along section line X-X and Y-Y, respectively, and illustrate formation of a shallow trench isolation, according to an exemplary embodiment.
Figure 13:
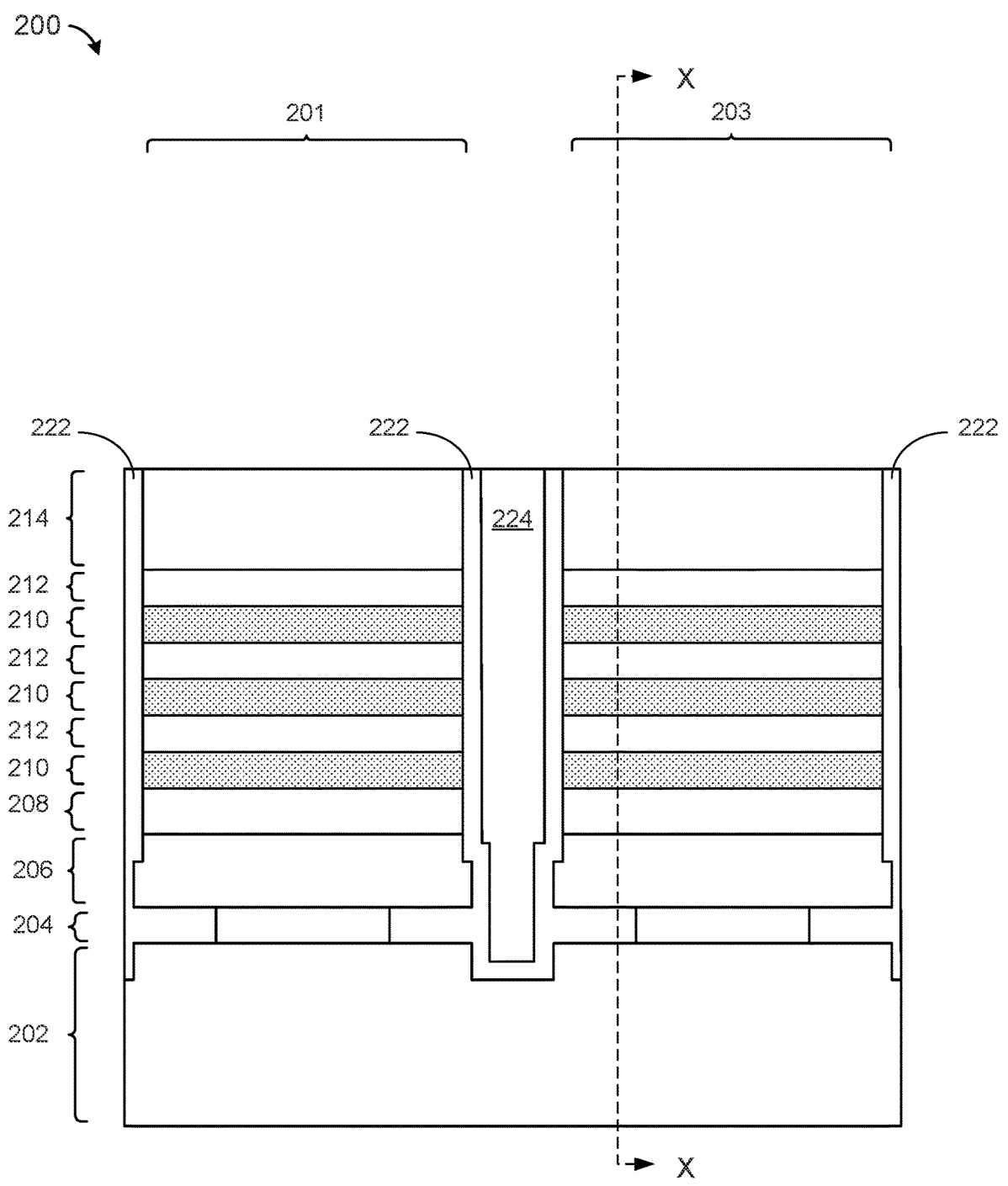

Referring now to FIGS. 12 and 13, the structure 200 is shown according to an exemplary embodiment. FIGS. 12 and 13 are each a cross-sectional view of the structure 200 along section lines X-X and Y-Y, respectively. FIGS. 12 and 13 are perpendicular to each other. The liner 218 may be removed. A liner 222 may be formed. A shallow trench isolation (hereinafter "STI") 224 may be formed.

The liner 218 may be removed using methods know in the arts. The liner 218 may be removed selective to the hard mask 218, the channel layers 212, the sacrificial layers 210, the stack sacrificial layer 208, the thin silicon layer 206, the silicon germanium layer 204 and the substrate 202.

The liner 222 may be formed conformally on the structure 200. The liner 222 may cover an upper horizontal surface and a vertical surface of the hard mask 214 and vertical side surfaces of the channel layers 212, the sacrificial layers 210, the thin silicon layer 206, the silicon germanium layer 204 and the stack sacrificial layer 208, a vertical side surface and a portion of a lower horizontal surface of the thin silicon layer 206, and a vertical side surface and an upper horizontal surface of the silicon germanium layer 204. The liner 222 may be deposited using typical deposition techniques, for example, atomic layer deposition (ALD), molecular layer deposition (MLD), chemical vapor deposition (CVD), physical vapor deposition (PVD), and spin on techniques. In an embodiment, the liner 222, may include SiN, SiBCN, SiOCN, SiOC, etc. In an embodiment, the liner 222, may have a thickness, about 3 nm to 20 nm, and ranges there between, although a thickness less than 3 nm and greater than 20 nm may be acceptable.

The STI 224 may be formed conformally on the structure 200. The STI 224 may fill a space between adjacent double wide fins of the structure 200. The STI may fill a space between the liner 222, where the liner 222 covers the double side fins.

The STI 224 may be a dielectric material and may be formed using known deposition, planarization and etching techniques. The STI 224 may be formed by conformally depositing a dielectric material, followed by a combination of dry and wet anisotropic etch and recessing steps. The STI 224 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the STI 224 may each include one or more layers. The STI 224 may each include any dielectric material such as SiO2. A lower horizontal surface of the STI 224 may be below a portion of an upper horizontal surface of the substrate 202.

A chemical mechanical polishing (CMP) technique may be used to remove excess material and polish upper surfaces of the structure 200, exposing upper horizontal surfaces of the hard mask 214, the liner 222 and the STI 224.

Figure 14:
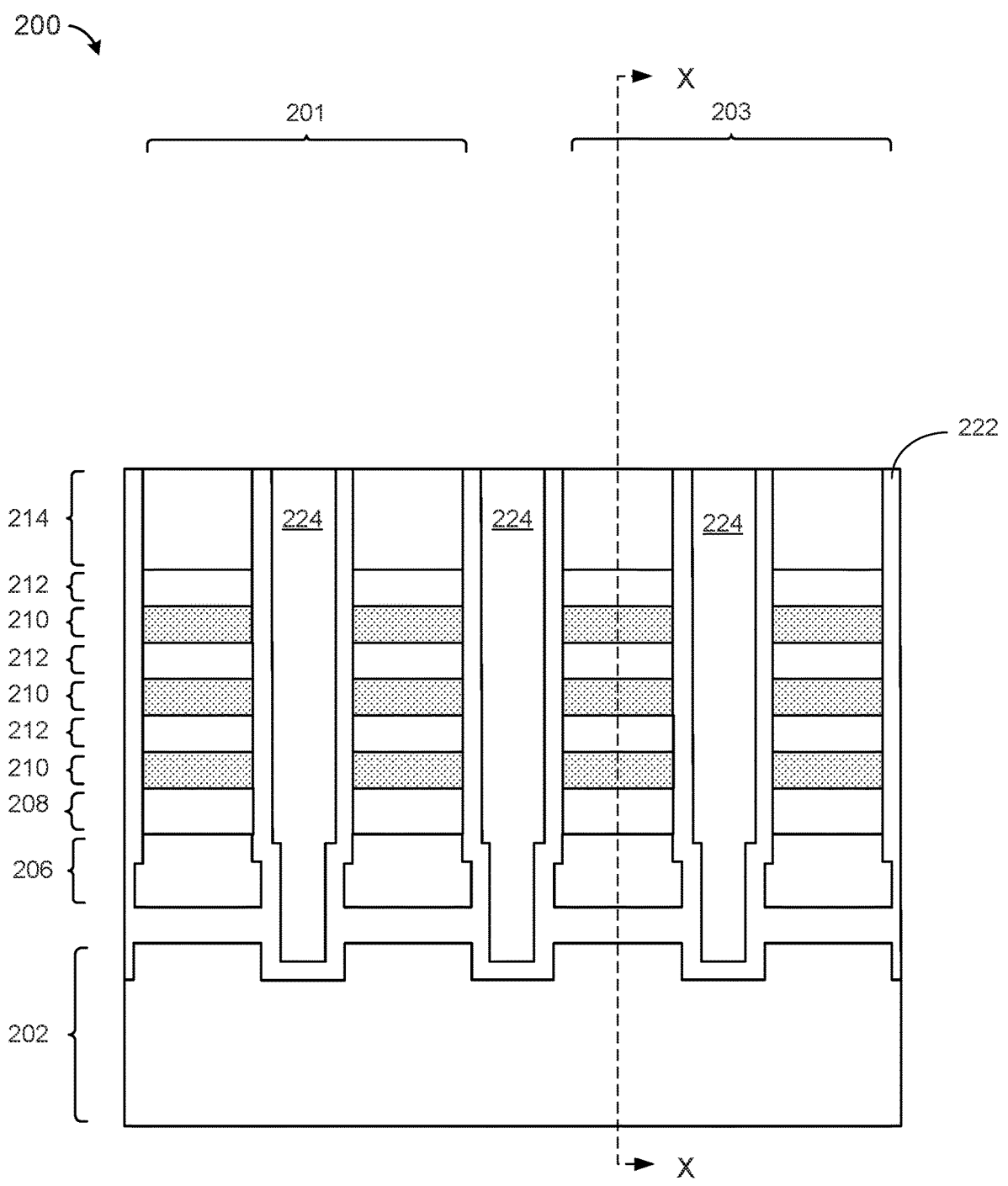
FIG. 14 illustrates a cross-sectional view of the semiconductor structure along section line Y-Y, and illustrates formation of a further shallow trench isolation, according to an exemplary embodiment.

Referring now to FIG. 14, the structure 200 is shown according to an exemplary embodiment. FIG. 14 is a cross-sectional view of the structure 200 along section line Y-Y. FIG. 12 remains unchanged for this process step. The double wide fins may be separated by repeating the process steps of FIGS. 6 to 13 using another lithography mask. A remaining portion of the silicon germanium layer 204 may be removed.

A trench (not shown) lengthwise may be formed in the double wide fins. The liner 222 may be formed in the trench (not shown). The STI 224 may be formed within the liner 222. A CMP may be performed. The structure 200 may no longer have double wide fins. The structure 200 may now have fins of nanosheet stacks which are isolated from each other by the STI 224.

Figure 15:
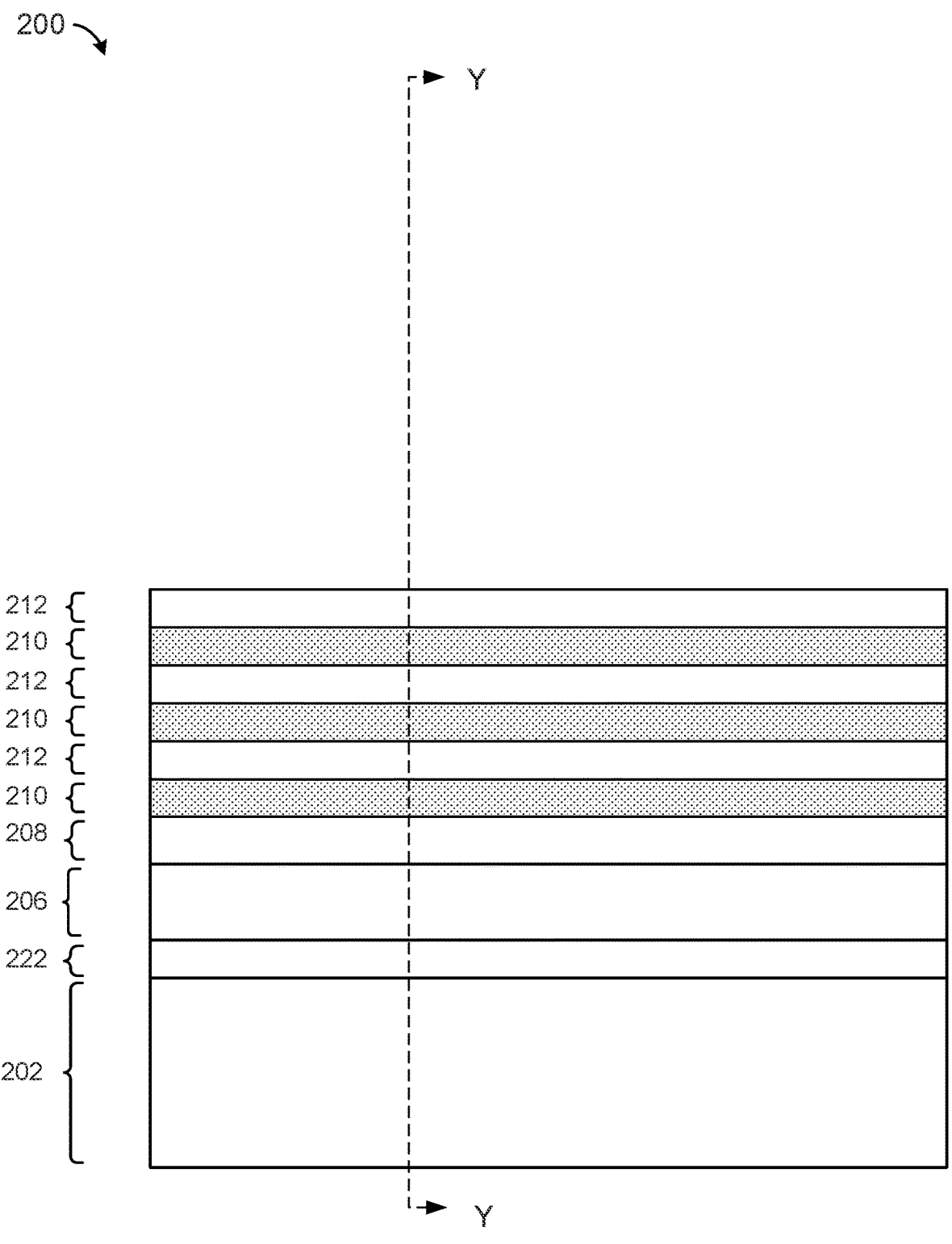
FIGS. 15 and 16 each illustrate a cross-sectional view of the semiconductor structure along section line X-X and Y-Y, respectively, and illustrate formation of a trench, according to an exemplary embodiment.
Figure 16:
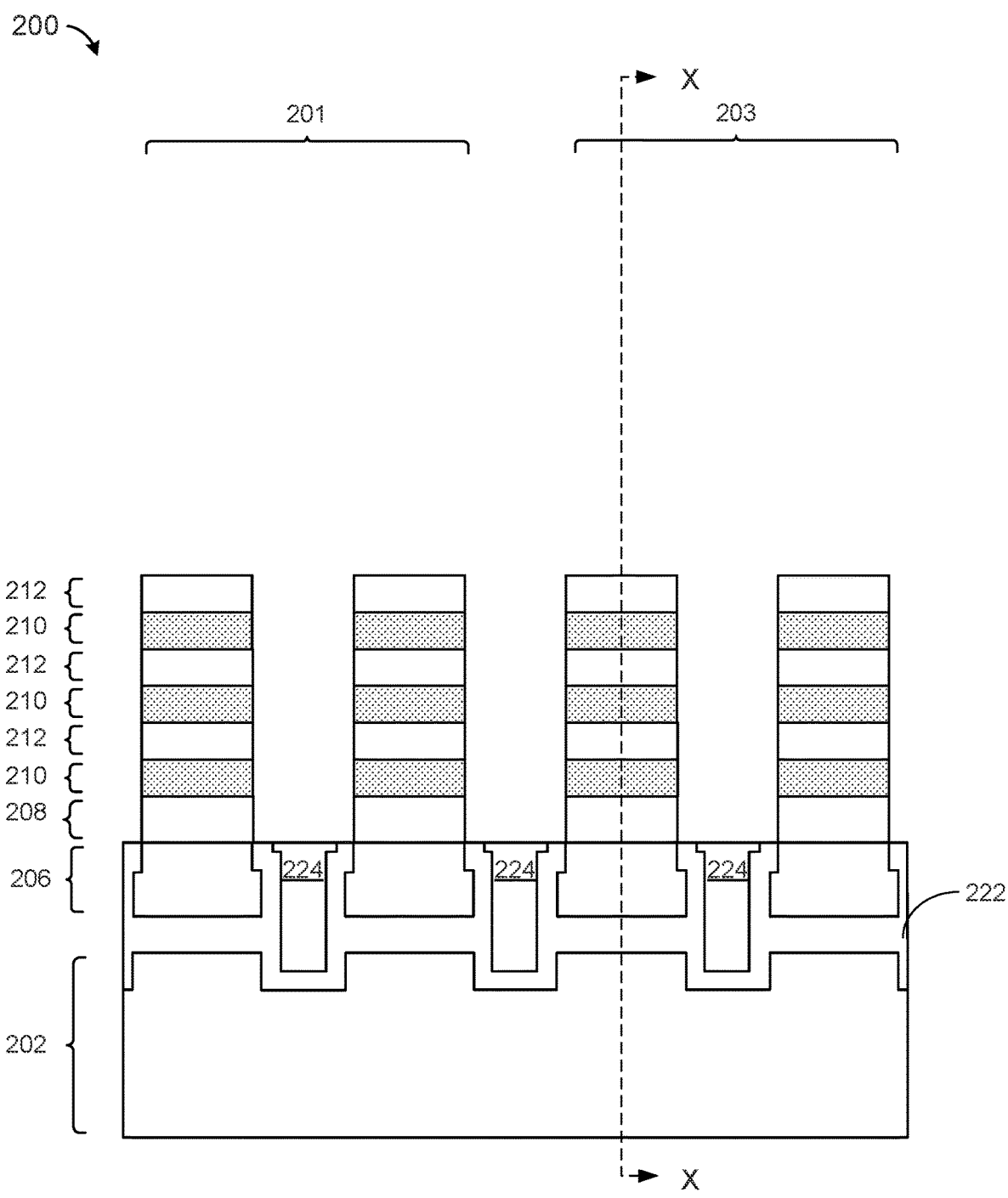

Referring now to FIGS. 15 and 16, the structure 200 is shown according to an exemplary embodiment. FIGS. 15 and 16 are each a cross-sectional view of the structure 200 along section lines X-X and Y-Y, respectively. FIGS. 15 and 16 are perpendicular to each other. Portions of the liner 222 and portions of the STI 224 are removed. The hard mask 214 is removed.

Portions of the liner 222 and portions of the STI 224 are selectively removed, selective to the hard mask 214, the channel layers 212, the sacrificial layers 210, the stack sacrificial layer 208 and the thin silicon layer 206. The portions of the liner 222 and the portions of the STI 224 may be selectively removed by methods known in the arts. For example, an isotropic wet or dry etch process. Vertical side surfaces of the channel layers 212, the sacrificial layers 210, the stack sacrificial layer 208 and a portion of a vertical side surface of the thin silicon layer 206 may be exposed. In an embodiment, an upper surface of the liner 222 and an upper surface of the STI 224 may align with an upper surface of the thin silicon layer 206. The STI 224 and the STI liner 222 remain within the thin silicon layer 206, between adjacent nanosheet stacks, providing physical and electrical isolation between adjacent nanosheet stacks.

The region 201 illustrates two p-FET nanosheet fins and the region 203 illustrates two n-FET nanosheet fins. There may be any number of nanosheet fins in either the region 201 or the region 203.

Figure 17:
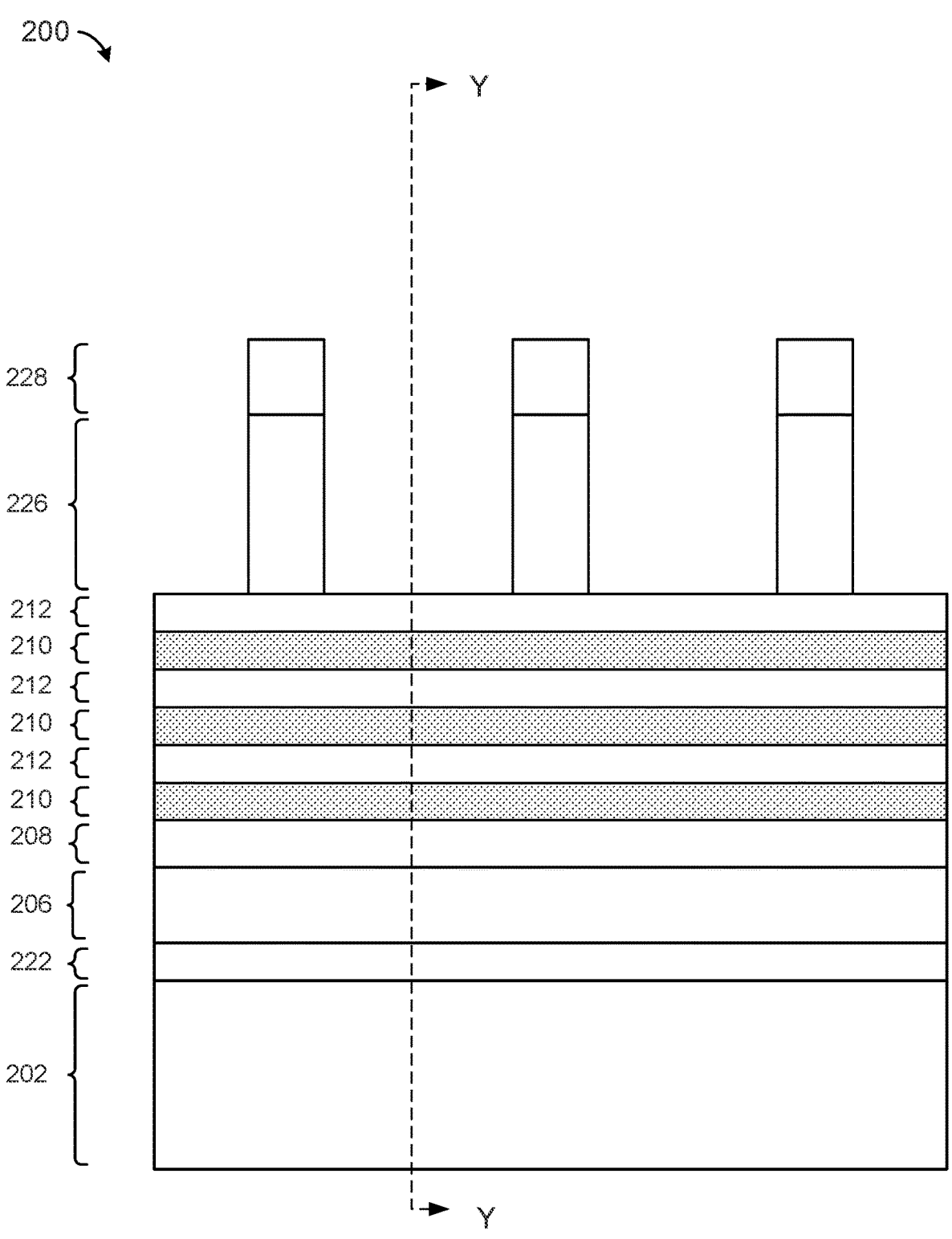
FIG. 17 illustrates a cross-sectional view of the semiconductor structure along section line X-X, and illustrates formation of a sacrificial layer gate and a gate cap, according to an exemplary embodiment.

Referring now to FIG. 17, the structure 200 is shown according to an exemplary embodiment. FIG. 17 is a cross-sectional view of the structure 200 along section line X-X. FIG. 16 remains unchanged for this process step. A sacrificial gate 226 and a gate cap 228 may be formed.

The sacrificial gate 226 and the gate cap 228 are formed orthogonal (perpendicular) to the fins. By way of illustration, three sacrificial gates 226 are depicted in the drawings of the present application, although any number of sacrificial gates 226 may be formed. The sacrificial gate 226 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 226 can include any material including, for example, polysilicon, amorphous silicon, or multilayered combinations thereof. In an embodiment where amorphous silicon is used as a material for the sacrificial gate 226, a thin layer of SiO2 is deposited first to separate the nanosheet stack from the amorphous silicon. The sacrificial gate 226 can be formed using any deposition technique including, for example, chemical vapor deposition (CVD), physical vapor deposition (PVD), high density plasma (HDP) deposition, and spin on techniques. Optionally, the gate cap 228 may be formed as part of the sacrificial gate 226 in accordance with known techniques.

In an embodiment, the sacrificial gate 226 is deposited with a thickness sufficient to fill, or substantially fill, the spaces between adjacent nanosheet structures and cover a horizontal upper surface of the uppermost channel layer 212 of the nanosheet stack. The sacrificial gate 226 may be adjacent to vertical side surfaces of the nanosheet stack or fins. The sacrificial gate 226 may cover an upper horizontal surface of the BOX SiO2 104 between adjacent nanosheet stacks. A height of the sacrificial gate 226 may be much thicker than the underlying structure and may have a height between 100 nm and 150 nm about the nanosheet stack. The gate cap 228 may cover an upper horizontal surface of the sacrificial gate 226. Gate patterning may be performed by conventional lithography and etch process, such that portions of the gate cap 228 and portions of the sacrificial gate 226 are removed from a subsequently formed source drain region.

Figure 18:
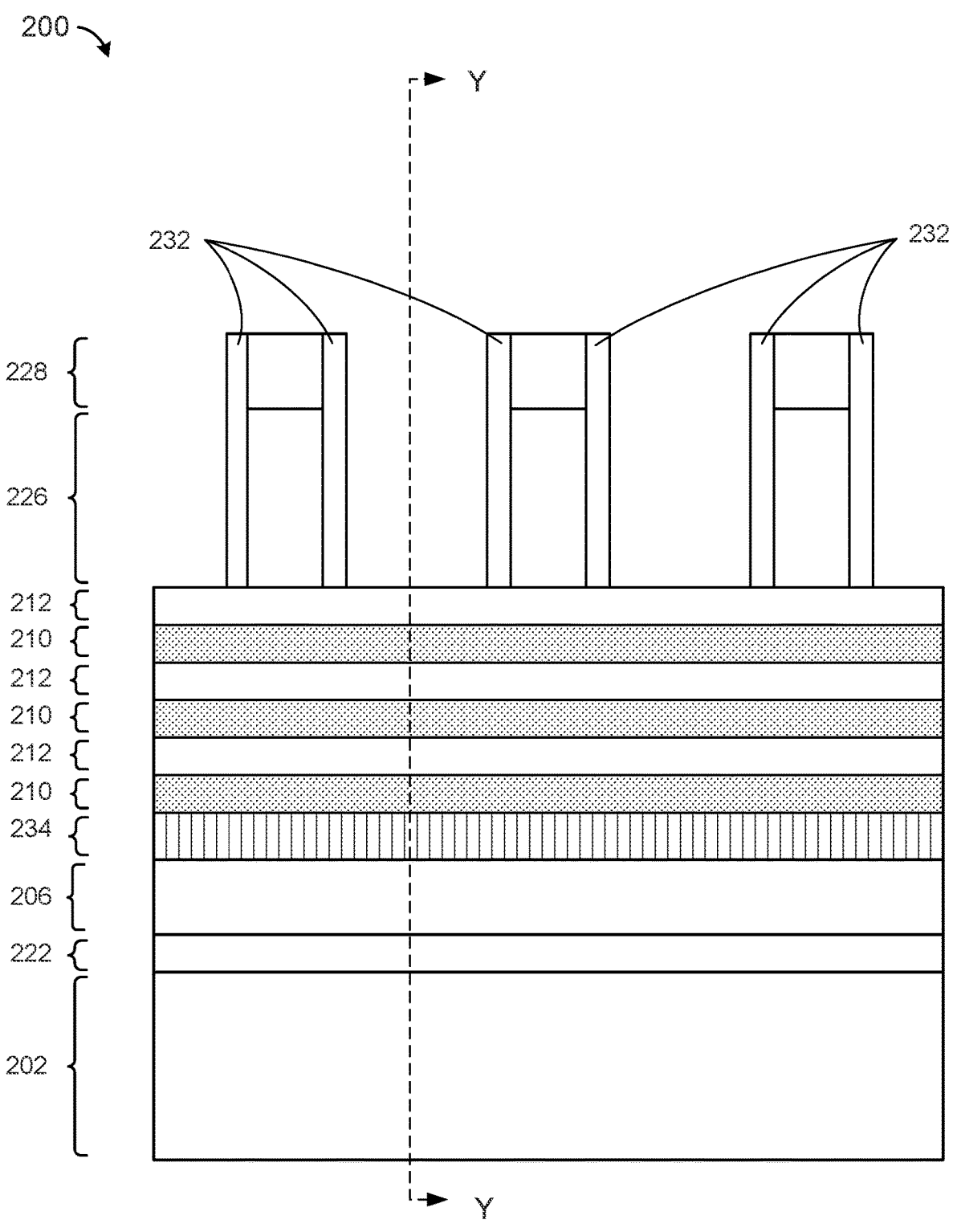
FIGS. 18 and 19 each illustrate a cross-sectional view of the semiconductor structure along section line X-X and Y-Y, respectively, and illustrate removal of a sacrificial layer and formation of a bottom isolation region, according to an exemplary embodiment.
Figure 19:
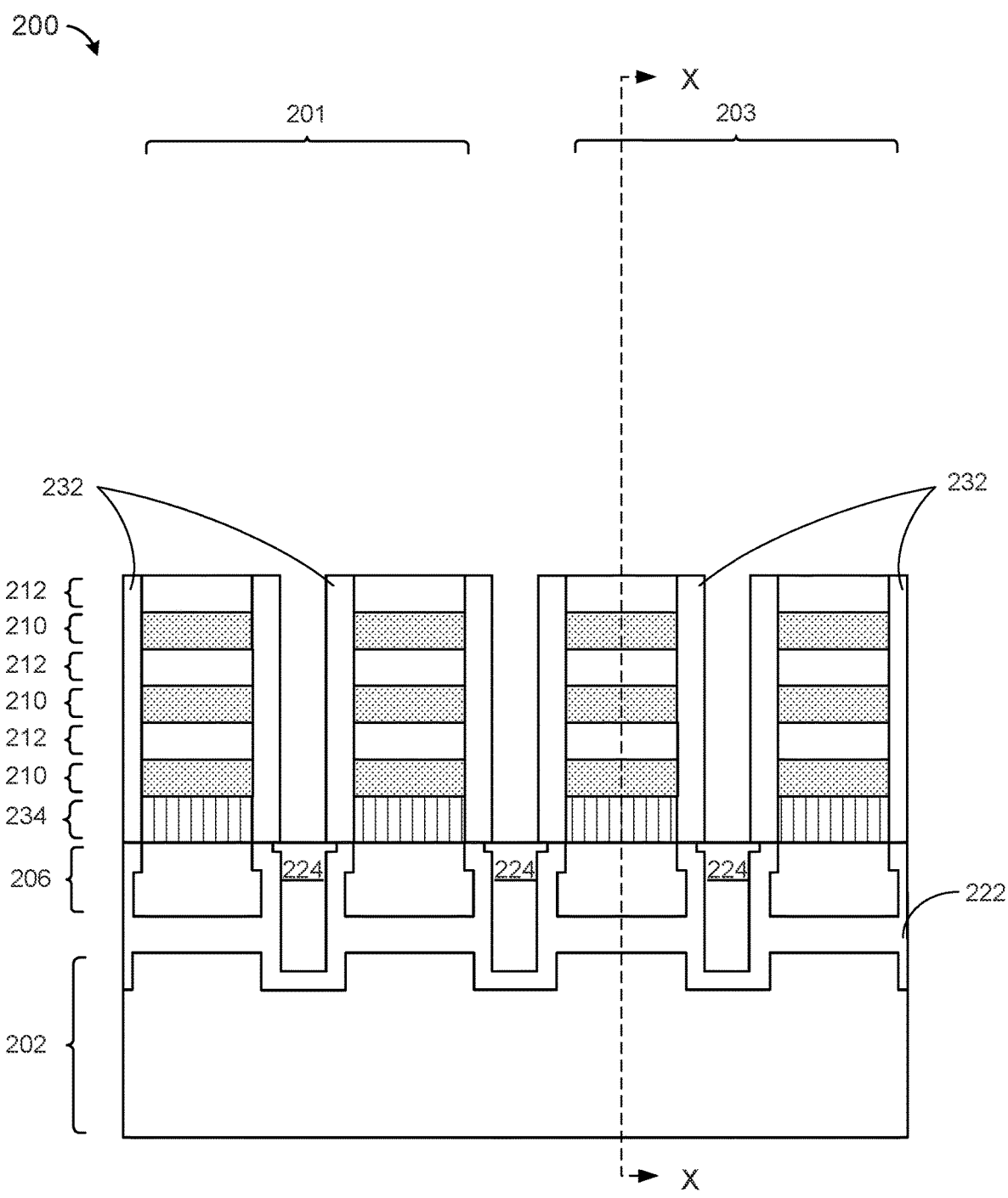

Referring now to FIGS. 18 and 19, the structure 200 is shown according to an exemplary embodiment. FIGS. 18 and 19 are each a cross-sectional view of the structure 200 along section lines X-X and Y-Y, respectively. FIGS. 18 and 19 are perpendicular to each other. The stack sacrificial layer 208 may be removed. A bottom dielectric isolation 234 (hereinafter "BDI") and a dielectric spacer 232 may be formed.

The stack sacrificial layer 208 may be selectively removed by methods known in the arts. For example, a dry etching technique can be used to selectively remove the stack sacrificial layer 208, such as, for example, using vapor phased HCl dry etch. The stack sacrificial layer 208 may be removed selective to the substrate 202, the thin silicon layer 206, the channel layers 212, the sacrificial layers 210, the sacrificial gate 226 and the gate cap 228.

The BDI 234 may be formed where the stack sacrificial layer 208 was removed. The BDI 234 may be formed below a lowermost sacrificial layer 210 of the nanosheet stack and above the thin silicon layer 206. This is can be achieved by firstly conformally depositing a BDI dielectric liner followed by etching back the dielectric liner isotropically.

The dielectric spacer 232 may be formed on vertical side surfaces of the nanosheet stack, including vertical side surfaces of the channel layers 210 and vertical side surfaces of the sacrificial layers 212. The dielectric spacer 232 may be formed on vertical side surfaces of the sacrificial gate 2226 and the gate cap 228.

The BDI 234 and the dielectric spacer 232 may be formed by conformally depositing a dielectric material, followed by a combination of dry and wet anisotropic etch and recessing steps. The BDI 234 and the dielectric spacer 232 may be formed simultaneously or sequentially. The BDI 234 and the dielectric spacer 232 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the BDI 234 and the dielectric spacer 232 may each include one or more layers. The BDI 234 and the dielectric spacer 232 may each include any dielectric material such as silicon nitride (SiN), silicon boron carbon nitride (SiBCN), silicon oxide carbon nitride (SiOCN), aluminum oxide (AlOx), SiC and may include a single layer or may include multiple layers of dielectric material. The BDI 234 and the dielectric spacer 232 may each include the same material or different materials.

Figure 20:
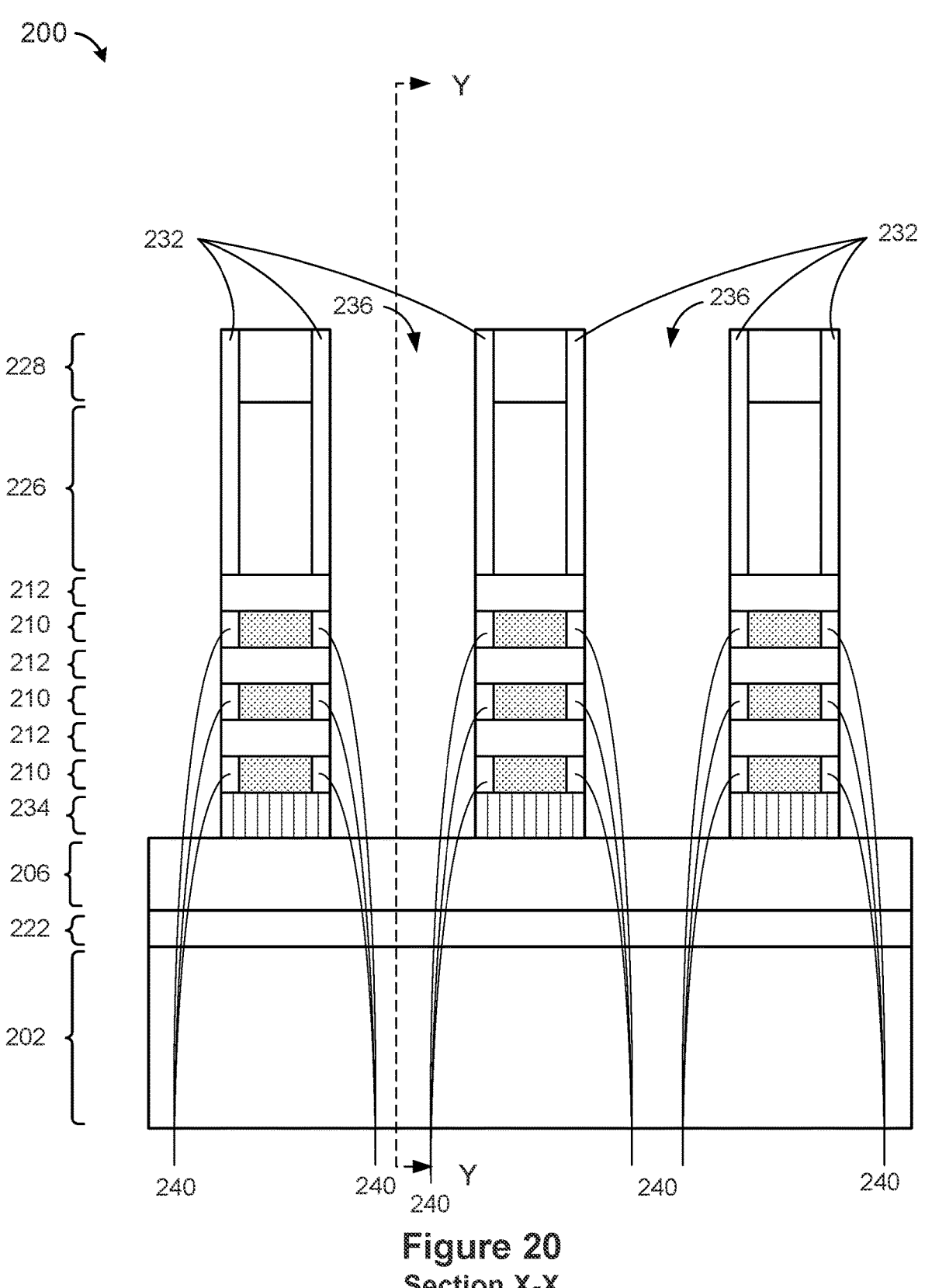
FIGS. 20 and 21 each illustrate a cross-sectional view of the semiconductor structure along section line X-X and Y-Y, respectively, and illustrate select removal of layers and inner spacer formation, according to an exemplary embodiment.
Figure 21:
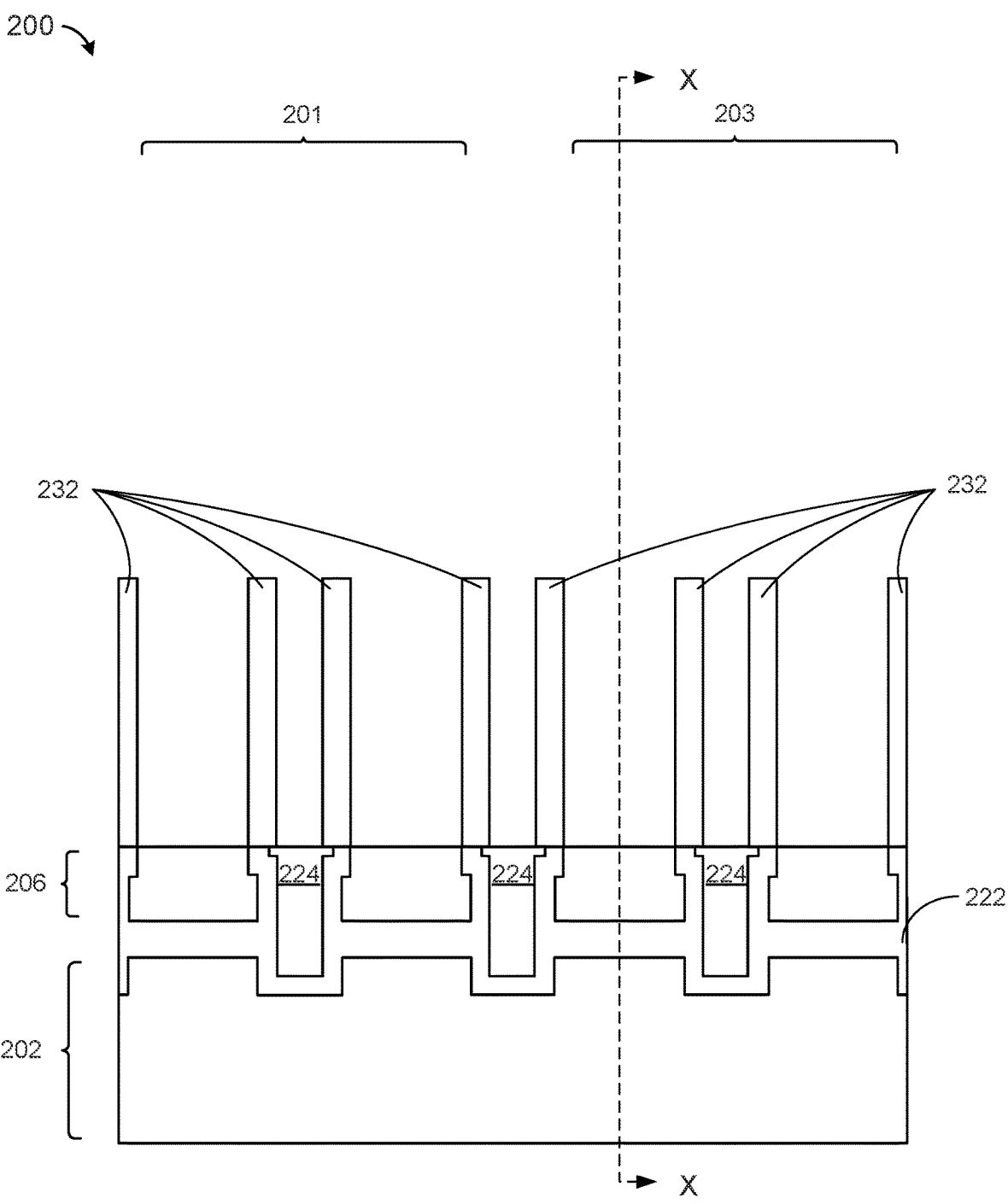

Referring now to FIGS. 20 and 21, the structure 200 is shown according to an exemplary embodiment. FIGS. 20 and 21 are each a cross-sectional view of the structure 200 along section lines X-X and Y-Y, respectively. FIGS. 20 and 21 are perpendicular to each other. A source/drain trench 236 may be formed. Inner spacers 240 may be formed.

The alternating layers of sacrificial layers 210, channel layers 212 and the BDI 234 may be formed into nanosheet stacks, by methods known in the art. The source/drain trench 236 may have a length perpendicular to section line X-X and parallel to section line Y-Y, and perpendicular to the fins. The source/drain trench 236 may be formed between each sacrificial gate 226 with surrounding dielectric spacers 232 by an anisotropic etching technique, such as, for example, reactive ion etching (RIE), and stopping on etching a portion of the thin silicon layer 206 between each nanosheet stack.

Each nanosheet stack may include a BDI 234, covered by a sacrificial layer 210, covered by a channel layer 212, covered by a sacrificial layer 210, covered by a channel layer 212, covered by a sacrificial layer 210, covered by a channel layer 212. Above the nanosheet stack is the sacrificial gate 226 and the gate cap 228, with the dielectric spacer 232 on opposite vertical sides. The nanosheet stack may be vertically aligned with the dielectric spacer 232 surrounding the sacrificial gate 226 and the gate cap 228.

As shown in FIG. 20, portions of the nanosheet stack may be removed between adjacent sacrificial gates 226, gate cap 228 and dielectric spacers 232. The dielectric spacer 232 may remain vertically where the nanosheet stack was removed along section line X-X.

Outer portions of the sacrificial layers 210 may be selectively removed using known techniques. For example, a wet or dry etch process can be used with the appropriate chemistry to remove portions of each of the sacrificial layers 210. The material used for the etching process may be selective such that the channel layers 212, the BDI 234, the dielectric spacer 232, the gate cap 228, the sacrificial gate 226, the thin silicon layer 206 and the substrate 202 remain and are not etched. After etching, portions of the sacrificial layers 210 covered on opposite sides by the sacrificial gate 226 may remain as part of the nanosheet stack.

The inner spacer 240 may be formed by conformally depositing or growing a dielectric material, followed by a combination of dry and wet isotropic etch and recessing steps. The inner spacer 240 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch process such as a wet etch process, or any suitable etch process. In an embodiment, the inner spacer 240 may include one or more layers. In an embodiment, the inner spacer 240 may include any dielectric material such as, silicon oxynitride, silicon nitride, SiBCN, SiOC, or any combination of these materials.

The inner spacer 240 may completely fill in spaces between the channel layers 212, where the portions of the sacrificial layers 210 had been previously removed.

A vertical side surface of the inner spacer 240 may be aligned with a vertical side surface of the channel layers 212 and a vertical side surface of the dielectric spacer 232 surrounding the sacrificial gate 226 and the gate cap 228.

Figure 22:
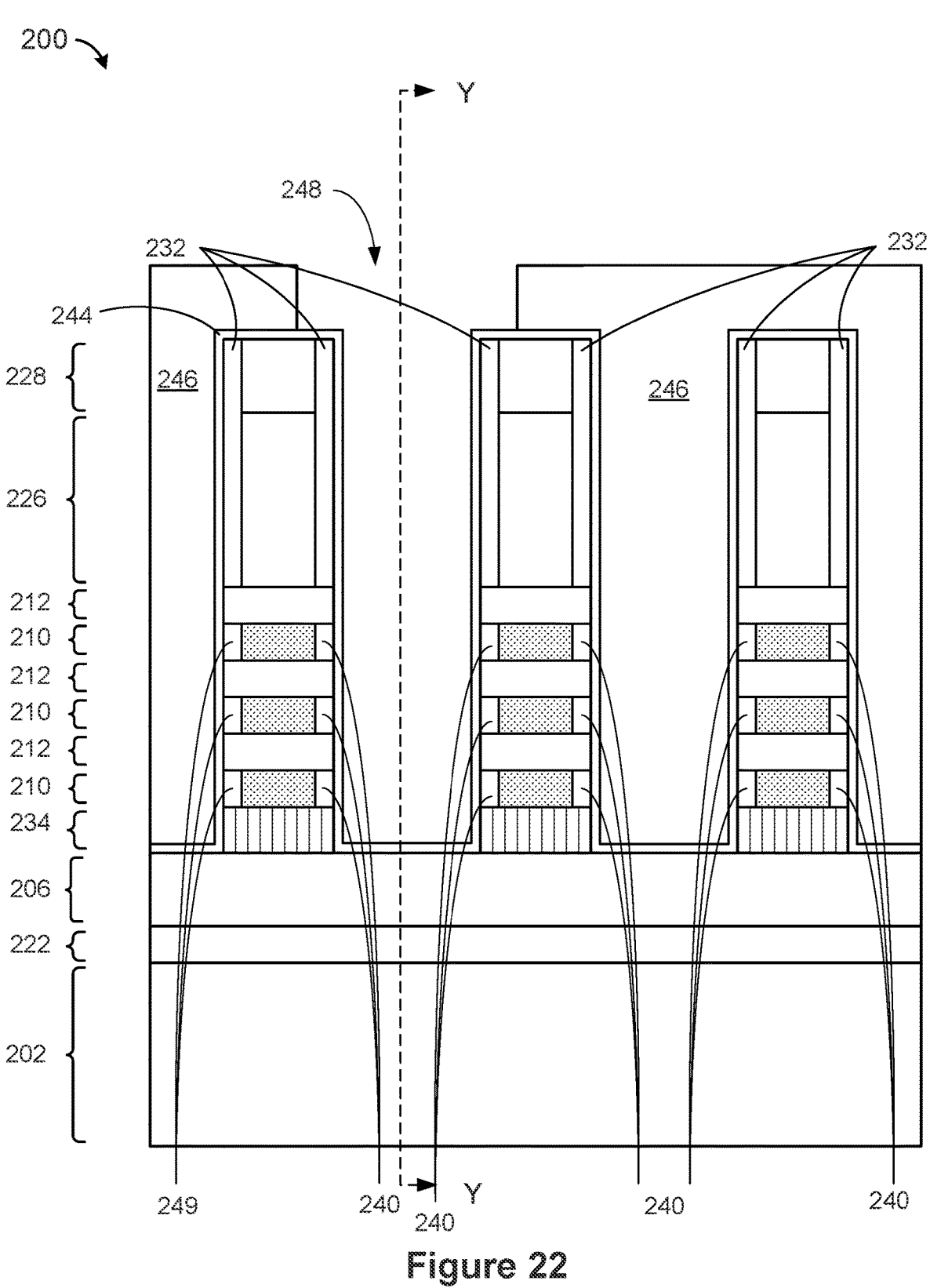
FIGS. 22 and 23 each illustrate a cross-sectional view of the semiconductor structure along section line X-X and Y-Y, respectively, and illustrate formation of an organic planarization layer, according to an exemplary embodiment.
Figure 23:
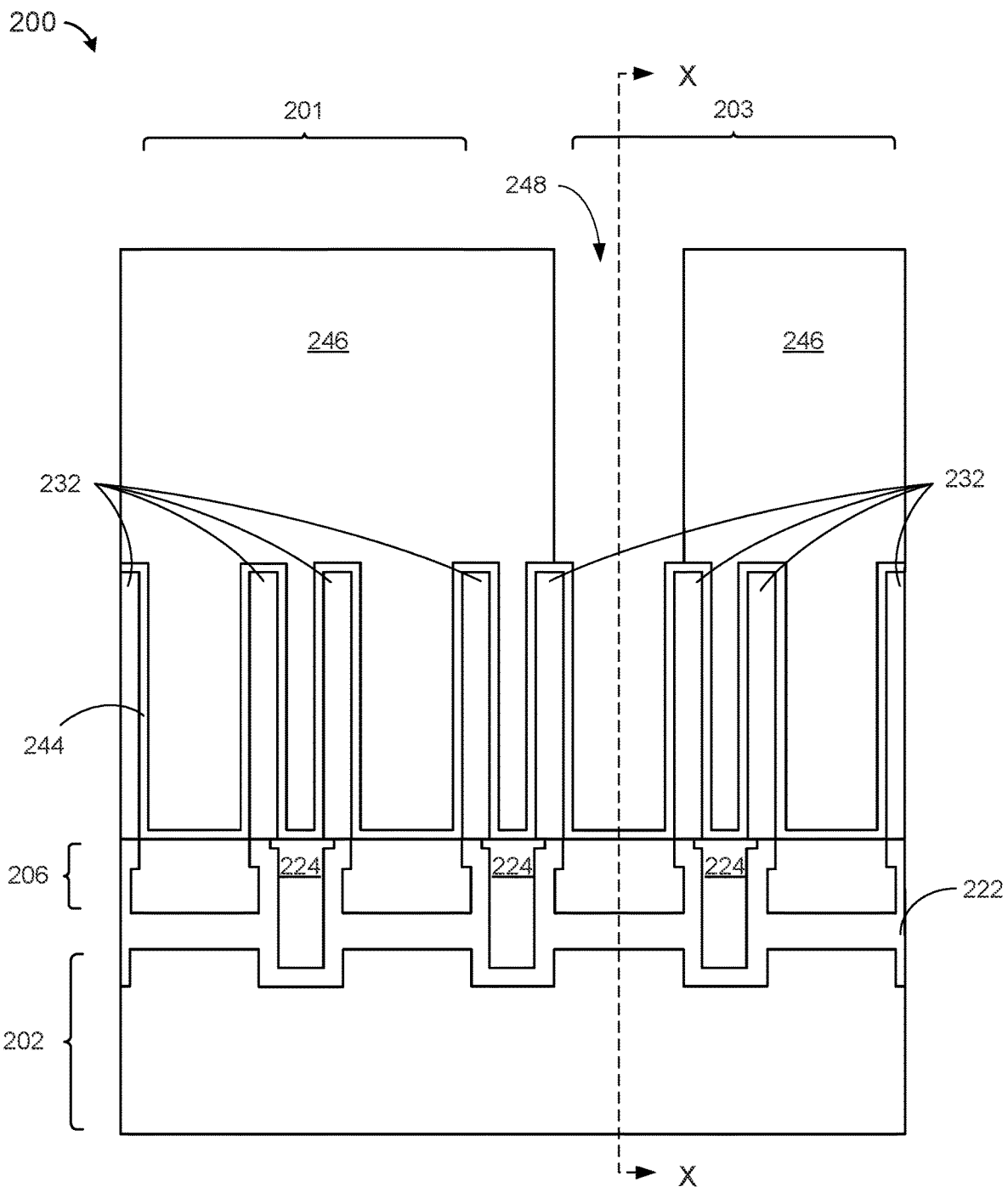

Referring now to FIGS. 22 and 23, the structure 200 is shown according to an exemplary embodiment. FIGS. 22 and 23 are each a cross-sectional view of the structure 200 along section lines X-X and Y-Y, respectively. FIGS. 22 and 23 are perpendicular to each other. A liner 244 may be formed. A lithography soft mask may be formed, such as an organic planarization layer 246 (hereinafter "OPL") which may be used for the patterning process. A backside contact trench 248 may be formed.

The liner 244 may be formed conformally on the structure 200. The liner 244 may cover upper horizontal surfaces of the gate cap 228 and of the dielectric spacer 232. The liner 244 may cover vertical side surfaces of the dielectric spacer 232, the channel layers 212, the sacrificial layers 210, the thin silicon layer 206, the silicon germanium layer 204, a vertical side surface and a portion of a lower horizontal surface of the stack sacrificial layer 206, and a vertical side surface and an upper horizontal surface of the silicon germanium layer 204. The liner 222 may be deposited using typical deposition techniques, for example, atomic layer deposition (ALD), molecular layer deposition (MLD), chemical vapor deposition (CVD), physical vapor deposition (PVD), and spin on techniques. In an embodiment, the liner 222, may include a material like SiO2, SiN, SiOC, SiC, etc. Ian embodiment, the liner 222, may have a thickness, about 3 nm to 20 nm, and ranges there between, although a thickness less than 3 nm and greater than 20 nm may be acceptable.

The OPL 246 may be formed by a blanket deposition using typical deposition techniques, for example spin-on coating. The OPL 246 can be a self-planarizing organic material that includes carbon, hydrogen, oxygen, and optionally nitrogen, fluorine, and silicon. The OPL 246 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A dry etch technique may be used to selectively remove a vertically aligned portion of the OPL 246 to form the backside contact trench 248. A wet etching or dry ashing technique may be used to selectively remove the OPL 246 selective to the substrate 202, the thin silicon layer 206, the sacrificial layers 210, the channel layers 212, the sacrificial gate 226, the gate cap 228, the BDI 234, the inner spacer 240 and the dielectric spacer 232. A lower surface and vertical side surfaces of the sacrificial backside contact placeholder 136 may be the dielectric spacer 232.

Figure 24:
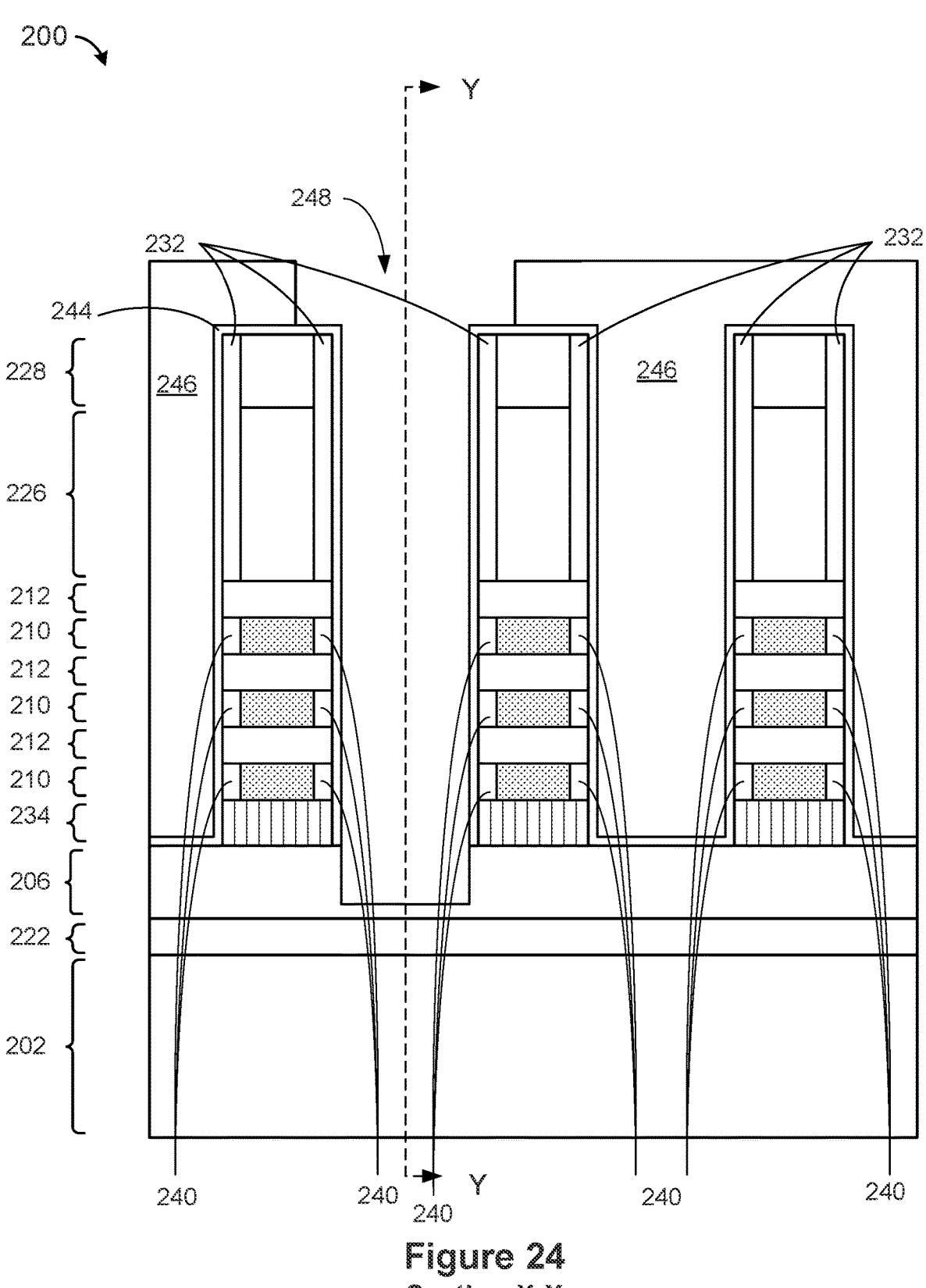
FIGS. 24 and 25 each illustrate a cross-sectional view of the semiconductor structure along section line X-X and Y-Y, respectively, and illustrate formation of a backside contact trench, according to an exemplary embodiment.
Figure 25:
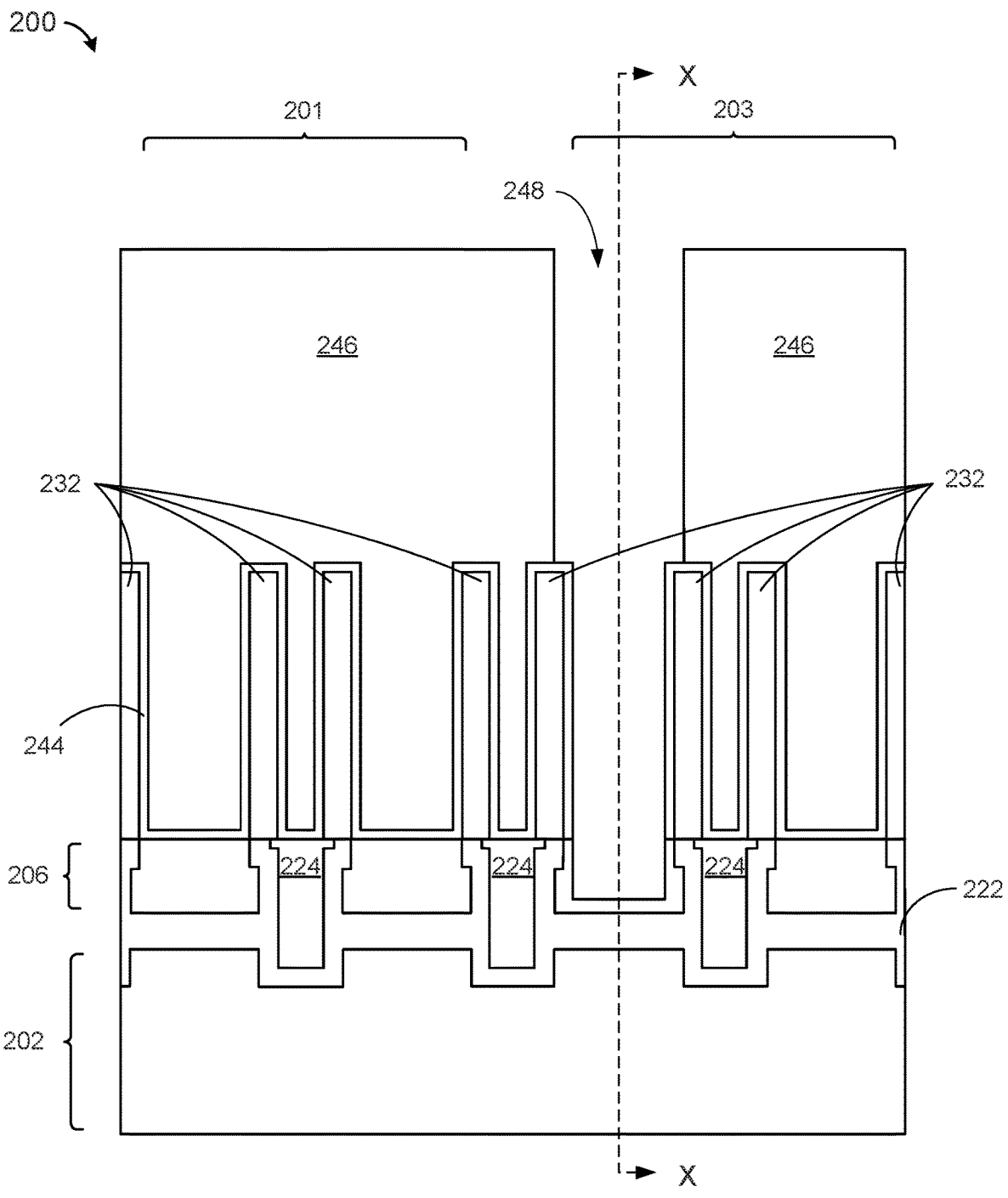

Referring now to FIGS. 24 and 25, the structure 200 is shown according to an exemplary embodiment. FIGS. 24 and 25 are each a cross-sectional view of the structure 200 along section lines X-X and Y-Y, respectively. FIGS. 24 and 25 are perpendicular to each other. The backside contact trench 248 may be increased.

The backside contact trench 248 may be formed between an adjacent pair of sacrificial gates 226, gate cap 228 and dielectric spacers 232 surrounding each sacrificial gate 226, above adjacent nanosheet stacks, as shown in the section line X-X of FIG. 24. The backside contact trench 248 may be formed between a pair of dielectric spacers 232 where a portion of a nanosheet stack was removed between adjacent sacrificial gates 226, as shown in the section line Y-Y of FIG. 67.

The backside contact trench 248 may be formed by an anisotropic etching technique, such as, for example, reactive ion etching (RIE), removing aligned portions of the liner 244, and stopping on etching a portion of the thin silicon layer 206.

The backside contact trench 248 can facilitate forming a self-aligned backside contact. The backside contact trench 248 may be formed in select areas of the structure 200 where a future bottom contact may be formed to a subsequently formed source drain. There may be one or more backside contact trenches 248 on the structure 100.

Figure 26:
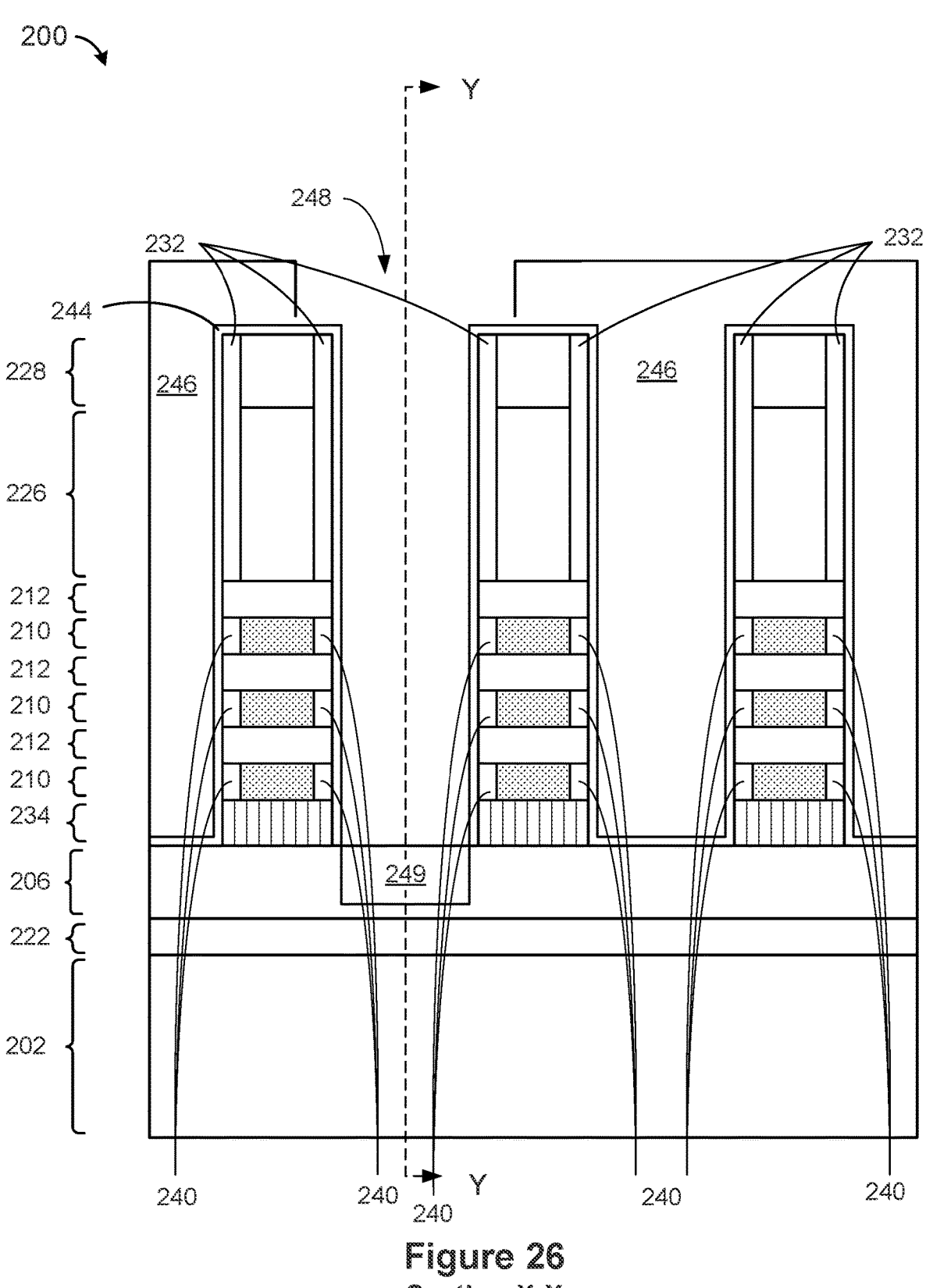
FIGS. 26 and 27 each illustrate a cross-sectional view of the semiconductor structure along section line X-X and Y-Y, respectively, and illustrate formation of a sacrificial silicon germanium epitaxy, according to an exemplary embodiment.
Figure 27:
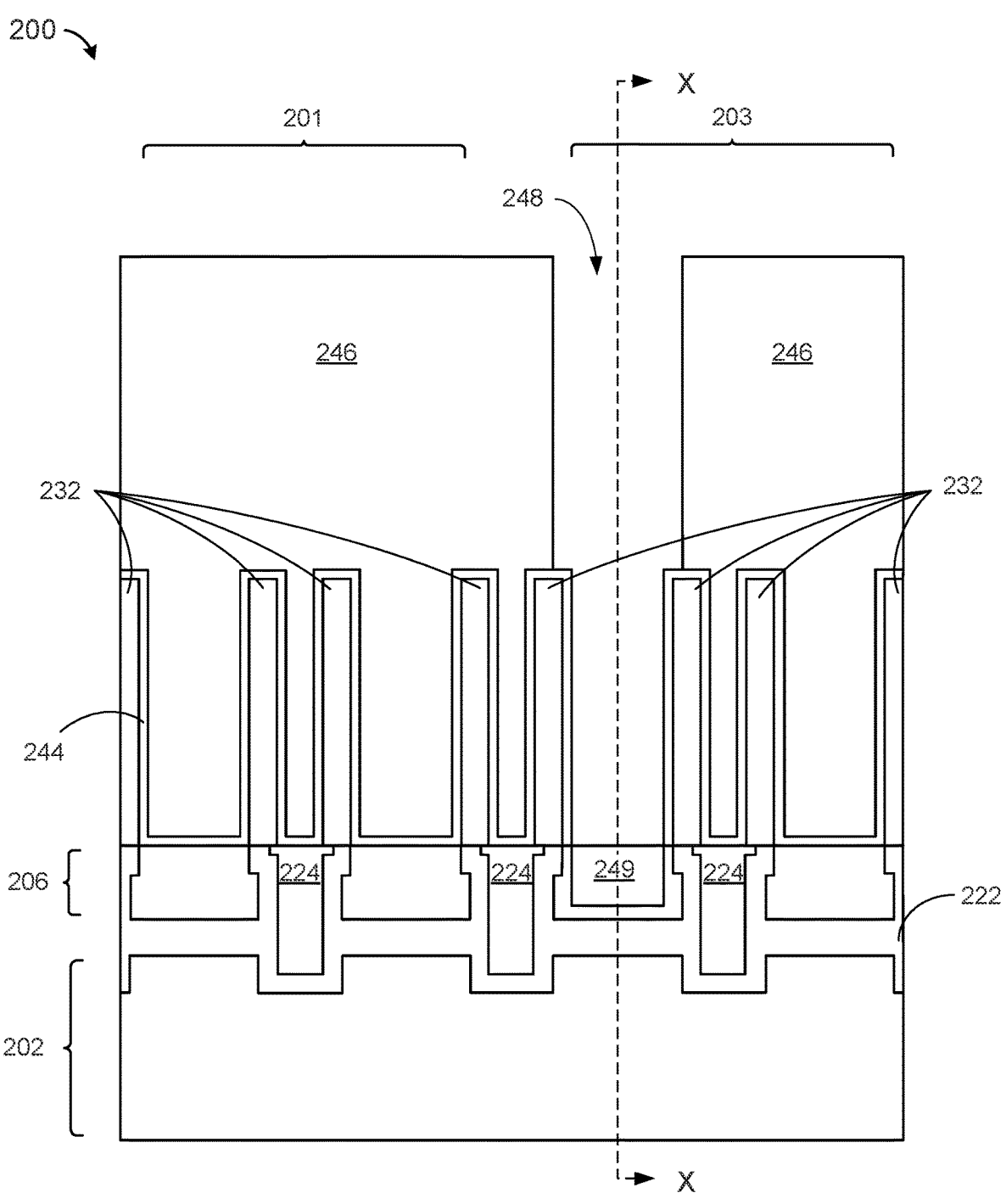

Referring now to FIGS. 26 and 27, the structure 200 is shown according to an exemplary embodiment. FIGS. 26 and 27 are each a cross-sectional view of the structure 200 along section lines X-X and Y-Y, respectively. FIGS. 26 and 27 are perpendicular to each other. A sacrificial layer, such as sacrificial silicon germanium epitaxy 249 may be formed in a portion of the backside contact trench 248.

The sacrificial silicon germanium epitaxy 249 may be formed in the backside contact trench 248, filling a portion of the backside contact trench 248. A lower surface of the sacrificial silicon germanium epitaxy 249 may be adjacent to an upper surface of the thin silicon layer 206. Vertical side surfaces of the sacrificial silicon germanium epitaxy 249 may be adjacent to vertical side surfaces of the thin silicon layer 206. A portion of the vertical side surfaces of the sacrificial silicon germanium epitaxy 249 may be adjacent to a portion of vertical side surfaces of the dielectric spacer 232 which surround the backside contact trench 248.

The sacrificial silicon germanium epitaxy 249 may be formed by epitaxial growth, . . . . In an embodiment, the sacrificial silicon germanium epitaxy 249 can be SiGe, III-V semiconductor, or other materials that can be formed by deposition and recess, such as AlOx, TiOx, SiC, etc.

Figure 28:
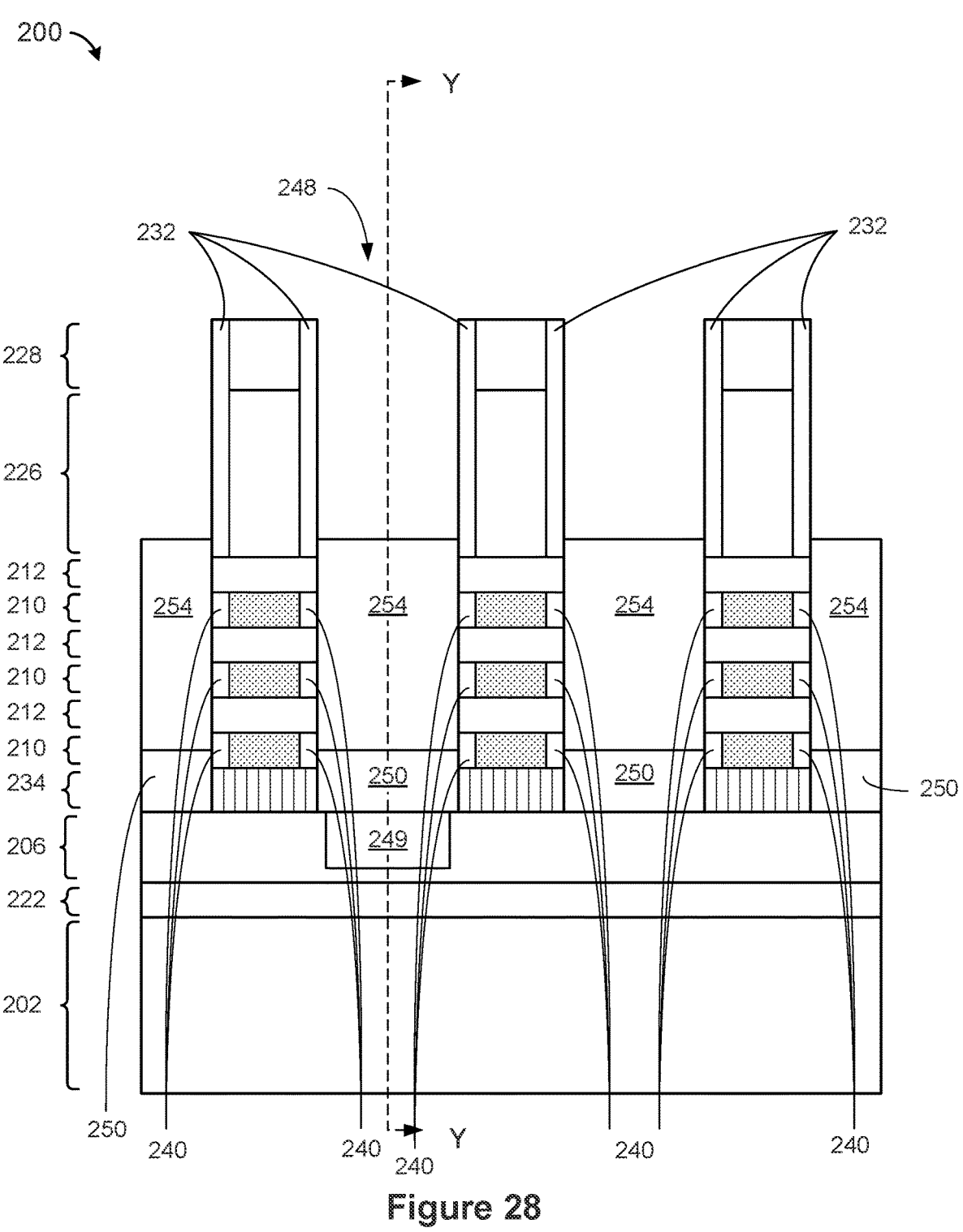
FIGS. 28 and 29 each illustrate a cross-sectional view of the semiconductor structure along section line X-X and Y-Y, respectively, and illustrate formation of an undoped silicon buffer epitaxy and a source/drain, according to an exemplary embodiment.
Figure 29:
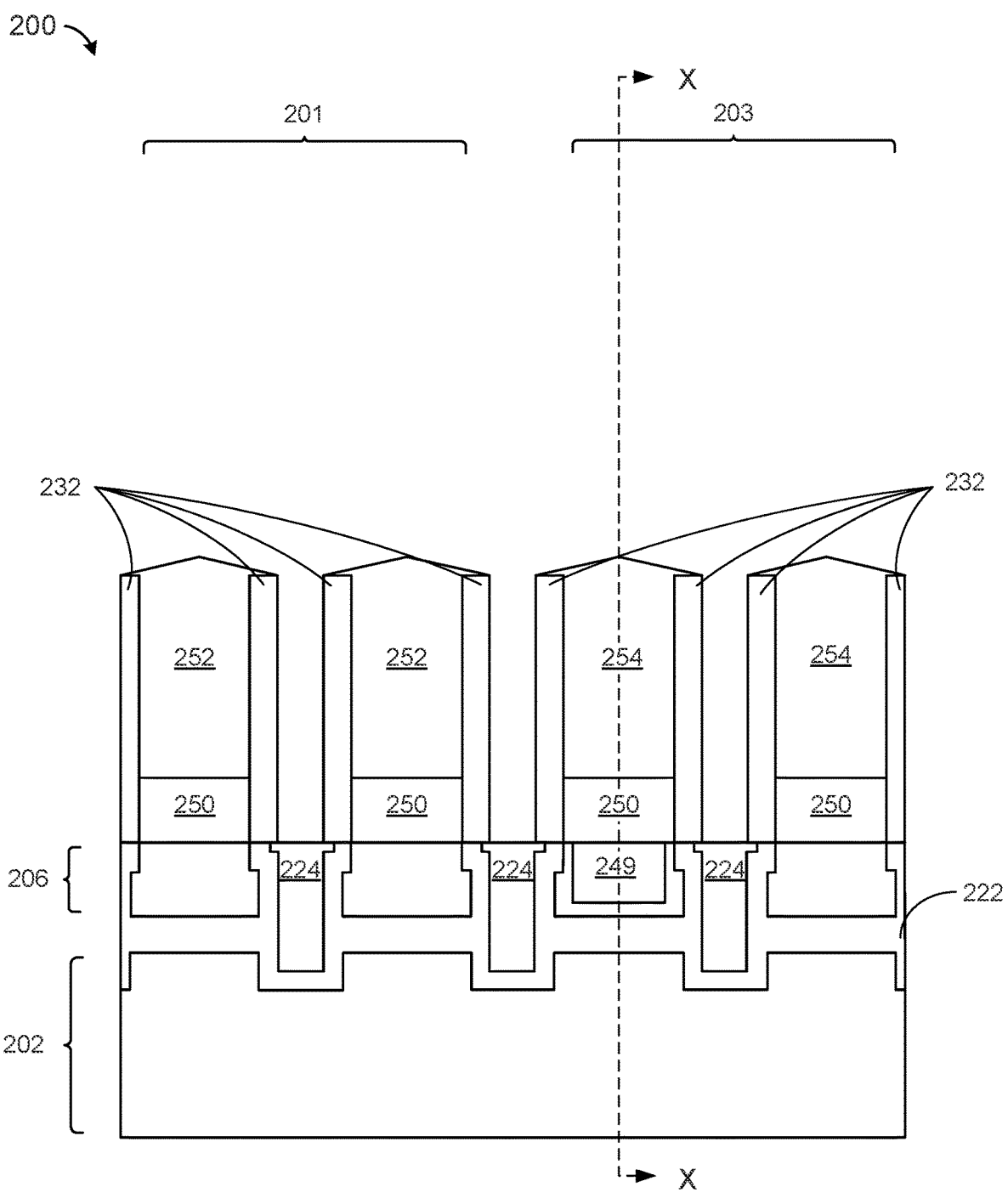

Referring now to FIGS. 28 and 29, the structure 200 is shown according to an exemplary embodiment. FIGS. 28 and 29 are each a cross-sectional view of the structure 100 along section lines X-X and Y-Y, respectively. FIGS. 28 and 29 are perpendicular to each other. The OPL 246 and the liner 244 may be removed. An undoped silicon buffer epitaxy 250 may be formed. A p-FET source drain epitaxy 252 may be formed. An n-FET source drain epitaxy 254 may be formed.

A wet etching or dry ashing technique may be used to selectively remove the OPL 246 and the liner 244 selective to the substrate 202, the thin silicon layer 206, the STI liner 222, the STI 224, the dielectric spacer 232, the channel layers 212, the sacrificial layers 210, the inner spacers 240, the BDI 234 and the sacrificial silicon germanium epitaxy 249.

The undoped silicon buffer epitaxy 250 may be epitaxially grown surrounding a vertical portion of the nanosheet stack on opposite sides of the sacrificial gate 226, filling a portion of the backside contact trench 248. A lower surface of the undoped silicon buffer epitaxy 250 may be adjacent to an upper surface of the thin silicon layer 206. A lower surface of the undoped silicon buffer epitaxy 250 may be adjacent to an upper surface of sacrificial silicon germanium epitaxy 249. A vertical side surface of the undoped silicon buffer epitaxy 250 may be adjacent to vertical side surfaces of the inner spacer 240, vertical side surfaces of the BDI 234 and vertical side surfaces of the channel layers 212. The undoped silicon buffer epitaxy 250 may be undoped. An upper surface of the undoped silicon buffer epitaxy 250 may be a greater distance from an upper surface of the thin silicon layer 206 than an upper surface of the BDI 234.

The n-FET source drain epitaxy 254 may be epitaxially grown surrounding a vertical portion of the nanosheet stack on opposite sides of the sacrificial gate 226, filling a portion of the opening 248 in the region 203. A lower surface of the n-FET source drain epitaxy 254 may be adjacent to an upper surface of the undoped silicon buffer epitaxy 250. A vertical side surface of the n-FET source drain epitaxy 254 may be adjacent to vertical side surfaces of the inner spacer 240, vertical side surfaces of the BDI 234 and vertical side surfaces of the channel layers 212. An upper surface of the n-FET source drain epitaxy 254 may be a greater distance from the thin silicon layer 206 than an upper surface of the uppermost channel layer 212.

The p-FET source drain epitaxy 252 may be epitaxially grown surrounding a vertical portion of the nanosheet stack on opposite sides of the sacrificial gate 226, filling a portion of the opening 248 in the region 201. A lower surface of the p-FET source drain epitaxy 252 may be adjacent to an upper surface of the undoped silicon buffer epitaxy 250. A vertical side surface of the p-FET source drain epitaxy 252 may be adjacent to vertical side surfaces of the inner spacer 240, vertical side surfaces of the BDI 234 and vertical side surfaces of the channel layers 212. An upper surface of the p-FET source drain epitaxy 252 may be a greater distance from the thin silicon layer 206 than the upper surface of the uppermost channel layer 212.

An advantage of forming the undoped silicon buffer epitaxy 250 below both the p-FET source drain epitaxy 252 and the n-FET source drain epitaxy 254 is to enable the selective removal of the sacrificial silicon germanium epitaxy 249 from a backside of the wafer in a later stage of fabrication, without damaging the p-FET source drain epitaxy 252 nor the n-FET source drain epitaxy 254, especially the p-FET source drain epitaxy 252, which may include similar silicon germanium.

Figure 30:
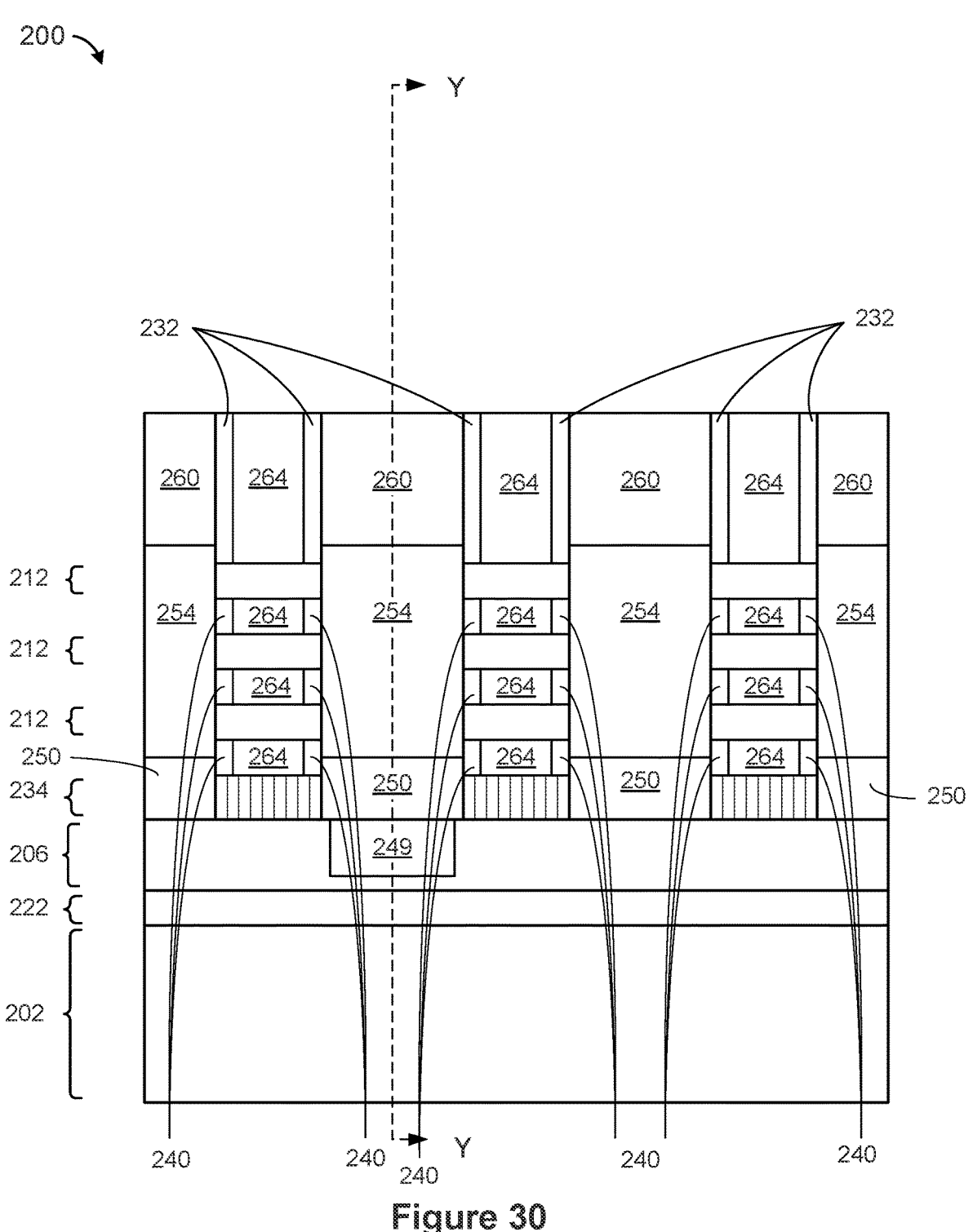
FIGS. 30 and 31 each illustrate a cross-sectional view of the semiconductor structure along section line X-X and Y-Y, respectively, and illustrate formation of an inter-layer dielectric, removal of the sacrificial gate and formation of a metal gate, according to an exemplary embodiment.
Figure 31:
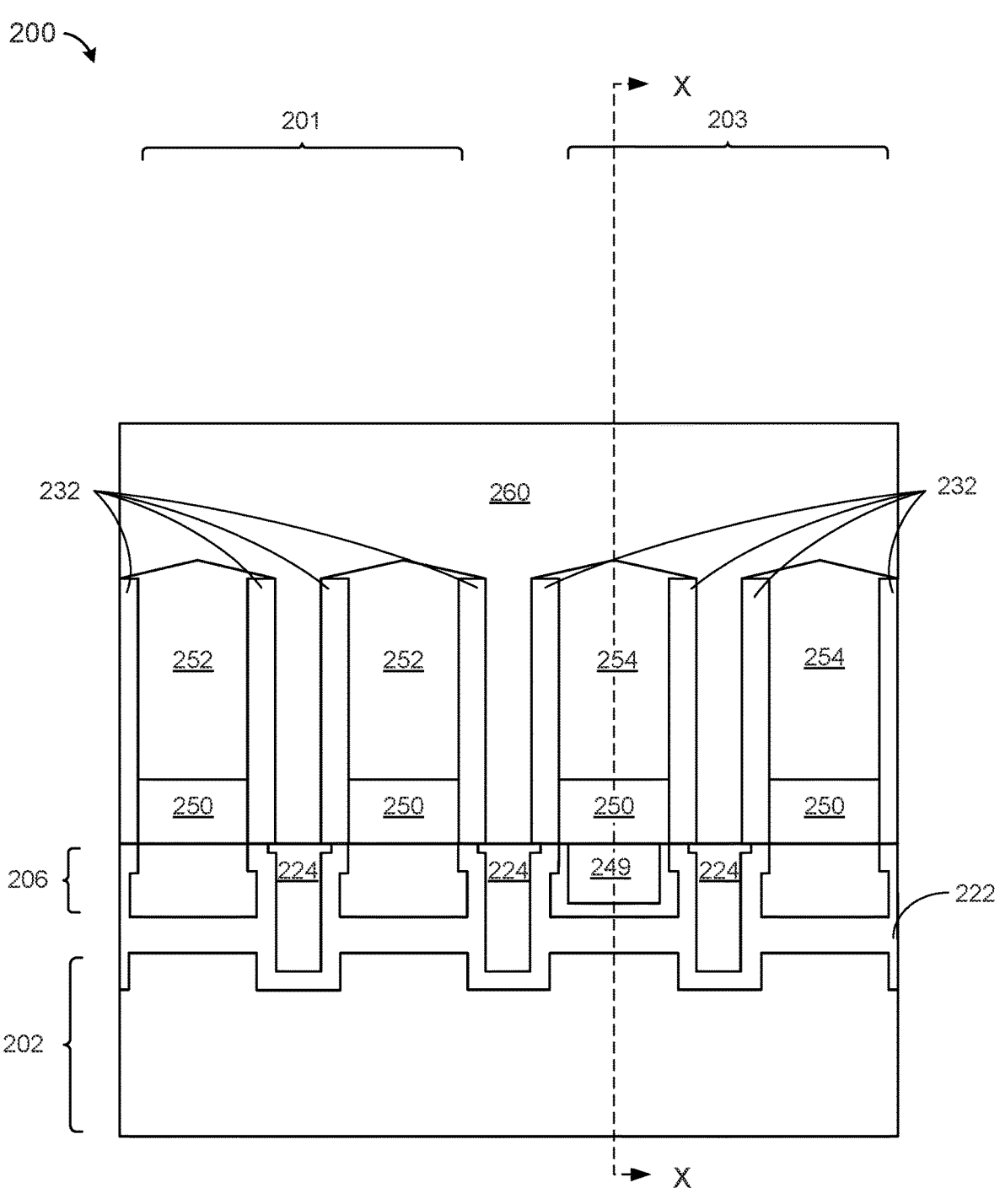

Referring now to FIGS. 30 and 31, the structure 200 is shown according to an exemplary embodiment. FIGS. 30 and 31 are each a cross-sectional view of the structure 100 along section lines X-X and Y-Y, respectively. FIGS. 30 and 31 are perpendicular to each other. An inter-layer dielectric (hereinafter "ILD") 260 may be formed. The gate cap 228 and the sacrificial gate 226 may be removed. The sacrificial layers 210 may be removed. A high-k metal gate 264 may be formed.

The ILD 260 may be formed by conformally depositing or growing a dielectric material. The ILD 260 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 260 may include one or more layers. In an embodiment, the ILD 260 may include any dielectric material such as silicon oxide, silicon oxynitride, silicon nitride, SiBCN, SiOC, low-k dielectric or any combination of these materials. A lower surface of the ILD 260 may be adjacent to an upper surface of the p-FET source drain epitaxy 252 and an upper surface of the n-FET source drain epitaxy 254. An additional lower surface of the ILD 260 may be adjacent to an upper surface of the STI 224. A vertical side surface of the ILD 260 may be adjacent to a vertical side surface of the dielectric spacer 232.

A chemical mechanical polishing (CMP) technique may be used to remove excess material and polish upper surfaces of the structure 200, removing the gate cap 228 and exposing an upper horizontal surface of the sacrificial gate 226. An upper surface of the structure 200 may also include an upper horizontal surface of the ILD 260 and an upper horizontal surface of the dielectric spacer 232.

The sacrificial gate 226 may be removed by methods known in the arts. The sacrificial layers 210 are removed selective to the channel layers 212, the inner spacers 240, the ILD 260, the dielectric spacer 232, the BDI 234, the sacrificial backside contact placeholder 249, the thin silicon layer 206, the silicon germanium layer 204 and the substrate 202. For example, a dry etch process can be used to selectively remove the sacrificial layers 210, such as using vapor phased HCl dry etch. An upper surface and a lower surface of the channel layers 212 may be exposed. An upper surface of the BDI 234 may be exposed.

The high-k metal gate 264 may be conformally formed on the structure 200, according to an exemplary embodiment. The high-k metal gate 264 is formed in each cavity of the nanosheet stack and surrounding suspended portions of the channel layers 212. The high-k metal gate 264 forms a layer surrounding exposed portions of the nanosheet stacks. The high-k metal gate 264 may cover exposed vertical side surfaces of one side of the side spacers 240, an exposed vertical surface of one side of the dielectric spacer 232 and the exposed upper horizontal surfaces of the BDI 234. The high-k metal gate 264 may cover vertical side surfaces, an upper horizontal surface and a lower horizontal surface of the channel layers 210. The high-k metal gate 264 may fill a space between the dielectric spacer 232 above the nanosheet stack, where the sacrificial gate 226 was removed.

The high-k metal gate 264 may be deposited using typical deposition techniques, for example, atomic layer deposition (ALD), molecular layer deposition (MLD), and chemical vapor deposition (CVD). In an embodiment, the high-k metal gate 264 may include more than one layer, for example, a conformal layer of a high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. In an embodiment, a work function metal of p-FET devices in the region 201 may include a metal nitride, for example, titanium nitride or tantalum nitride, titanium carbide titanium aluminum carbide, or other suitable materials known in the art. In an embodiment, the work function metal of n-FET devices in the region 203 may include, for example, titanium aluminum carbide or other suitable materials known in the art. In an embodiment, the work function metal may include one or more layers to achieve desired device characteristics.

A chemical mechanical polishing (CMP) technique may be used to remove excess material and polish upper surfaces of the structure 200. An upper surface of the structure 200 may include an upper horizontal surface of the ILD 260, an upper horizontal surface of the dielectric spacer 232 and an upper horizontal surface of the high-k metal gate 264.

Figure 32:
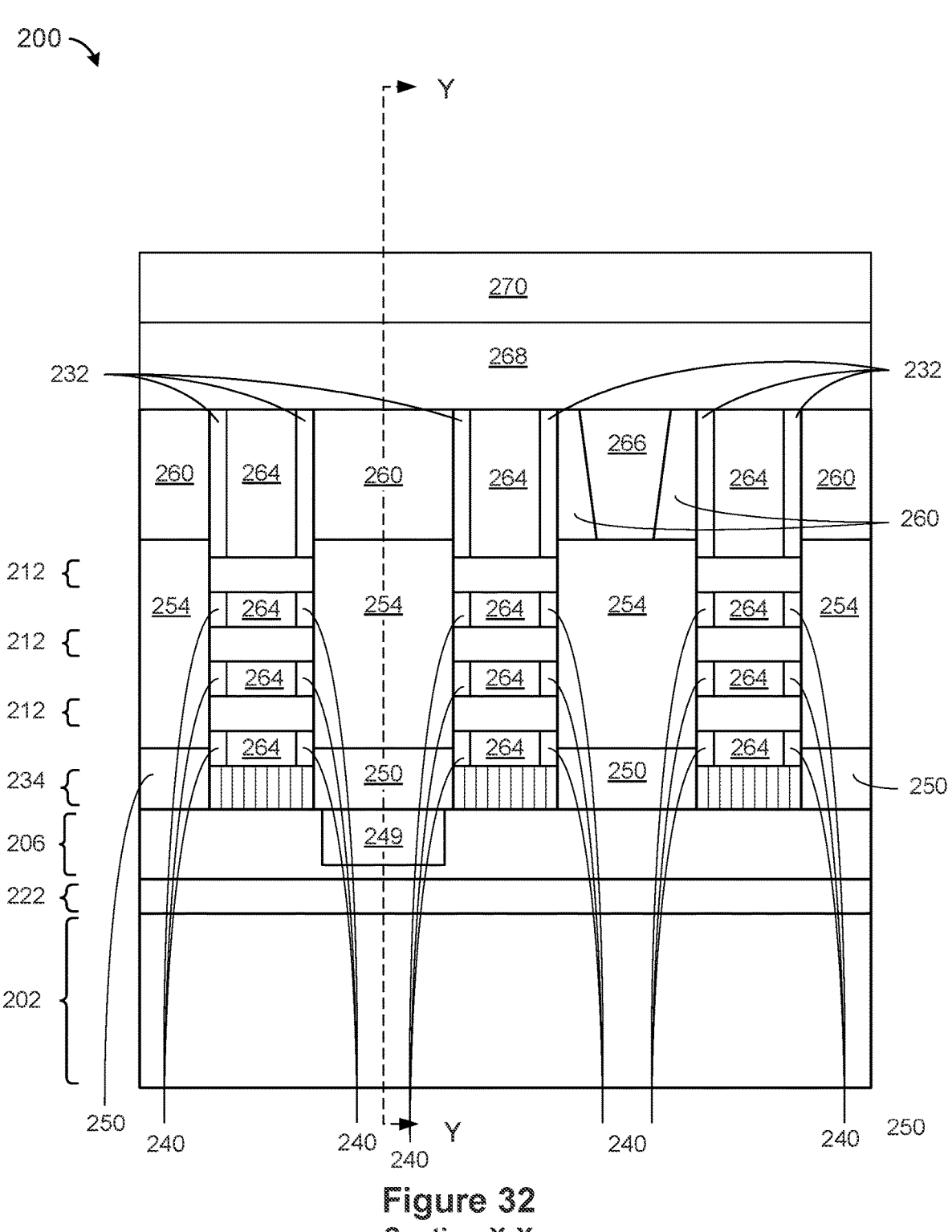
FIGS. 32 and 33 each illustrate a cross-sectional view of the semiconductor structure along section line X-X and Y-Y, respectively, and illustrate formation of a contact, formation of back end of line layers and bonding of a carrier wafer to the semiconductor structure, according to an exemplary embodiment.
Figure 33:
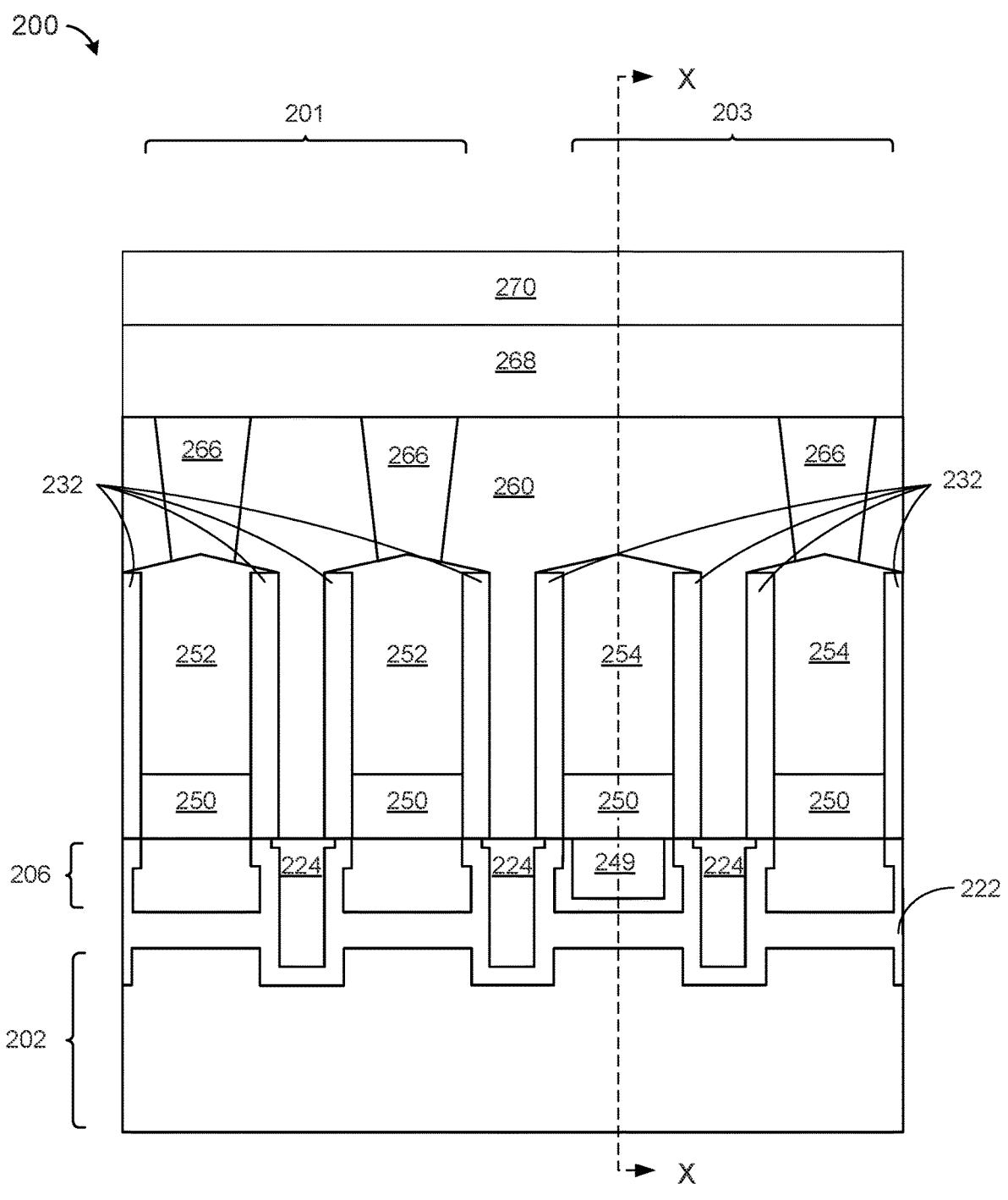

Referring now to FIGS. 32 and 33, the structure 200 is shown according to an exemplary embodiment. FIGS. 32 and 33 are each a cross-sectional view of the structure 100 along section lines X-X and Y-Y, respectively. FIGS. 32 and 33 are perpendicular to each other. An upper contact 266 may be formed. Back end of line (hereinafter "BEOL") layers 268 (hereinafter "BEOL") may be formed. A carrier wafer 270 may be bonded to the structure 200.

An opening (not shown) may be made in the structure 200 through the ILD 260 exposing an upper horizontal surface of either the p-FET source drain epitaxy 252 or the n-FET source drain epitaxy 254. The upper contact 266 may be formed in the opening (not shown) to form a contact to either the p-FET source drain epitaxy 252 or the n-FET source drain epitaxy 254. As shown in FIG. 76, there are 3 upper contacts 266. There may be any number of upper contacts 266 on the structure 200.

The upper contacts 266 may be made to either the p-FET source drain epitaxy 252 or the n-FET source drain epitaxy 254 which does not have a sacrificial backside contact placeholder 249 below either the p-FET source drain epitaxy 252 or the n-FET source drain epitaxy 254. A p-FET source drain epitaxy 252 or a n-FET source drain epitaxy 254 which has a sacrificial backside contact placeholder 249 may have a bottom contact as formed in later processing steps. Each of the p-FET source drains 252 or the n-FET source drains 254 may have either an upper contact 266 or a bottom contact.

A chemical mechanical polishing (CMP) technique may be used to remove excess material and polish upper surfaces of the structure 200, exposing an upper horizontal surface of the ILD 260 and an upper horizontal surface of the upper contact 266.

The BEOL layers 268 may be include layers of wiring and vias formed above the existing structure, above the upper contact 266 and the ILD 260. In an embodiment, the BEOL layers 268 may include 12 or more layers of metal lines and visas. The BEOL layers 268 may be formed using known techniques.

The carrier wafer 270 may be attached to an upper surface of the structure 200, mounted on an upper surface of the BEOL layers 268. The carrier wafer may be attached using conventional wafer bonding process, such as dielectric-to-dielectric bonding or copper-to-copper bonding process.

Figure 34:
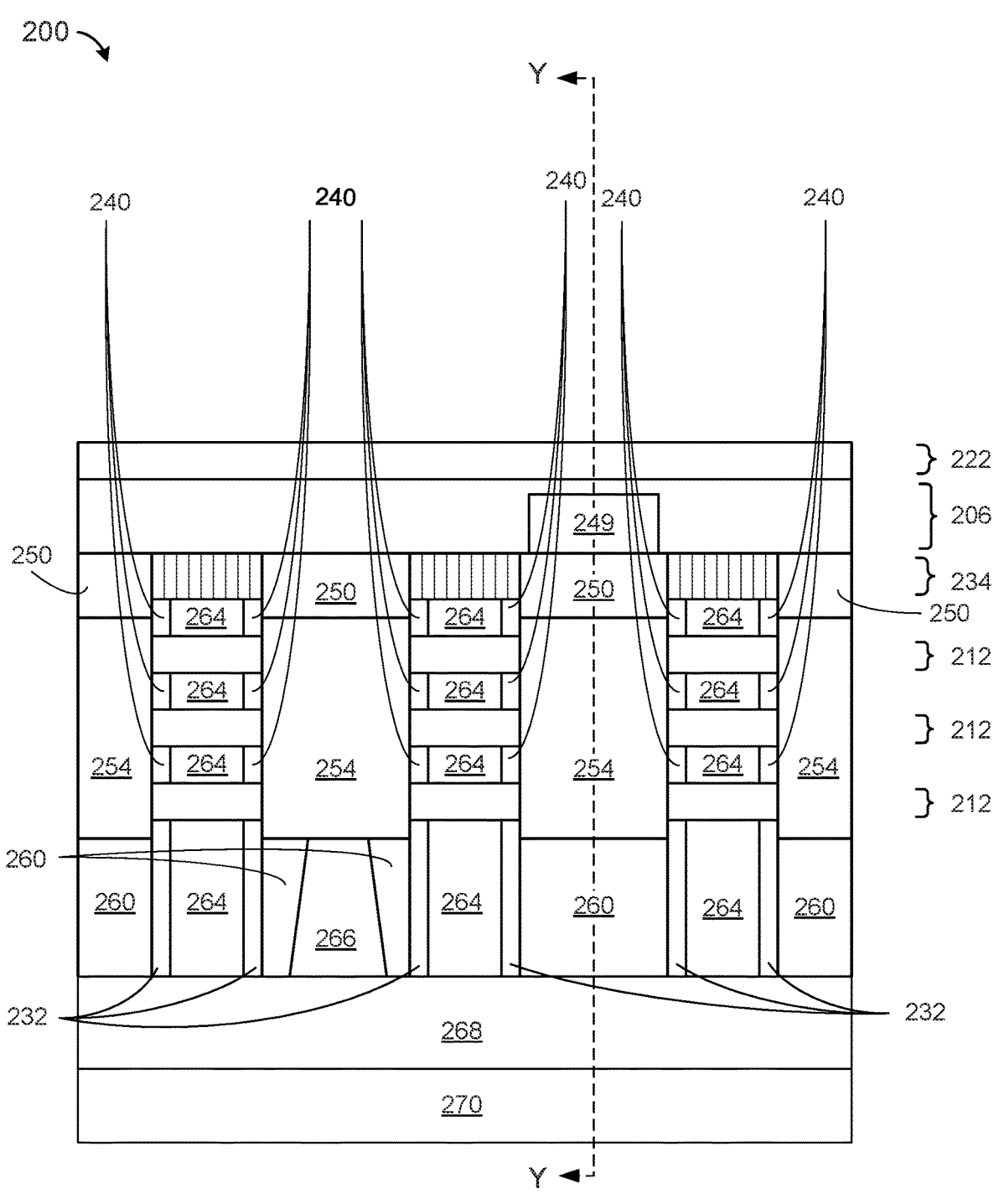
FIGS. 34 and 35 each illustrate a cross-sectional view of the semiconductor structure along section line X-X and Y-Y, respectively, and illustrate flipping the semiconductor structure over and removal of a portion of a substrate of the semiconductor structure, according to an exemplary embodiment.
Figure 35:
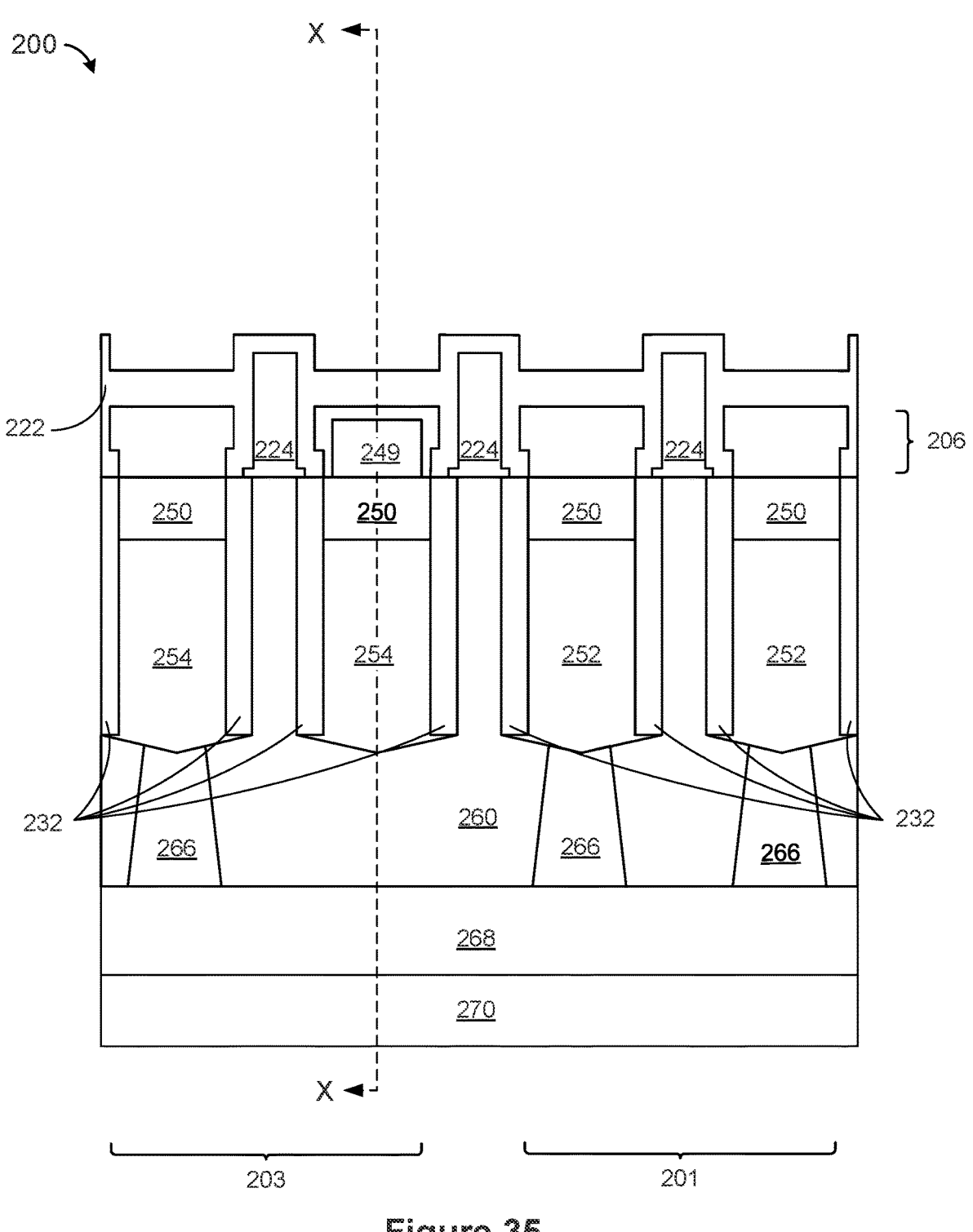

Referring now to FIGS. 34 and 35, the structure 200 is shown according to an exemplary embodiment. FIGS. 34 and 35 are each a cross-sectional view of the structure 200 along section lines X-X and Y-Y, respectively. FIGS. 34 and 35 are perpendicular to each other. The structure 200 may be flipped and the substrate 202 may be removed.

The structure 200 may be turned such that the carrier wafer 270 is now at shown at the bottom of FIGS. 34 and 35, at a lowest point of the structure, and a (now) lower surface of the substrate 202 is shown at a upper level of the structure for further processing.

The substrate 202 may be selectively removed using a combination of processes steps, such as wafer grinding, CMP, RIE and wet etch process. The final stage of the process may include selectively etching any remaining silicon of the substrate 202 to expose a surface of the STI liner 222. The continuous STI liner 222 protects the thin silicon layer 206 from being damaged during the substrate 202 removal process.

Figure 36:
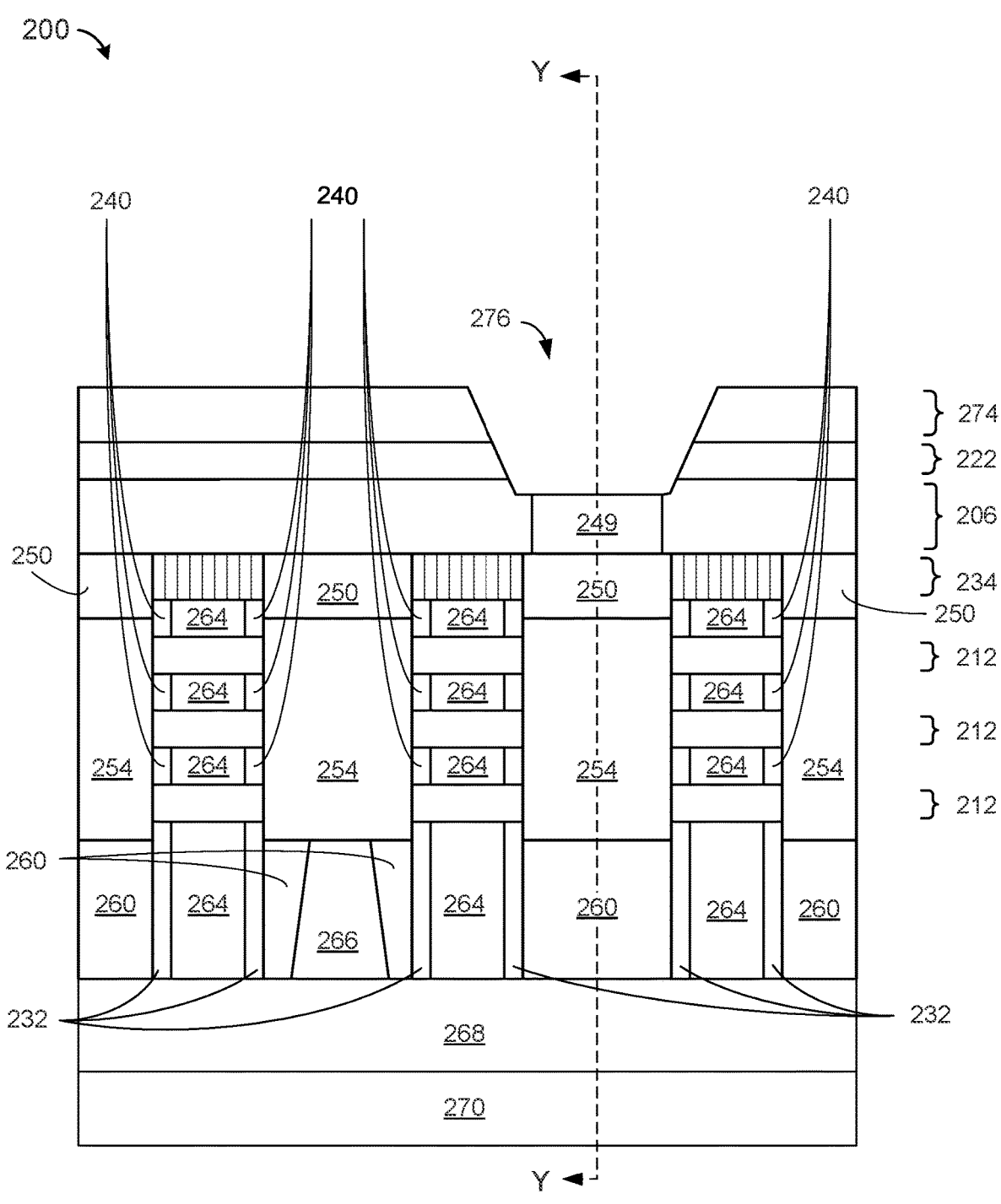
FIGS. 36 and 37 each illustrate a cross-sectional view of the semiconductor structure along section line X-X and Y-Y, respectively, and illustrate formation of an opening, according to an exemplary embodiment.
Figure 37:
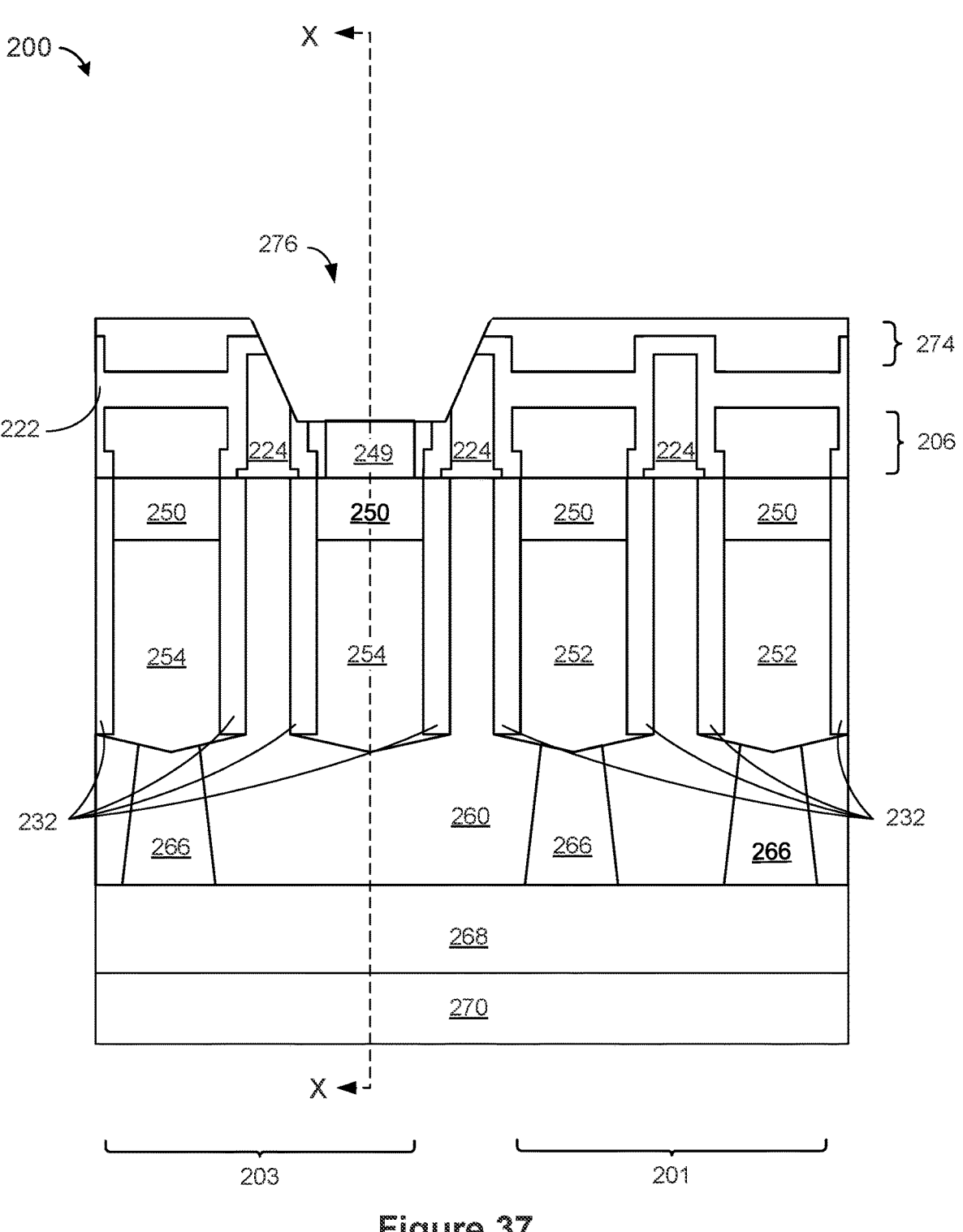

Referring now to FIGS. 36 and 37, the structure 200 is shown according to an exemplary embodiment. FIGS. 36 and 37 are each a cross-sectional view of the structure 200 along section lines X-X and Y-Y, respectively. FIGS. 36 and 37 are perpendicular to each other. An inter-layer dielectric (hereinafter "ILD") 274 may be formed. An opening 276 may be formed.

The ILD 274 may be formed as described for the ILD 260. A lower surface of the ILD 274 may be adjacent to an upper surface of the STI liner 222. A vertical side surface of the ILD 260 may be adjacent to a vertical side surface of the STI liner 222. A chemical mechanical polishing (CMP) technique may be used to remove excess material and polish upper surfaces of the structure 200.

The opening 276 may be formed using known techniques, such as, for example, a conventional lithography process followed by an anisotropic etching technique, such as, for example, reactive ion etching (RIE). The opening 276 may be formed by removing aligned portions of the ILD 274, portions of the STI liner 222, portions of the STI 224, and portions of the thin silicon layer 206.

The opening 276 may expose a (now) upper surface of the sacrificial silicon germanium epitaxy 249. The sacrificial silicon germanium epitaxy 249 may be referred to as a sacrificial backside contact placeholder. There may be more than one sacrificial backside contact placeholder. Each of the sacrificial backside contact placeholders may be adjacent to an undoped silicon buffer epitaxy 250 which is adjacent to either a p-FET source drain epitaxy 252 or an n-FET source drain epitaxy 254 which does not have an upper contact 266.

Formation of a backside contact may have a greater overlay error than formation of an upper contact. To compensate for the greater overlay error for alignment and exposure of the sacrificial backside contact placeholder, a relatively larger opening must be made, compared to an opening for an upper contact.

Figure 38:
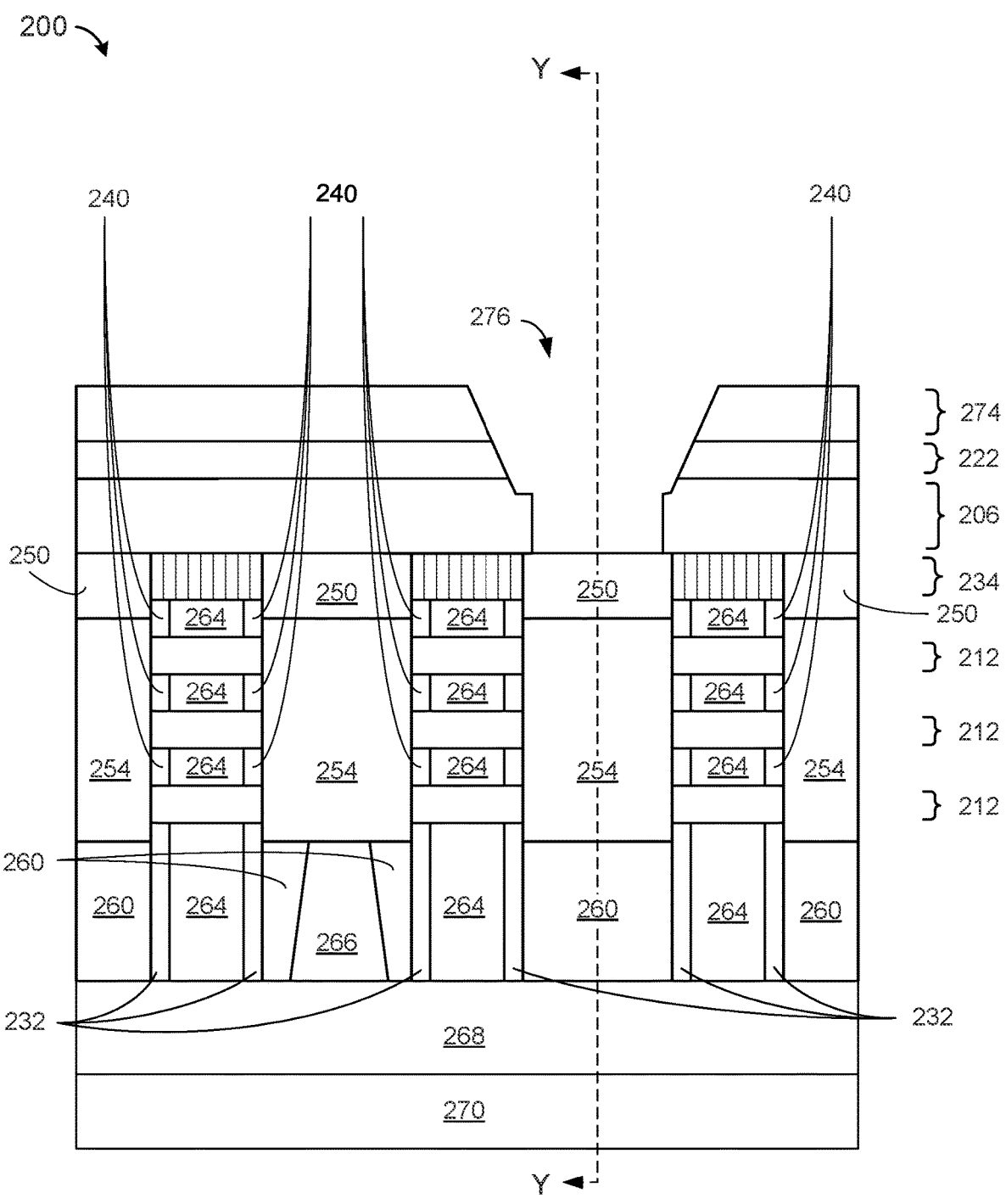
FIGS. 38 and 39 each illustrate a cross-sectional view of the semiconductor structure along section line X-X and Y-Y, respectively, and illustrate removal of the sacrificial silicon germanium epitaxy, according to an exemplary embodiment.
Figure 39:
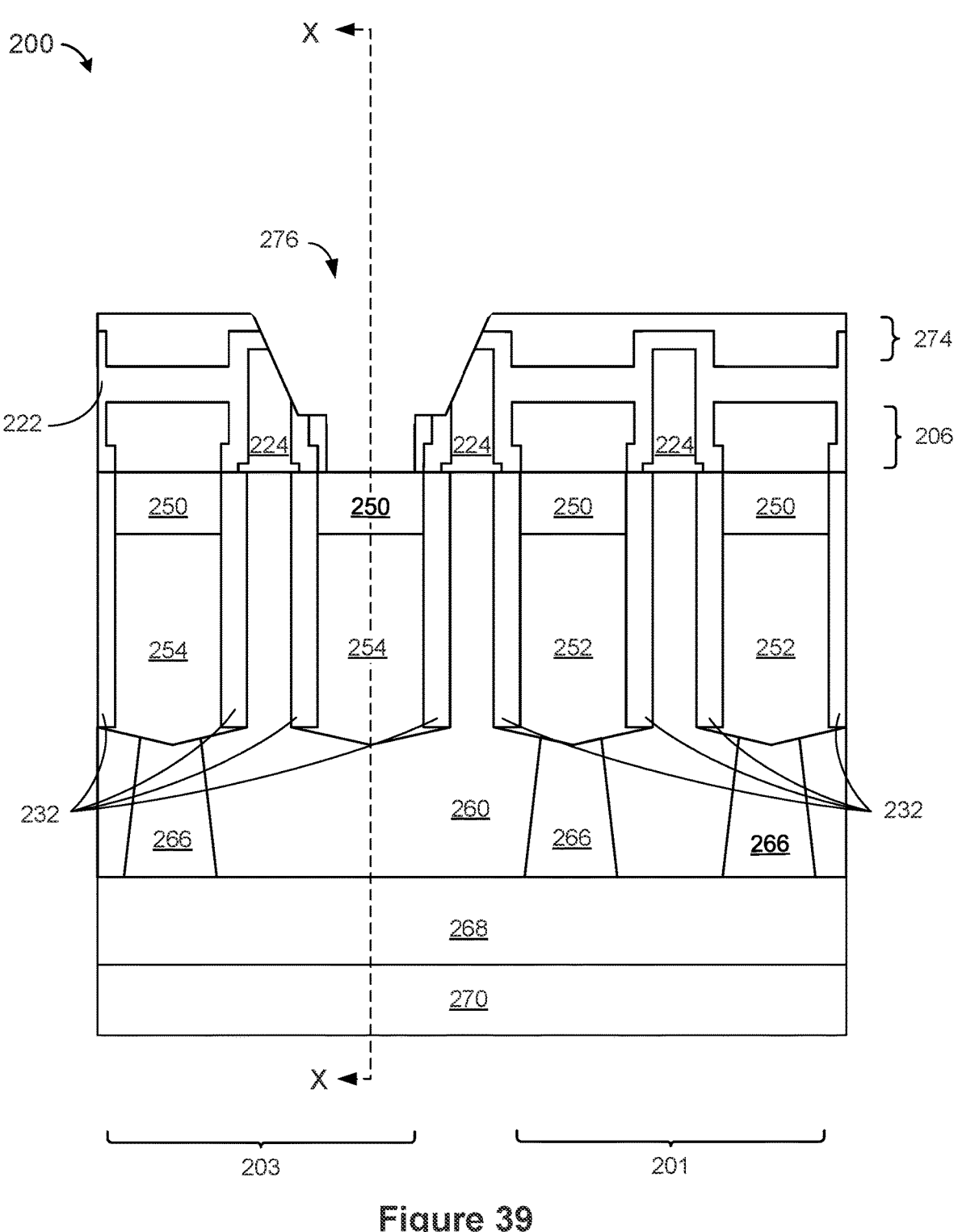

Referring now to FIGS. 38 and 39, the structure 200 is shown according to an exemplary embodiment. FIGS. 38 and 39 are each a cross-sectional view of the structure 200 along section lines X-X and Y-Y, respectively. FIGS. 38 and 39 are perpendicular to each other. The sacrificial silicon germanium epitaxy 249 may be selectively removed, increasing the opening 276.

Figure 40:
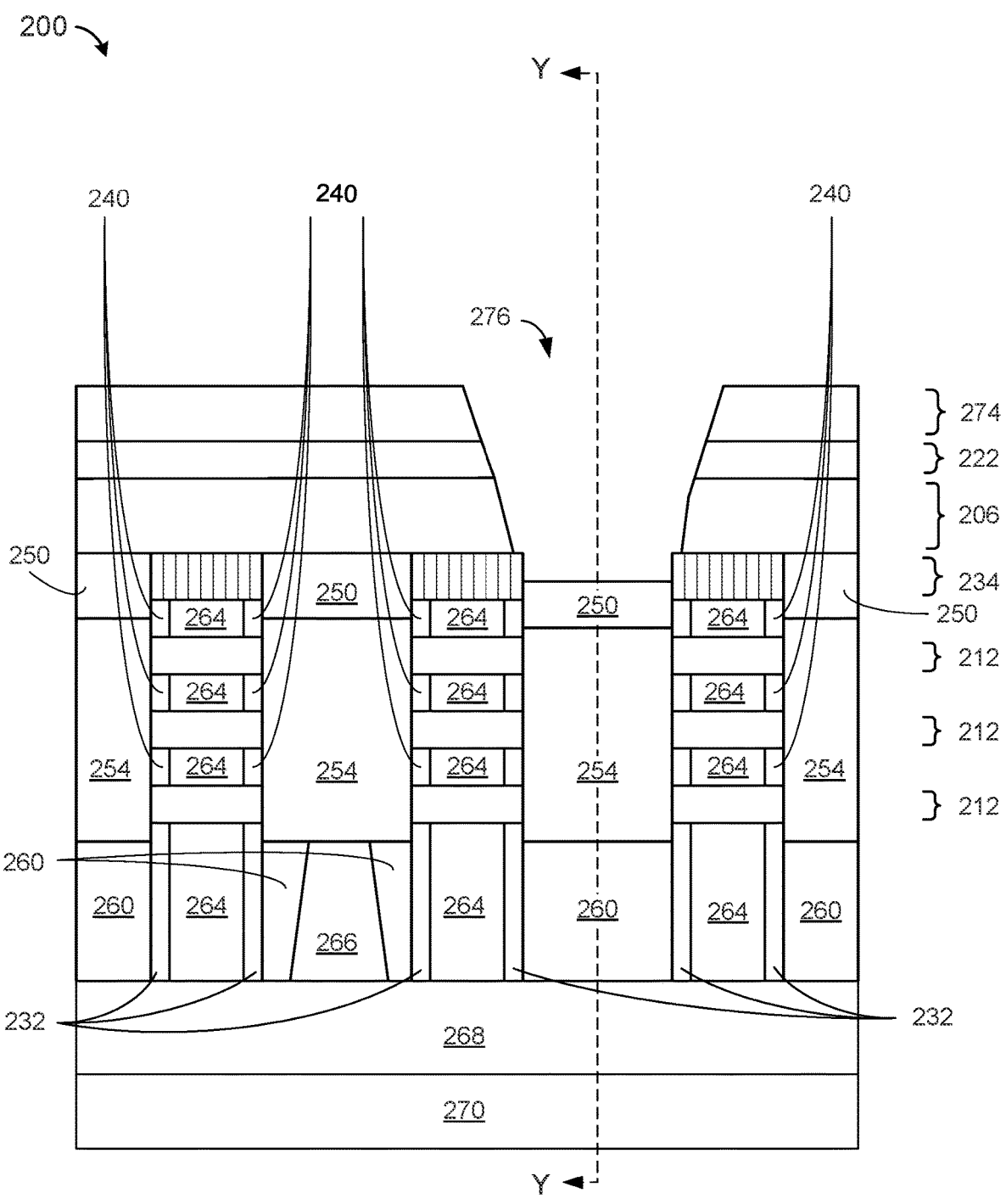
FIGS. 40 and 41 each illustrate a cross-sectional view of the semiconductor structure along section line X-X and Y-Y, respectively, and illustrate removal of select material to increase the opening, according to an exemplary embodiment.
Figure 41:
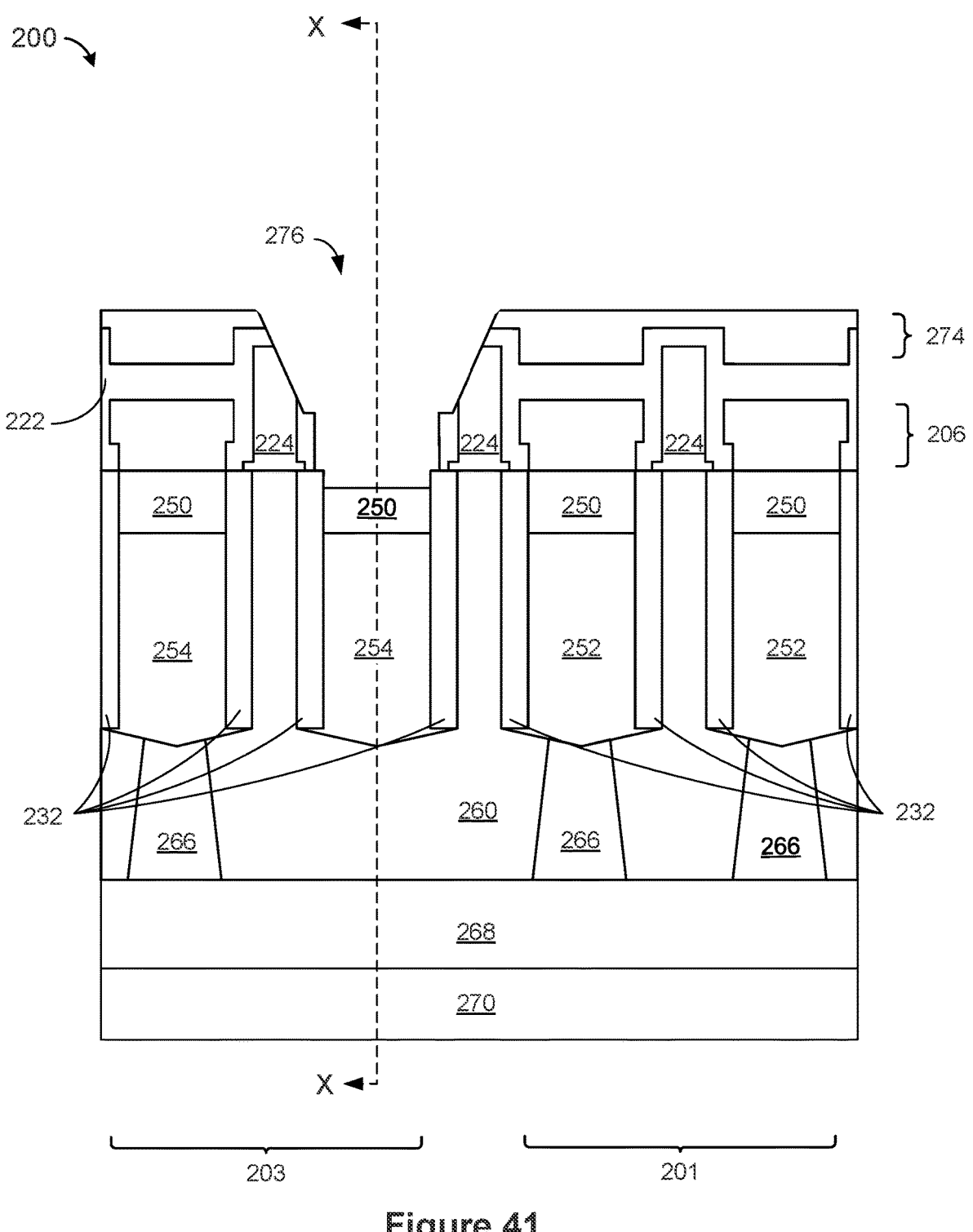

Referring now to FIGS. 40 and 41, the structure 200 is shown according to an exemplary embodiment. FIGS. 40 and 41 are each a cross-sectional view of the structure 200 along section lines X-X and Y-Y, respectively. FIGS. 40 and 41 are perpendicular to each other. The opening 276 may be further increased by selective etching surrounding the thin silicon layer 206 and the undoped silicon buffer epitaxy 250.

The material used for the etching process to increase the opening 276 may be selective to remove an exposed portion of the thin silicon layer 206 and a portion of the undoped silicon buffer epitaxy 250, selective to the ILD 274, the STI liner 222, the STI 224, remaining portions of the thin silicon layer 206, the p-FET source drain epitaxy 252 and the n-FET source dra¹in epitaxy 254. There may be a remaining portion of the undoped silicon buffer epitaxy 250 (now) above the n-FET source drain epitaxy 254.

Figure 42:
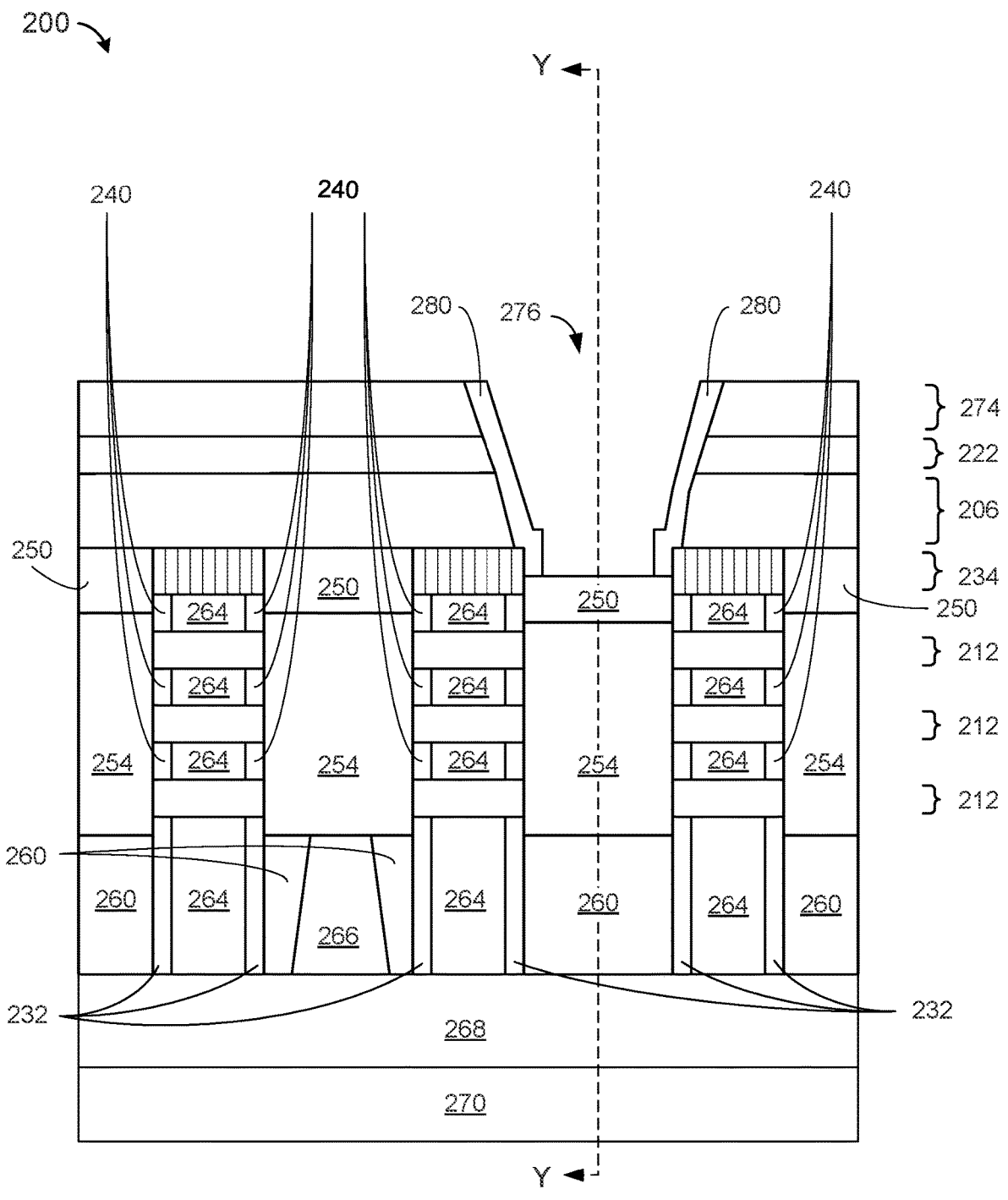
FIGS. 42 and 43 each illustrate a cross-sectional view of the semiconductor structure along section line X-X and Y-Y, respectively, and illustrate formation of an inner liner, according to an exemplary embodiment.
Figure 43:
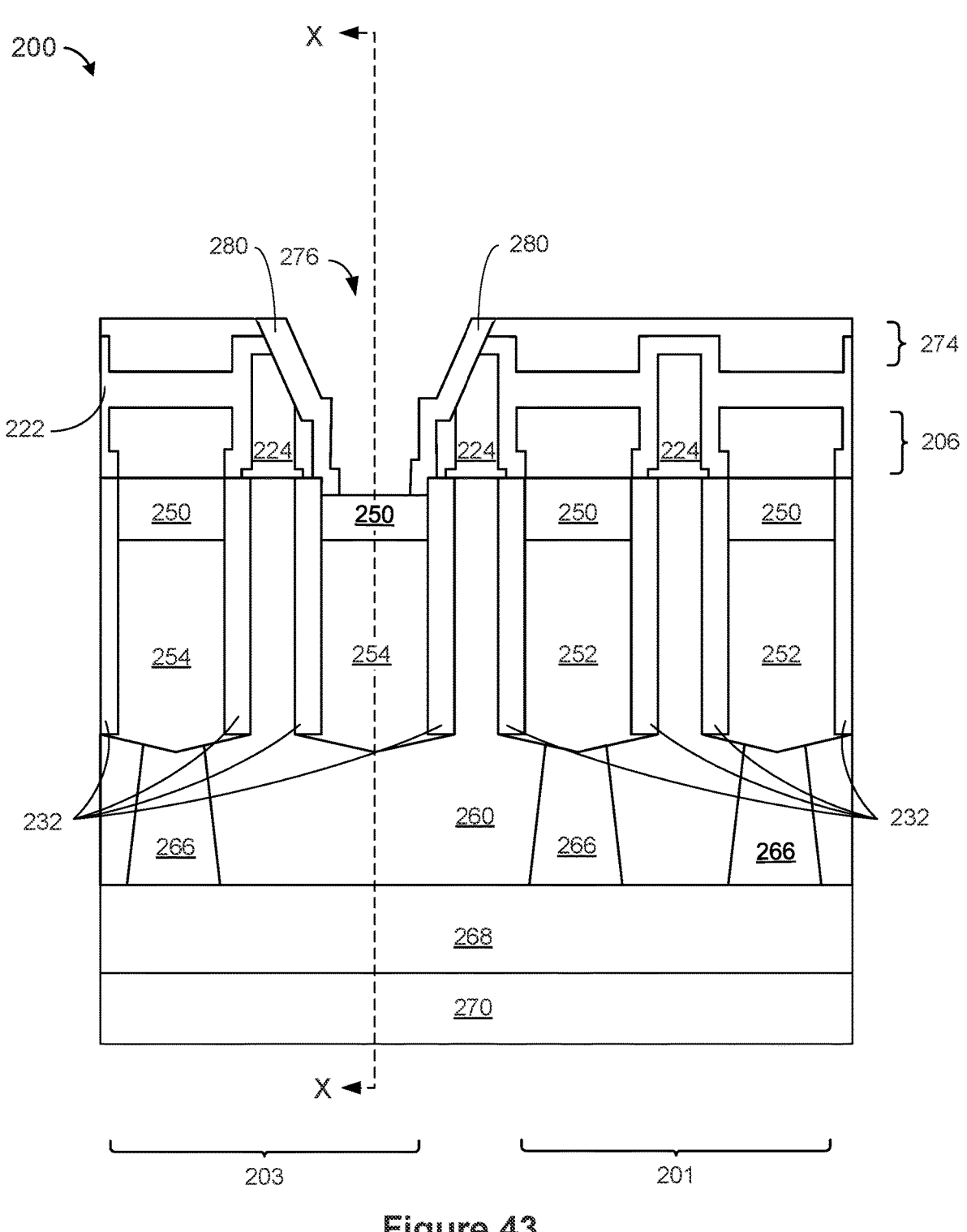

Referring now to FIGS. 42 and 43, the structure 200 is shown according to an exemplary embodiment. FIGS. 42 and 43 are each a cross-sectional view of the structure 200 along section lines X-X and Y-Y, respectively. FIGS. 42 and 43 are perpendicular to each other. An inner spacer 280 may be formed.

The inner spacer 280 may be formed along side surfaces of the opening 276. The inner spacer 280 may be formed as described for the dielectric spacer 232.

Figure 44:
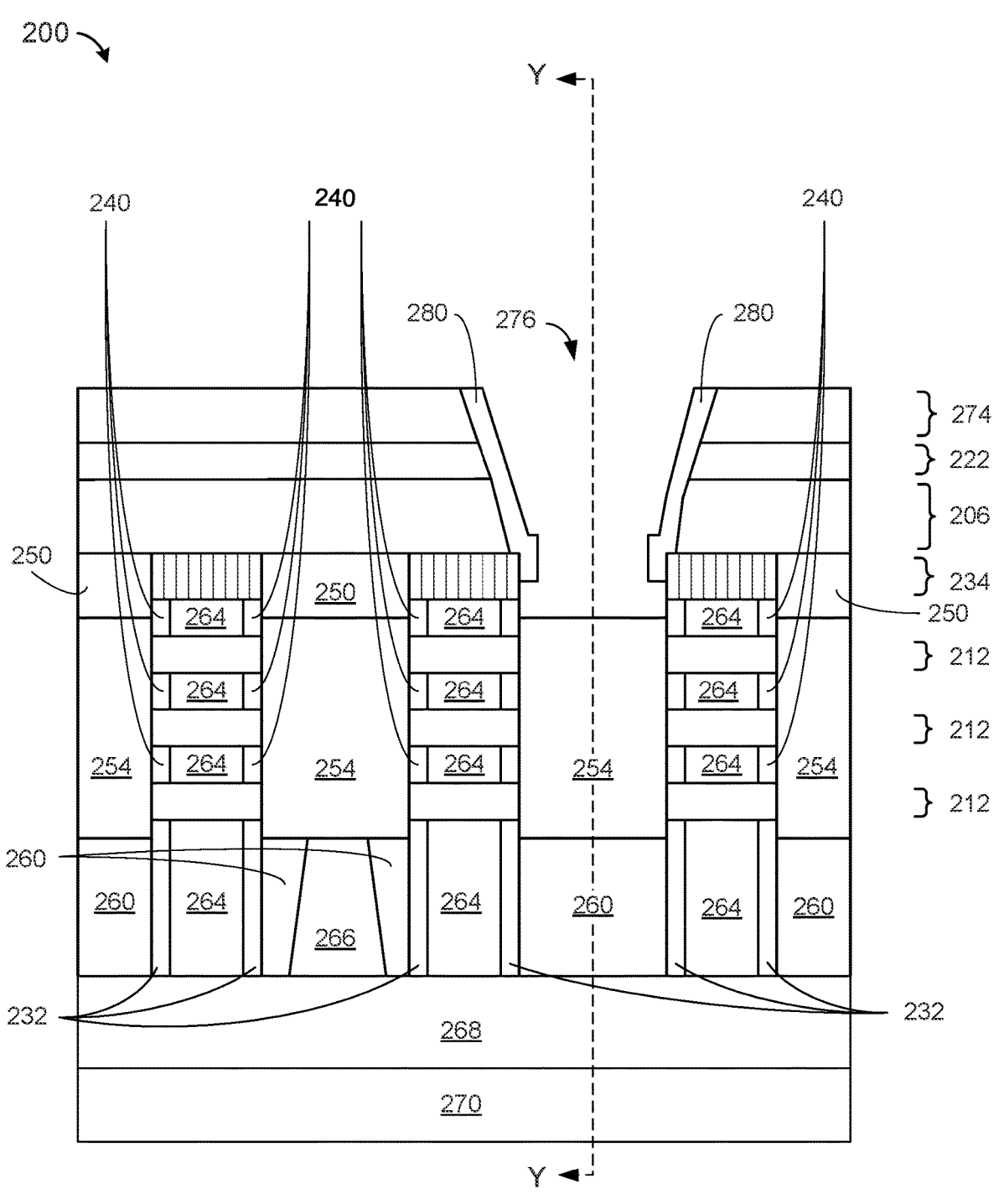
FIGS. 44 and 45 each illustrate a cross-sectional view of the semiconductor structure along section line X-X and Y-Y, respectively, and illustrate removal of the undoped silicon buffer epitaxy, according to an exemplary embodiment.
Figure 45:
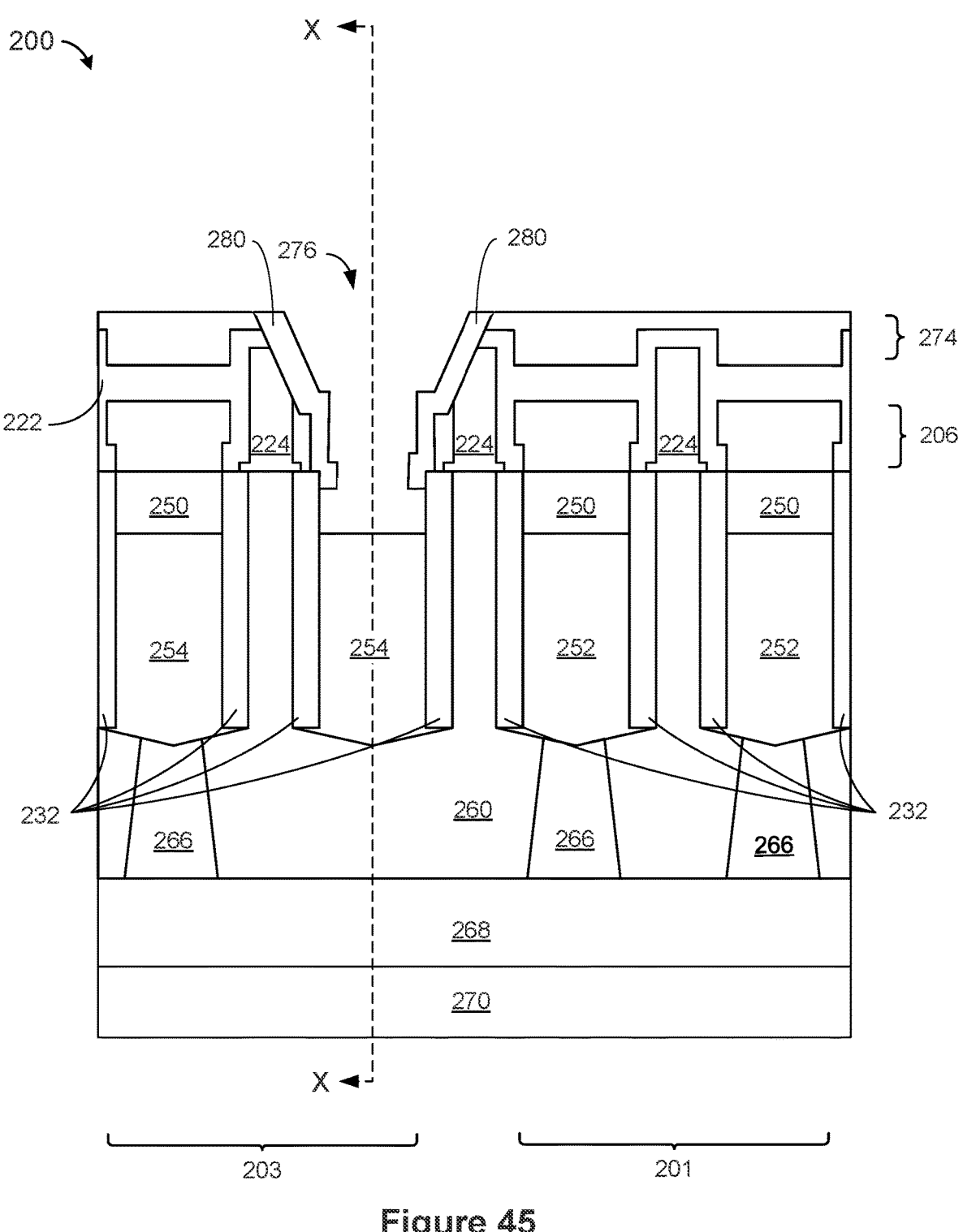

Referring now to FIGS. 44 and 45, the structure 200 is shown according to an exemplary embodiment. FIGS. 44 and 45 are each a cross-sectional view of the structure 200 along section lines X-X and Y-Y, respectively. FIGS. 44 and 45 are perpendicular to each other. The remaining portion of the undoped silicon buffer epitaxy 250 may be removed, increasing the opening 276 and exposing an upper surface of the n-FET source drain epitaxy 254.

The remaining portion of the undoped silicon buffer epitaxy 250 may be selectively removed. The material used for the etching process may be selective such that ILD 274, the STI liner 222, the STI 224, the thin silicon layer 206, the p-FET source drain epitaxy 252, the n-FET source drain epitaxy 254 and the dielectric spacer 232 remain and are not etched. A lower surface of the undoped silicon buffer epitaxy 250 may be exposed above the n-FET source drain epitaxy 254.

Figure 46:
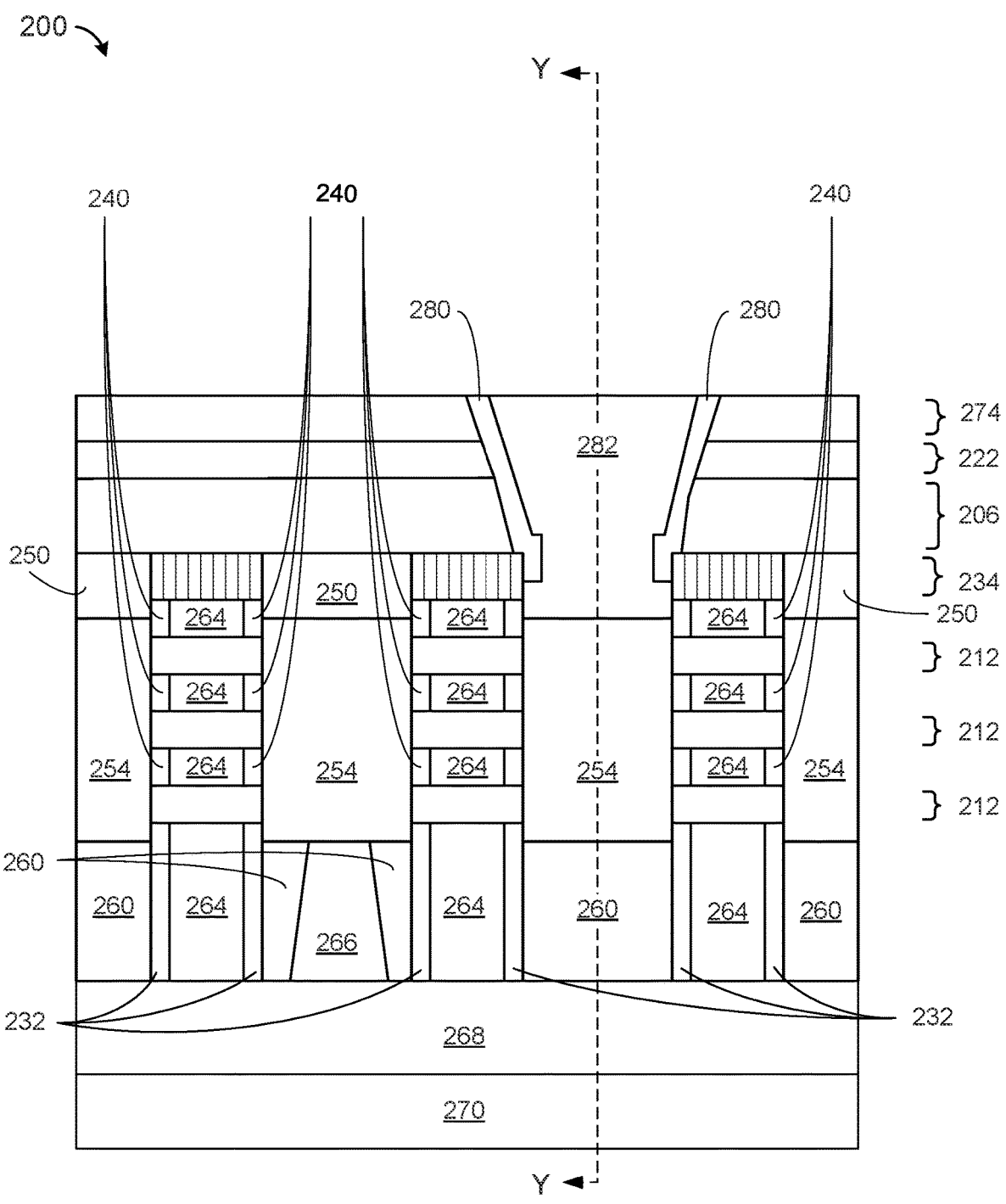
FIGS. 46 and 47 each illustrate a cross-sectional view of the semiconductor structure along section line X-X and Y-Y, respectively, and illustrate formation of a backside contact, according to an exemplary embodiment.
Figure 47:
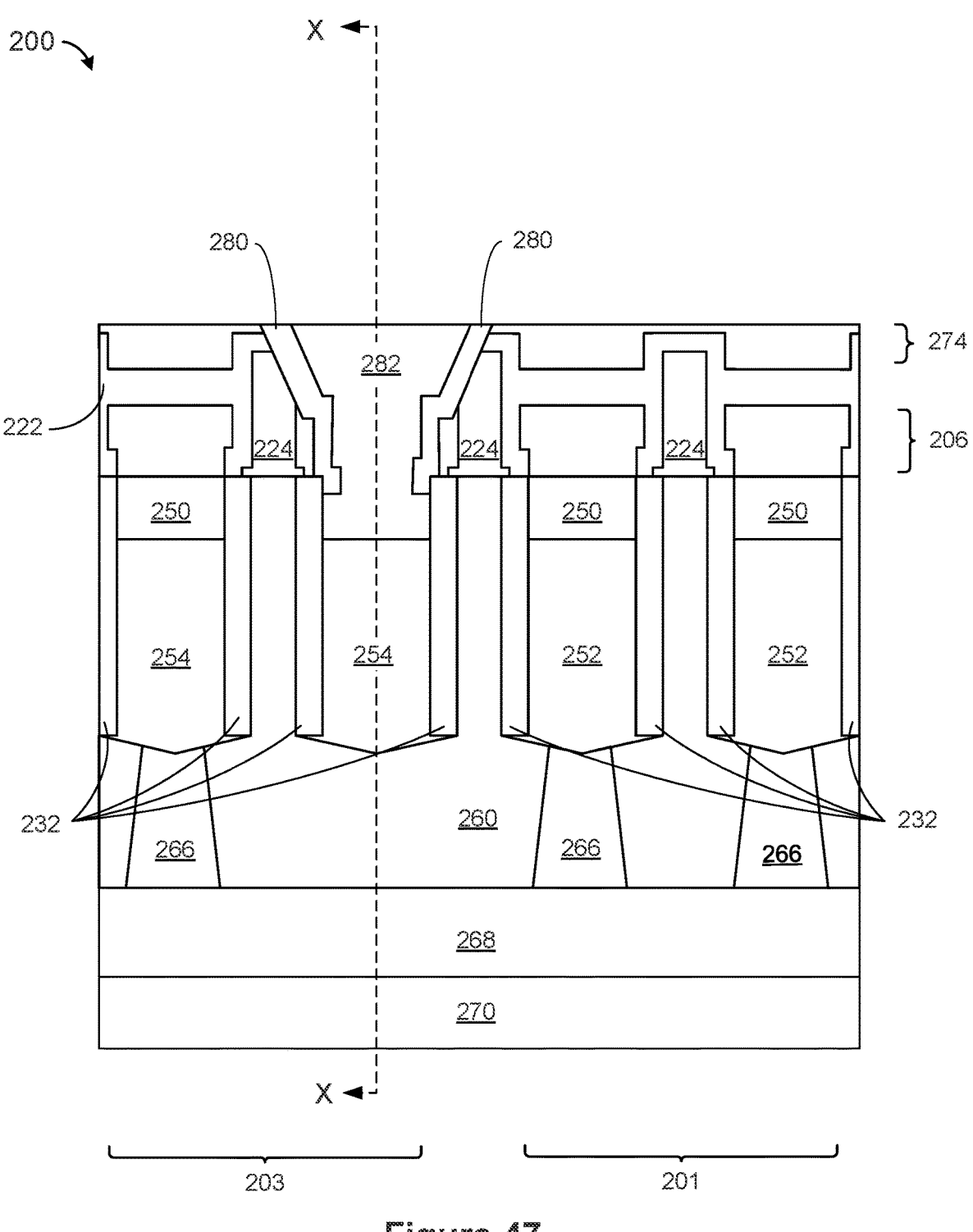

Referring now to FIGS. 46 and 47, the structure 200 is shown according to an exemplary embodiment. FIGS. 46 and 47 are each a cross-sectional view of the structure 200 along section lines X-X and Y-Y, respectively. FIGS. 46 and 47 are perpendicular to each other. A bottom contact 282 may be formed.

The bottom contact 282 may be formed in the opening 276 to form a contact to the n-FET source drain epitaxy 254. As shown in FIGS. 46 and 47, there is one bottom contact 282. There may be any number of bottom contacts 282 on the structure 200.

Forming the bottom contact 282 involves filling the opening 276 with highly-conductive metallic materials. Individual metallic materials within the bottom contact 282 are not shown for clarity. While the bulk of the bottom contact 282 includes an elemental metal such as Co, Ru, or Mo to reduce its bulk resistivity, the metallic compound directly adjacent to the semiconductor of the n-FET source drain epitaxy 254 (or to the semiconductor of the p-FET source drain epitaxy 252) is selected to reduce the contact resistance between the bottom contact 282 and the semiconductor of the n-FET source drain epitaxy 254 (or to the semiconductor of the p-FET source drain epitaxy 252). In one embodiment, the metallic compound adjacent to the semiconductor of the n-FET source drain epitaxy 254 (or to the semiconductor of the p-FET source drain epitaxy 252) is a metal silicide or germanosilicide. This compound can be created by reacting an elemental metal such as titanium with the semiconductor of the n-FET source drain epitaxy 254 (or to the semiconductor of the p-FET source drain epitaxy 252). While metal silicide/germanosilicide is made thin, typically less than 3 nm, it sets the Schottky barrier of the semiconductor-metal interface and, ultimately, the contact resistivity of the interface. The metal silicide/germanosilicide may be separated from the elemental metal fill of the bottom contact 282 by a thin conductive metallic liner such as Titanium Nitride liner. High concentration of free carriers in the semiconductor of the n-FET source drain epitaxy 254 (or to the semiconductor of the p-FET source drain epitaxy 252) and a low Schottky barrier between the metal silicide/germanoslicide and the semiconductor of the n-FET source drain epitaxy 254 (or to the semiconductor of the p-FET source drain epitaxy 252) allows for a low contact resistivity of about $10^{-9}$ W·cm$^2$ for the backside contact structure to both n-type and p-type semiconductors. Presence of multiple metallic compounds within the bottom contact 282 does not affect much its series resistance because additional interfacial compounds and liners are made thin in comparison to the elemental metal fill and each metal-metal interfacial resistance is at least an order of magnitude lower than that of semiconductor-metal interface.

A contact resistivity of the n-FET source drain epitaxy 254 (or to the semiconductor of the p-FET source drain epitaxy 252) to the adjacent metallic compound of the bottom contact 282 may be equal to or less then 1e-9 Ohm cm$^2$. A volume concentration of free electrical carriers (electrons or holes) of the n-FET source drain epitaxy 254 (or to the semiconductor of the p-FET source drain epitaxy 252) may be equal to or more than 7e20 cm$^{-3}$.

In comparison, a contact resistively of the n-FET source drain epitaxy 254 (or to the semiconductor of the p-FET source drain epitaxy 252) to the contact 282 may be greater than or equal to 2e-9 Ohm cm$^2$. A volume concentration of free electrical carriers (electrons or holes) of the n-FET source drain epitaxy 254 (or to the semiconductor of the p-FET source drain epitaxy 252) may be less than or equal to 5e20 cm$^{-3}$.

The bottom contact 282 may be made to the n-FET source drain epitaxy 254 or the p-FET source drain epitaxy 252 which does not have an upper contact 266. The n-FET source drain epitaxy 254 and the p-FET source drain epitaxy 252 may have either a bottom contact 282 or an upper contact 266. This provides more options for a source drain contact. In an example, a n-FET source drain epitaxy 254 of an n-FET nanosheet stack may each have an upper contact 266 and p-FET source drain epitaxy 252 of a p-FET nanosheet stack may each have a bottom contact 282. The alternative is also an embodiment.

A chemical mechanical polishing (CMP) technique may be used to remove excess material and polish upper surfaces of the structure 200. An upper surface of the structure 200 may include an upper horizontal surface of the bottom contact 282, an upper horizontal surface of the inner spacer 280 and an upper horizontal surface of the ILD 274.

Figure 48:
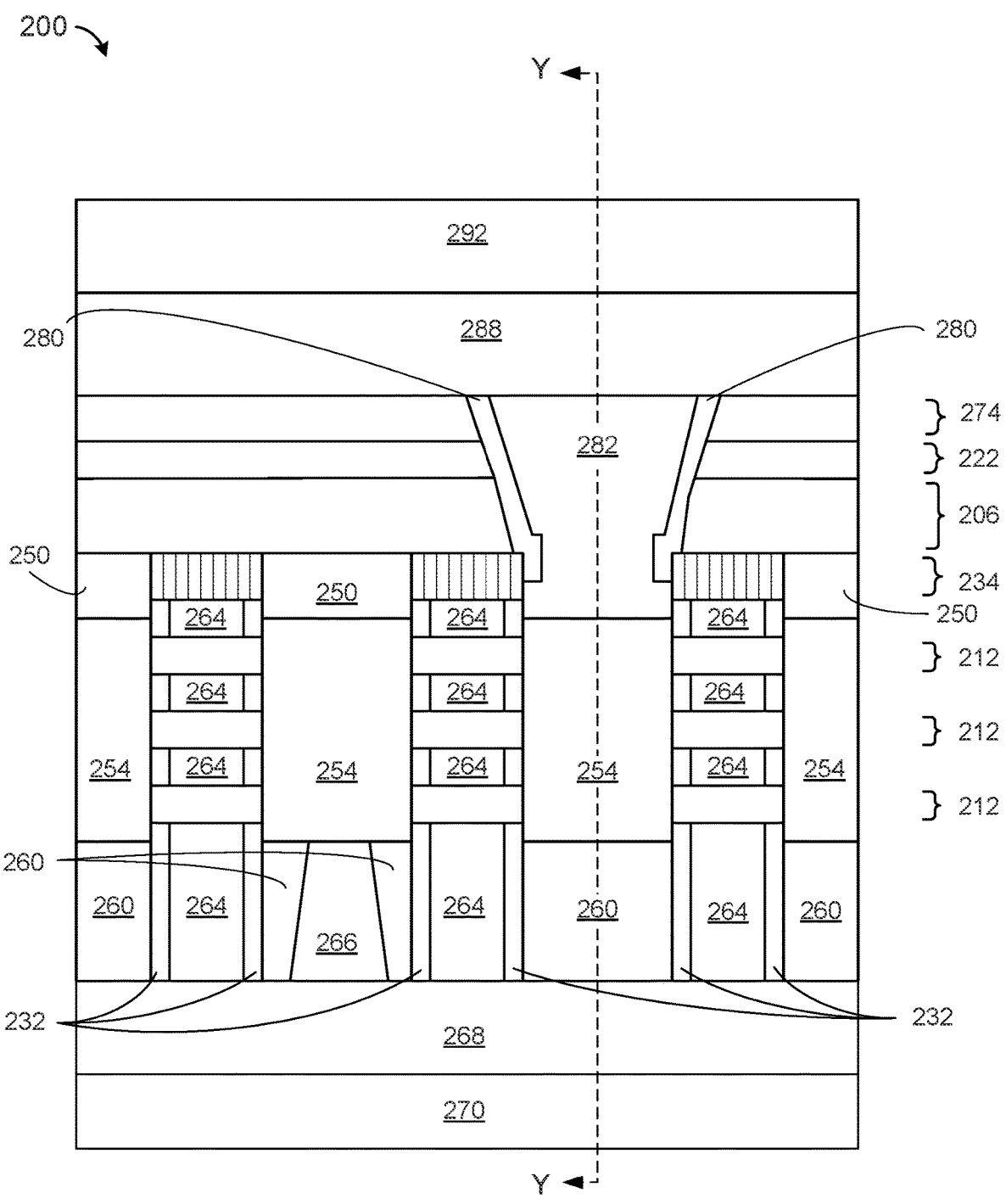
FIGS. 48 and 49 each illustrate a cross-sectional view of the semiconductor structure along section line X-X and Y-Y, respectively, and illustrate forming an inter-layer dielectric, a backside power rail and a backside power delivery network, according to an exemplary embodiment.
Figure 49:
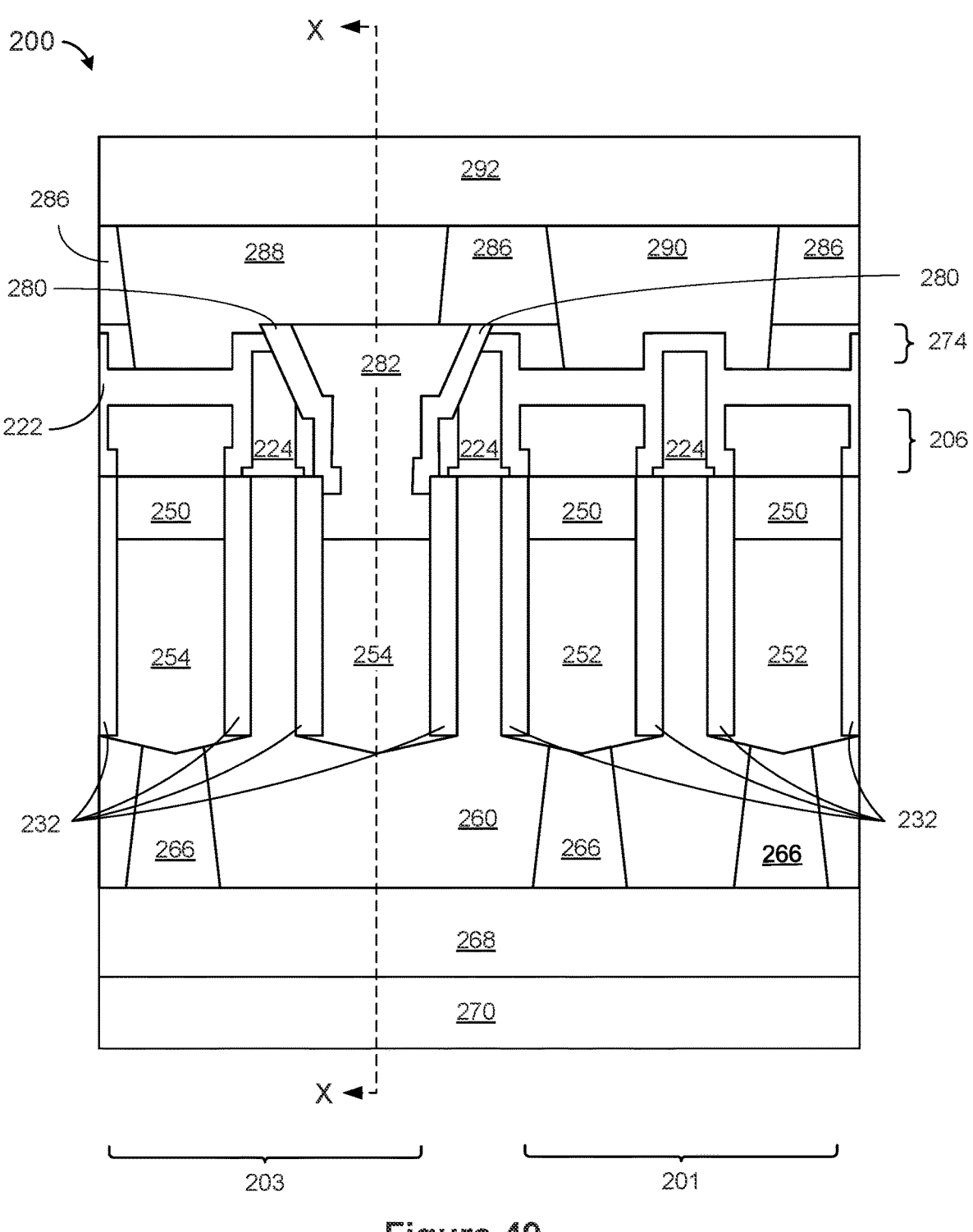

Referring now to FIGS. 48 and 49, the structure 200 is shown according to an exemplary embodiment. FIGS. 48 and 49 are each a cross-sectional view of the structure 200 along section lines X-X and Y-Y, respectively. FIGS. 48 and 49 are perpendicular to each other. An inter-layer dielectric (hereinafter "ILD") 286 may be formed. A backside power rail (hereinafter "BPR"), which includes power rail Vss 290 and Vdd 288, and a backside power delivery network (hereinafter "BSPDN") 292 may be formed.

The ILD 286 may be formed by conformally depositing or growing a dielectric material, as described for the ILD 260. A lower surface of the ILD 286 may be adjacent to the upper horizontal surface of the ILD 274, an upper horizontal surface of the inner spacer 280 and an upper horizontal surface of the bottom contact 282. A chemical mechanical polishing (CMP) technique may be used to remove excess material and polish upper surfaces of the structure 200.

The Vss 290 and the Vdd 288 may be formed in openings (not shown) in the ILD 286 using known techniques. In an embodiment, the Vss 290 and the Vdd 288 may be parallel to section line X-X and perpendicular to section line Y-Y. A lower horizontal surface of the Vdd 288 may be adjacent to an upper horizontal surface of the bottom contact 282. As shown in FIG. 92, there is one Vss 290 and one Vdd 288, however there may be any number of Vss 290 and Vdd 288 in the structure 200.

The BSPDN 292 may be formed on the ILD 286 and on the BPR. The BSPDN 292 may include additional layers of wiring and vias formed above the existing structure, above the ILD 286 and the BPR. In an embodiment, the BSPDN 292 may include 12 or more layers of lines and visas. The BSPDN 292 may be formed using known techniques.

The resulting structure 200 includes an FET nanosheet with a self-aligned backside trench epitaxy providing a contact with low contact resistively, providing additional options for forming a contact to the FET nanosheet on the backside of the structure.

An advantage of the structure 200 may include and enlarged backside contact area of the contact 282 by selective lateral etching of the thin silicon layer 206, without shorting to the gate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A semiconductor device comprising:
a first source drain region;

a second source drain region;

an upper source drain contact vertically aligned above and electrically connected to the first source drain region;

a bottom source drain contact vertically aligned below and electrically connected to the second source drain region, wherein the bottom source drain contact and the upper source drain contact are on opposite sides of the semiconductor device, a dielectric spacer surrounding all sides of the bottom source drain contact; and a bottom dielectric isolation region vertically aligned below a nanosheet stack of the semiconductor device, wherein a bottom surface of the bottom source drain contact is below a bottommost surface of the bottom dielectric isolation region.

2. The semiconductor device according to claim 1, wherein both the bottom source drain contact and the dielectric spacer directly contact a vertical sidewall of the bottom dielectric isolation region.

3. The semiconductor device according to claim 1, further comprising:

a shallow trench isolation region entirely below the bottom dielectric isolation region, wherein the dielectric spacer is between and directly contacts both the shallow trench isolation region and the bottom source drain contact.

4. The semiconductor device according to claim 1, further comprising:

a backside power rail below the bottom source drain contact, connected to the bottom source drain contact.

5. The semiconductor device according to claim 4, further comprising:

a backside power delivery network below the backside power rail.

6. A semiconductor device comprising:

a first source drain region;

a second source drain region;

an upper source drain contact vertically aligned above and electrically connected to the first source drain region; and a bottom source drain contact vertically aligned below and electrically connected to the second source drain region, wherein the bottom source drain contact and the upper source drain contact are on opposite sides of the semiconductor device, wherein a dielectric spacer surrounds opposite vertical side surfaces of the bottom source drain contact, wherein the dielectric spacer overlaps a vertical side surface and a lower horizontal surface of a bottom isolation region, wherein a width of the bottom source drain contact is wider than a width of the second source drain.

7. The semiconductor device according to claim 6, wherein the bottom dielectric isolation region is below a nanosheet stack of the semiconductor device.

8. The semiconductor device according to claim 6, further comprising:

a shallow trench isolation region entirely below both the first source drain region and the second source drain region, wherein the dielectric spacer is between and directly contacts both the shallow trench isolation region and the bottom source drain contact.

9. The semiconductor device according to claim 6, further comprising:

a backside power rail below the bottom source drain contact, connected to the bottom source drain contact.

10. The semiconductor device according to claim 9, further comprising:

a backside power delivery network below the backside power rail.

11. A method comprising:

forming a double nanosheet stack on a substrate;

forming a shallow trench isolation between adjacent double nanosheet stacks;

dividing the double nanosheet stack into a first nanosheet stack and a second nanosheet stack;

forming a shallow trench isolation in the divided double nanosheet stack;

forming an undoped silicon buffer epitaxy in an opening between and below the first nanosheet stack and the second nanosheet stack;

forming a top source drain contact to an upper horizontal surface of a first source drain region adjacent to the first nanosheet stack;

bonding a carrier wafer to an upper surface of the substrate above the first nanosheet stack and the second nanosheet stack;

removing the undoped silicon buffer epitaxy below a second source drain region between the first nanosheet stack and the second nanosheet stack; and forming a bottom source drain contact to a lower horizontal surface of the second source drain region, the bottom source drain contact and the second source drain region are vertically aligned, wherein a width of the bottom source drain contact is wider than a width of the second source drain region.

12. The method according to claim 11, wherein the bottom source drain contact comprises a vertical side surface adjacent to a vertical side surface of a bottom dielectric isolation region below the second nanosheet stack.

13. The method according to claim 12, wherein the bottom source drain contact comprises a vertical side surface adjacent to a vertical side surface of a liner of the second source drain, wherein the liner of the second source drain is between the second source drain and a work function metal of a gate of the second nanosheet stack.

14. The method according to claim 11, further comprising:

an epitaxial region between the bottom source drain contact and the second source drain region.

15. The method according to claim 14, wherein a lower horizontal surface of the epitaxial region is below a lower horizontal surface of a bottom dielectric isolation region below the second nanosheet stack.

16. The method according to claim 11, further comprising:

a buried power rail above the bottom source drain contact, connect to the bottom source drain contact; and a backside power delivery network above the buried power rail.

17. The method according to claim 11, further comprising:

a bottom dielectric isolation region below the first nanosheet stack and below the second nanosheet stack.

18. The method according to claim 11, wherein the first nanosheet stack comprising alternating layers of a work function metal and a semiconductor channel material vertically aligned and stacked one on top of another; and the second nanosheet stack comprising alternating layers of a work function metal and the semiconductor channel material vertically aligned and stacked one on top of another, vertically aligned and stacked one on top of another.

19. The method according to claim 11, further comprising:

an undoped silicon buffer epitaxial region between the bottom source drain contact and the first source drain region.

20. The method according to claim 11, further comprising:

vertical spacers on opposite sides of the first source drain region.

\* \* \* \* \*